US006673253B2

(12) United States Patent
Moon et al.

(10) Patent No.: US 6,673,253 B2
(45) Date of Patent: Jan. 6, 2004

(54) METHOD OF FABRICATING INTEGRATED LC/ESI DEVICE USING SMILE, LATENT MASKING, AND DELAYED LOCOS TECHNIQUES.

(75) Inventors: James E. Moon, Ithaca, NY (US); Timothy J. Davis, Trumansburg, NY (US); Gregory J. Galvin, Ithaca, NY (US); Kevin A. Shaw, Ithaca, NY (US); Paul C. Waldrop, Ithaca, NY (US); Sharlene A. Wilson, Seneca Falls, NY (US)

(73) Assignee: Kionix, Inc., Ithaca, NY (US)

( * ) Notice: Subject to any disclaimer, the term of this patent is extended or adjusted under 35 U.S.C. 154(b) by 114 days.

(21) Appl. No.: 10/004,493

(22) Filed: Nov. 2, 2001

(65) Prior Publication Data

US 2002/0063107 A1 May 30, 2002

Related U.S. Application Data

(62) Division of application No. 09/334,408, filed on Jun. 16, 1999, now Pat. No. 6,444,138.

(51) Int. Cl.[7] .............................. B81B 7/02; B81C 1/00

(52) U.S. Cl. .............................. 216/2; 216/39; 216/57; 216/67; 216/79; 216/99; 438/696; 438/743; 438/744; 438/756; 438/757

(58) Field of Search .............................. 216/2, 27, 39, 216/41, 47, 55, 57, 67, 79, 97, 99; 438/45, 362, 586, 696, 704, 736, 743, 744, 745, 756, 757

(56) References Cited

U.S. PATENT DOCUMENTS

| | | | | | |
|---|---|---|---|---|---|
| 4,764,244 A | | 8/1988 | Chitty et al. | ................ | 156/630 |
| 4,911,783 A | | 3/1990 | Voboril | ........................ | 156/643 |
| 5,006,202 A | | 4/1991 | Hawkins et al. | ............ | 156/644 |
| 5,043,043 A | * | 8/1991 | Howe et al. | .................. | 216/17 |
| 5,131,978 A | | 7/1992 | O'Neill | ...................... | 156/653 |

(List continued on next page.)

FOREIGN PATENT DOCUMENTS

| | | |
|---|---|---|
| DE | 44 42 023 | 5/1996 |

OTHER PUBLICATIONS

Desai, Amish, et al., *A MEMS Electrospray Nozzle for Mass Spectroscopy*, 1997, pp. 927–930.

Dole, Malcom, et al., *Molecular Beams of Macroions*, 1968, pp. 2240–2249.

(List continued on next page.)

*Primary Examiner*—Allen Olsen
(74) *Attorney, Agent, or Firm*—Wall Marjama & Bilinski, LLP

(57) ABSTRACT

Three fundamental and three derived aspects of the present invention are disclosed. The three fundamental aspects each disclose a process sequence that may be integrated in a full process. The first aspect, designated as "latent masking", defines a mask in a persistent material like silicon oxide that is held abeyant after definition while intervening processing operations are performed. The latent oxide pattern is then used to mask an etch. The second aspect, designated as "simultaneous multi-level etching (SMILE)", provides a process sequence wherein a first pattern may be given an advanced start relative to a second pattern in etching into an underlying material, such that the first pattern may be etched deeper, shallower, or to the same depth as the second pattern. The third aspect, designated as "delayed LOCOS", provides a means of defining a contact hole pattern at one stage of a process, then using the defined pattern at a later stage to open the contact holes. The fourth aspect provides a process sequence that incorporates all three fundamental aspects to fabricate an integrated liquid chromatography (LC)/electrospray ionization (ESI) device. The fifth aspect provides a process sequence that incorporates two of the fundamental aspects to fabricate an ESI device. The sixth aspect provides a process sequence that incorporates two of the fundamental aspects to fabricate an LC device. The process improvements described provide increased manufacturing yield and design latitude in comparison to previously disclosed methods of fabrication.

9 Claims, 58 Drawing Sheets

U.S. PATENT DOCUMENTS

| | | | | | |
|---|---|---|---|---|---|
| 5,628,917 | A | | 5/1997 | MacDonald et al. | 216/2 |
| 5,658,471 | A | | 8/1997 | Murthy et al. | 216/27 |
| 5,683,591 | A | | 11/1997 | Offenberg | 216/2 |
| 5,690,841 | A | | 11/1997 | Elderstig | 216/39 |
| 5,717,251 | A | | 2/1998 | Hayashi et al. | 257/758 |
| 5,770,465 | A | | 6/1998 | MacDonald et al. | 437/67 |
| 5,804,084 | A | * | 9/1998 | Nasby et al. | 216/2 |
| 6,020,272 | A | | 2/2000 | Fleming | 438/734 |
| 6,071,819 | A | * | 6/2000 | Tai et al. | 438/694 |
| 6,136,243 | A | | 10/2000 | Mehregany et al. | 264/162 |
| 6,174,820 | B1 | | 1/2001 | Habermehl et al. | 438/745 |

OTHER PUBLICATIONS

Harrison, D. Jed, et al., *Micromachining a Miniaturized Capillary Electrophoresis–Based Chemical Analysis System on a Chip*, 1993, pp. 895–897.

He, Bing, et al., *Fabrication of Nanocolumns for Liquid Chromatography*, 1998, pp. 3790–3797.

Jacobson, Stephen C., et al., *High–Speed Separations on a Microchip*, 1994, pp. 1114–1118.

Jacobson, Stephen C., et al., *Open channel Electrochromatography on a Microchip*, 1994, pp. 2369–2373.

Ramsey, R.S., et al., *Generating Electrospray from Microchip Devices Using Electroosmotic Pumping*, 1997, pp. 1174–1178.

Smith, David P., *The Electrohydrodynamic Atomization of Liquids*, 1986, pp. 527–535.

Wang, Xuan–Oi, et al., *Polymer–Based Electrospray Chips for Mass Spectrometry*, 1999, pp. 523–528.

Wilm, Matthiasm et al., *Analytical Properties of the Nanoelctrospray Ion Source*, 1996, pp. 1–8.

Xue, Gifeng, et al., *Multichannel Microchip Electrospray Mass Spectrometry*, 1997, pp. 426–430.

Yamashita, Masamichi, et al., *Electrospray Ion Source. Another Variation of the Free–Jet Theme*, 1984, pp. 4451–4459.

* cited by examiner

Prior
Art

METHOD OF FABRICATING INTEGRATED LC/ESI DEVICE USING SMILE, LATENT MASKING, AND DELAYED LOCOS TECHNIQUES.

CROSS REFERENCE TO RELATED APPLICATION

This is a divisonal application of U.S. Ser. No. 09/334,408, filed Jun. 16, 1999, now U.S. Pat. No. 6,444,138 the entirely of which is incorporated herein by reference.

FIELD OF THE INVENTION

The invention relates to the field of design, development, and manufacturing of miniaturized chemical analysis devices and systems using microelectromechanical systems (MEMS) technology. In particular, the invention relates to improvements in process sequences for fabricating MEMS and microfluidic devices, including electrospray ionization, liquid chromatography, and integrated liquid chromatography/electrospray devices.

BACKGROUND OF THE INVENTION

Explosive growth in the demand for analysis of samples in combinatorial chemistry, genomics, and proteomics is driving widespread efforts to increase throughput, increase accuracy, and to reduce volumes of reagents and samples required, as well as waste generated. Rapid developments in drug discovery and development are creating new demands on traditional analytical techniques. For example, combinatorial chemistry is often employed to discover new lead compounds, or to create variations of a lead compound. Combinatorial chemistry techniques can generate thousands or millions of compounds in combinatorial libraries within days or weeks. The generation of enormous amounts of genetic sequence data through new DNA sequencing methods in the field of genomics has allowed rapid identification of new targets for drug development efforts. There is therefore a critical need for rapid sequential analysis and identification of compounds that interact with a gene or gene product in order to identify potential drug candidates. Efficient proteomic screening methods are needed in order to obtain the pharmacokinetic profile of a drug early in the evaluation process, testing for cytotoxicity, specificity, and other pharmaceutical characteristics in high-throughput assays instead of in expensive animal testing and clinical trials. Testing such a large number of compounds for biological activity in a timely and efficient manner requires high-throughput screening methods that allow rapid evaluation of the characteristics of each candidate compound. Development of viable screening methods for these new targets will often depend on the availability of rapid separation and analysis techniques for analyzing the results of assays.

Microchip-based separation devices have been developed for rapid analysis of large numbers of samples. Compared to other conventional separation devices, these microchip-based separation devices have higher sample throughput, reduced sample and reagent consumption and reduced chemical waste. Liquid flow rate for microchip-based separation devices range from approximately 1–300 nanoliters (nL) per minute for most applications.

Examples of microchip-based separation devices include those for capillary electrophoresis (CE), capillary electrochromatography (CEC) and high-performance liquid chromatography (HPLC). See Harrison et al., Science 1993, 261, 895–897; Jacobsen et al., Anal. Chem. 1994, 66, 1114–1118; and Jacobsen et al., Anal. Chem. 1994, 66, 2369–2373. Such separation devices are capable of fast analyses and provide improved precision and reliability compared to other conventional analytical instruments.

He et al., Anal. Chem. 1998, 70, 3790–3797 describes the fabrication of chromatography columns on quartz wafers and reports an evaluation of column efficiency in the capillary electrochromatography (CEC) mode. The fabrication sequence described relies partly on standard, parallel microfabrication operations to create multiple separation channels and structures therein on which stationary phase materials may be coated. However, methods described for enclosing the separation channels as well as for providing fluidic access to and egress from the channels are decidedly nonstandard and unsuitable for integration in a conventional, high-productivity microfabrication sequence.

Liquid chromatography (LC) is a well-established analytical method for separating components of a fluid for subsequent analysis and/or identification. Traditionally, liquid chromatography utilizes a separation column, such as a cylindrical tube, filled with tightly packed beads, gel or other appropriate particulate material to provide a large surface area. The large surface area facilitates fluid interactions with the particulate material, resulting in separation of components of the fluid as it passes through the separation column, or channel. The separated components may be analyzed spectroscopically or may be passed from the liquid chromatography column into other types of analytical instruments for analysis.

The separated product of such separation devices may be introduced as a liquid sample to a device that is used to produce electrospray ionization. The electrospray device may be interfaced to an atmospheric pressure ionization mass spectrometer (API-MS) for analysis of the electrosprayed fluid.

A schematic of an electrospray system 10 is shown in FIG. 1. An electrospray is produced when a sufficient electrical potential difference $V_{spray}$ is applied between a conductive or partly conductive fluid exiting a capillary orifice and an electrode so as to generate a concentration of electric field lines emanating from the tip or end of a capillary 2 of an electrospray device. When a positive voltage $V_{spray}$ is applied to the tip of the capillary relative to an extracting electrode 4, such as one provided at the ion-sampling orifice to the mass spectrometer, the electric field causes positively-charged ions in the fluid to migrate to the surface of the fluid at the tip of the capillary 2. When a negative voltage $V_{spray}$ is applied to the tip of the capillary relative to the extracting electrode 4, such as one provided at the ion-sampling orifice to the mass spectrometer, the electric field causes negatively-charged ions in the fluid to migrate to the surface of the fluid at the tip of the capillary 2.

When the repulsion force of the solvated ions exceeds the surface tension of the fluid sample being electrosprayed, a volume of the fluid sample is pulled into the shape of a cone, known as a Taylor cone 6, which extends from the tip of the capillary 2. Small charged droplets 8 are formed from the tip of the Taylor cone 6, which are drawn toward the extracting electrode 4. This phenomenon has been described, for example, by Dole et al., J. Chem. Phys. 1968, 49, 2240 and Yamashita and Fenn, J. Phys. Chem. 1984, 88, 4451. The potential voltage required to initiate an electrospray is dependent on the surface tension of the solution as described by, for example, Smith, IEEE Trans. Ind. Appl. 1986, IA-22, 527–535. Typically, the electric field is on the order of approximately $10^6$ V/m. The physical size of the capillary determines the density of electric field lines necessary to induce electrospray.

The process of electrospray ionization at flow rates on the order of nanoliters per minute has been referred to as "nanoelectrospray." Electrospray into the ion-sampling orifice of an API mass spectrometer produces a quantitative response from the mass spectrometer detector due to the analyte molecules present in the liquid flowing from the capillary. It is desirable to provide an electrospray ionization device for integration upstream with microchip-based separation devices and for integration downstream with API-MS instruments.

The development of miniaturized devices for chemical analysis—and, further, for synthesis and fluid manipulation—is motivated by the prospects of improved efficiency, reduced cost, and enhanced accuracy. Efficient, reliable manufacturing processes are a critical requirement for the cost-effective, high-volume production of devices that are targeted at high-volume, high-throughput test markets.

Attempts have been made to fabricate an electrospray device that produces nanoelectrospray. For example, Wilm and Mann, Anal. Chem. 1996, 68, 1–8 describes the process of electrospray from fused silica capillaries drawn to an inner diameter of 2–4 μm at flow rates of 20 nL/min. Specifically, a nanoelectrospray at 20 nL/min was achieved from a 2 μm inner diameter and 5 μm outer diameter pulled fused-silica capillary with 600–700 V at a distance of 1–2 mm from the ion-sampling orifice of an API mass spectrometer.

Ramsey et al., Anal. Chem. 1997, 69, 1174–1178 describes nanoelectrospray at 90 nL/min from the edge of a planar glass microchip with a closed separation channel 10 μm deep, 60 μm wide and 33 mm in length using electroosmotic flow. A voltage of 4.8 kV was applied to the fluid exiting the closed separation channel on the edge of the microchip to initiate electrospraying, with the edge of the chip at a distance of 3–5 mm from the ion-sampling orifice of an API mass spectrometer. Approximately 12 nL of the sample fluid collected at the edge of the chip before a Taylor cone formed and initiated a stable nanoelectrospray from the edge of the microchip. However, collection of approximately 12 nL of the sample fluid results in re-mixing of the fluid, thereby undoing the separation done in the separation channel. Re-mixing at the edge of the microchip causes band broadening, fundamentally limiting its applicability for nanoelectrospray-mass spectrometry for analyte detection. Thus, electrospraying from the edge of this microchip device after capillary electrophoresis or capillary electrochromatography separation is rendered impractical. Furthermore, because this device provides a flat surface, and thus a relatively small amount of physical asperity for the formation of the electrospray, the device requires an impractically high voltage to initiate electrospray, due to poor field line concentration.

Xue et al., Anal. Chem. 1997, 69, 426–430 describes a stable nanoelectrospray from the edge of a planar glass microchip with a closed channel 25 μm deep, 60 μm wide and 35–50 mm in length. A potential of 4.2 kV was applied to the fluid exiting the closed separation channel on the edge of the microchip to initiate electrospraying, with the edge of the chip at a distance of 3–8 mm from the ion-sampling orifice of an API mass spectrometer. A syringe pump was utilized to deliver the sample fluid to the glass electrospray microchip at a flow rate between 100–200 nL/min. The edge of the glass microchip was treated with a hydrophobic coating to alleviate some of the difficulties associated with electrospraying from a flat surface and to thereby improve the stability of the nanoelectrospray. Electrospraying in this manner from a flat surface, however, again results in poor field line concentration and yields an inefficient electrospray.

In all of the devices described above, edge-spraying from a chip is a poorly controlled process due to the inability to rigorously and repeatably determine the physical form of the chip's edge. In another embodiment of edge-spraying, ejection nozzles, such as small segments of drawn capillaries, are separately and individually attached to the chip's edge. This process imposes space constraints in chip design and is inherently cost-inefficient and unreliable, making it unsuitable for manufacturing.

Desai et al., 1997 International Conference on Solid-State Sensors and Actuators, Chicago, Jun. 16–19, 1997, 927–930 describes a multi-step process to generate a nozzle on the edge of a silicon microchip 1–3 μm in diameter or width and 40 μm in length. A voltage of 4 kV was applied to the entire microchip at a distance of 0.25–0.4 mm from the ion-sampling orifice of an API mass spectrometer. This nanoelectrospray nozzle reduces the dead volume of the sample fluid. However, the extension of the nozzle from the edge of the microchip makes the nozzle susceptible to accidental breakage. Because a relatively high spray voltage was utilized and the nozzle was positioned in very close proximity to the mass spectrometer sampling orifice, a poor field line concentration and a low efficient electrospray were achieved.

Wang et al., 1999 IEEE International Conference on Micro Electro Mechanical Systems, Orlando, Jan. 17–21, 1999, 523–528 describes a polymer-based electrospray structure designed to spray from the edge of the chip, essentially replacing the mechanically fragile silicon nitride nozzle of Desai et al. with a polymeric nozzle. While the polymer substitution provides a significant improvement in mechanical reliability, additional non-standard processing materials and operations are required, making the fabrication of the structures incompatible with standard high-volume manufacturing facilities. Further, the presence of the polymeric material seriously limits the nature of subsequent processing operations and precludes high-temperature processing altogether. Concerns regarding sample contamination by monomeric residues in the polymer remain unresolved.

Thus, it is also desirable to provide an electrospray ionization device with controllable spraying and a method for producing such a device that is easily reproducible and manufacturable in high volumes.

U.S. Pat. Appl. Ser. No. 09/156,037 (Moon et al.) describes electrospray ionization (ESI), liquid chromatography (LC), and integrated LC/ESI devices and systems and fabrication sequences to make them in silicon by reactive-ion etching. That application discloses methods of designing and fabricating those devices and similar ones in a manner that is consistent with well-established, cost-efficient, high-volume manufacturing operations. However, there are several aspects of the fabrication sequences and designs that potentially limit manufacturing yield. First, separation posts formed for purposes of liquid chromatography are subject to damaging mechanical stresses due to coating of additional films, wet immersions, and abrasion and clamping in the course of processing operations after formation of the separation posts. Second, etch lag in electrospray nozzle channels makes it difficult to complete the channel while controlling the height of the nozzle. Third, the formation of electrical contacts to the substrate in the presence of significant topographical steps of more than 1–2 μm is problematic due to an inability to uniformly and continuously coat photoresist for purposes of lithographic patterning and subsequent etching. Thus, improved processing operations and sequences are desired in order to ensure the high-yield manufacturability of such devices and systems. Further, such processing improvements that can be widely applied to a variety of MEMS and microfluidic devices and systems are highly desired.

SUMMARY OF THE INVENTION

The aspects of the present invention described herein have been shown to significantly improve prior approaches to fabricating MEMS and microfluidic devices. They have been successfully used to overcome the specific yield-limiting problems discussed hereinabove. They may be used individually or severally to greatly improve the component of manufacturing yield attributed to wafer-level processing for many microfabricated devices. In particular, some or all of them may be used to improve the yield of electrospray ionization (ESI), liquid chromatography (LC), and integrated LC/ESI devices.

The present invention provides three sequences of process steps that may be individually or severally integrated with other standard silicon processing operations to fabricate MEMS and microfluidic devices and systems with enhanced manufacturability. Each of the three aspects of the present invention provides relief to design and process integration constraints and overcomes limitations deriving from interacting process operations. In general, these constraints and limitations are surmounted by rendering the device or system insensitive to problematic operations and/or by decoupling design and process interactions. Each of the aspects is independent from the others. Any two or all of the aspects may be used in concert to relieve a multiplicity of constraints. The yield-enhancing effects of the several aspects are found to have a cumulative, positive impact on manufacturing yield.

The three fundamental aspects of this invention are referred to herein as latent masking, simultaneous multi-level etching (SMILE), and delayed LOCOS. Each of these three fundamental aspects generally comprises a sequence of silicon processing steps that may be incorporated in a complete sequence for the fabrication of MEMS and microfluidic devices and systems. Three additional aspects of the present invention are derived aspects that incorporate one or more of the three fundamental aspects in integrated processes to fabricate specific MEMS or microfluidic devices or systems. Each of the derived aspects of the present invention provides a novel fabrication process that significantly improves fabrication reliability and manufacturing yield.

The first fundamental aspect of the present invention, designated herein as latent masking, provides a means by which a mask may be created at one stage of the overall process but then held abeyant pending its ultimate use to mask an etch of an underlying film or substrate after a sequence of intervening process steps. During the intervening steps, the mask remains latent and unperturbed, neither affecting the operations conducted nor being affected by them. The latent mask is preferably formed in a film of silicon oxide or, alternatively, is formed in a material such as a polyimide. The salient characteristic of the masking material is its resistance to wet and/or dry processing steps after its formation and prior to its ultimate use.

In the preferred embodiment, a silicon oxide film is patterned to create the latent mask by a sequence of standard lithographic processing steps, including coating, exposure, and development of a photoresist film, followed by a reactive-ion etch of the underlying oxide film, thereby transferring the photoresist pattern to the oxide layer. In an alternative embodiment, a more durable masking material such as polyimide may be coated and patterned lithographically, then cured at elevated temperature.

Once the latent mask has been created, a sequence of processing operations may be performed before using the mask. After those intervening process steps, the mask is used to protect certain areas of an underlying film or substrate during the etching of that film/substrate, thereby transferring the mask pattern into the underlying film/substrate. Preferably, the latent mask is composed of silicon oxide and is used to mask the etch of an underlying silicon substrate by reactive-ion etching. In alternative embodiments of the invention, the etching may be done using wet chemical etching techniques and/or the underlying film/substrate may be a material other than silicon, the principal requirement being the compatibility of the etch mask material with the chosen method of etching.

One advantage of latent masking as described herein is that the latent mask does not interfere with subsequent lithographic patterning steps. A second advantage is that the low-profile latent mask is not susceptible to damage from abrasion stresses. Yet another, and decisive, advantage of latent masking is that the use of the mask may be placed at a late enough stage in the overall process to ensure that the resulting fragile structures are not subjected to damaging stresses by subsequent operations.

The second fundamental aspect of the present invention, designated herein as <u>s</u>imultaneous <u>m</u>ult<u>i</u>-<u>l</u>evel <u>e</u>tching (SMILE), provides a means of etching two different patterns into, preferably, a silicon substrate such that the final etched depths of the two patterns may be independently controlled. The essence of this aspect is that the etching of one pattern may be advanced relative to a second pattern by beginning to etch the former first pattern without simultaneously etching the second pattern. After an initial etch of the first pattern alone, both patterns are etched simultaneously.

Lithographic patterning creates a first pattern in a photoresist mask. The first pattern is transferred to an underlying silicon oxide layer by reactive-ion etching or wet etching, after which the photoresist mask is removed. A second lithographic patterning step is then done to create a second photoresist mask that comprises both the first and second patterns. After the patterning of the second photoresist mask, an opening exists in the photoresist mask and silicon oxide film corresponding to the first pattern, whereas the second pattern in the photoresist mask is open only to the underlying silicon oxide layer. A silicon etch is done by reactive-ion etching in the openings to the silicon substrate corresponding to the first pattern, thereby providing the desired advanced etch for the first pattern. Next, an oxide etch is done to open the second pattern through the silicon oxide to the silicon substrate. Finally, a second silicon etch is done, proceeding simultaneously in both the first and second patterns, after which any remaining photoresist mask may be removed.

This aspect of the present invention may be used to compensate for etch-rate lag and to thereby attain equal etch depths in all features. Alternatively, two patterns may be etched to two different depths. Further, the manufacturing yield of a second pattern may be significantly improved compared to standard sequential lithographic patterning and etch sequences. The limited topography created by the first patterning sequence does not adversely affect the deposition of a second photoresist film. An additional advantage over standard sequential lithographic patterning and etch sequences is a savings of up to half the total sequential etching time as a result of the two patterns being partially etched simultaneously.

SMILE may be used to compensate for etch rate lag, a phenomenon observed in reactive-ion etching in which the etch rate in a small opening is retarded relative to that in a larger opening. By appropriately advancing the etching of a small first pattern, for example, the subsequent simultaneous etch of the first pattern and a larger second pattern may be used to attain an equal final depth in both patterns. Alternatively, an etch of a first pattern may be advanced relative to a second pattern of equivalent geometry to result in a deeper final depth for the first pattern.

The third fundamental aspect of the present invention, designated herein as delayed LOCOS, generally comprises a sequence of processing steps to provide electrical access to an otherwise isolated substrate. This aspect of the invention may be used, preferably, to create contact holes through a silicon oxide insulating layer to an underlying silicon substrate. The essence of this aspect of the invention is that patterns that will ultimately correspond to the required contact holes to the substrate are created at an early stage in an overall fabrication sequence. Rather than completing the opening of the contact holes and forming the contacts immediately after patterning, the contact pattern remains abeyant while other standard silicon processing operations are executed. At a later stage in the process, the latent contact pattern is used to create the desired contact holes.

This aspect of the present invention is a modification to and improvement upon a standard silicon processing sequence known as LOCal Oxidation of Silicon, or LOCOS. A relatively thin oxide film is grown, followed by the deposition of a thicker silicon nitride film. Standard lithographic procedures and reactive-ion etching are used to pattern the silicon nitride film. The pattern is such that nitride remains where contact holes are ultimately to be formed. The nitride pattern thus formed remains in place during subsequent processing.

When a stage is reached in the overall process—generally, after all high temperature (>400° C.) processing has been completed—where electrical contacts to the silicon substrate must be formed, the silicon nitride and the underlying thin oxide layer are removed to expose the silicon substrate. Metal, preferably aluminum, is then deposited and may be patterned by standard lithographic and etching techniques.

This aspect of the present invention has the advantage that the nitride patterning is done at an early stage in the process when there is little or no surface topography to interfere with the uniform and continuous coating of photoresist for lithographic patterning. This is favored over the standard alternative approach in which contact hole patterning is done immediately prior to metallization, generally in the presence of significant and limiting surface topography.

A fourth aspect of the present invention provides an improved process for fabricating an integrated liquid chromatography/electrospray ionization (LC/ESI) device. All three of the fundamental aspects of this invention are incorporated in the fabrication sequence to significantly improve fabrication reliability and manufacturing yield. In the preferred embodiment, the integrated process produces an LC/ESI device generally comprising a silicon substrate defining an introduction orifice and a nozzle on an ejection surface such that electrospray generated by the ESI component is generally approximately perpendicular to the ejection surface; a fluid reservoir and a separation channel on a separation surface; at least one controlling electrode electrically contacting the substrate through the oxide layer on the ejection surface; and a second substrate attached to the separation surface of the first substrate so as to enclose the fluid reservoir and separation channel. The second substrate may also define an electrode or electrodes with which to control fluid motion in the LC/ESI device. The LC/ESI device is integrated such that the exit of the separation channel forms a homogeneous interface with the entrance to the nozzle. All surfaces of the device preferably have a layer of silicon oxide to electrically isolate the liquid sample from the substrate and to provide for biocompatibility.

A fifth aspect of the present invention provides an improved process for fabricating an electrospray ionization (ESI) device. Two of the fundamental aspects of the present invention, simultaneous multi-level etching and delayed LOCOS, are incorporated in the fabrication sequence to significantly improve fabrication reliability and manufacturing yield. In the preferred embodiment, the integrated process produces an ESI device generally comprising a silicon substrate defining a nozzle and surrounding recessed region on an ejection surface, an entrance orifice on the opposite surface (the injection surface), and a nozzle channel extending between the entrance orifice and nozzle such that the electrospray generated by the electrospray device is directed generally perpendicularly to the ejection surface. All surfaces of the ESI device preferably have a layer of silicon oxide to electrically isolate the liquid sample from the substrate and to provide for biocompatibility.

A sixth aspect of the present invention provides an improved process for fabricating a liquid chromatography (LC) device. Two of the fundamental aspects of the present invention—latent masking and delayed LOCOS—are incorporated in the fabrication sequence to significantly improve fabrication reliability and manufacturing yield. In the preferred embodiment, the integrated process produces an LC device generally comprising a silicon substrate defining an introduction channel between an entrance orifice and a reservoir, a separation channel between the reservoir and a separation channel terminus, and an exit channel between the separation channel terminus and an exit orifice; the LC device further comprising a second substrate attached to the separation surface of the first substrate so as to enclose the reservoir and separation channel. All surfaces of the LC device preferably have a layer of silicon oxide to electrically isolate the liquid sample from the substrate and to provide for biocompatibility.

BRIEF DESCRIPTION OF THE DRAWINGS

FIG. 71A shows a plan view of a completed LC device;

FIG. 71B shows a cross-sectional view of a completed LC device;

FIG. 71C shows a cross-sectional view of a completed LC device;

FIG. 72A shows a plan view of the initial process steps relating to the delayed LOCOS aspect of the invention, as part of a fabrication sequence for an LC device;

FIG. 72B shows a cross-sectional view of the initial process steps relating to the delayed LOCOS aspect of the invention, as part of a fabrication sequence for an LC device;

FIG. 72C shows a cross-sectional view of the initial process steps relating to the delayed LOCOS aspect of the invention, as part of a fabrication sequence for an LC device;

FIG. 73A shows a plan view of the initial process steps relating to the delayed LOCOS aspect of the invention, as part of a fabrication sequence for an LC device;

FIG. 73B shows a cross-sectional view of the initial process steps relating to the delayed LOCOS aspect of the invention, as part of a fabrication sequence for an LC device;

FIG. 74 shows a cross-sectional view of further process steps in the fabrication of an LC device;

FIG. 75 shows a cross-sectional view of further process steps in the fabrication of an LC device;

FIG. 76A shows a plan view of further process steps in the fabrication of an LC device;

FIG. 76B shows a cross-sectional view of further process steps in the fabrication of an LC device;

Figure 77:
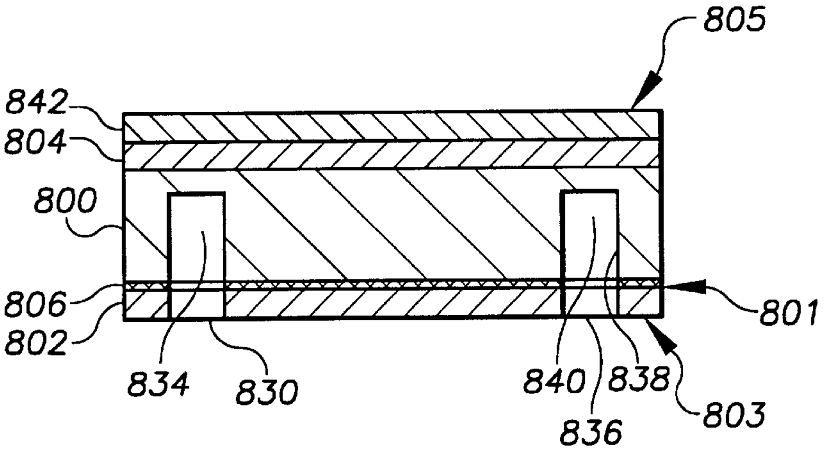
Figure 78A:
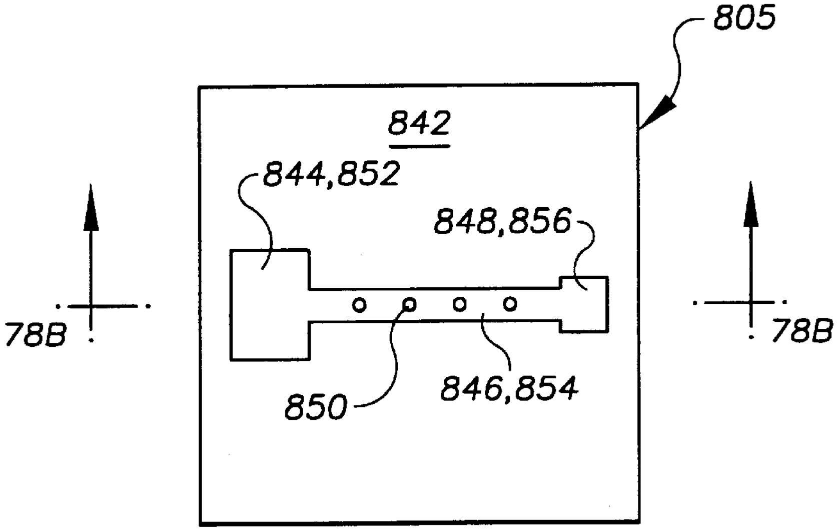
Figure 78B:
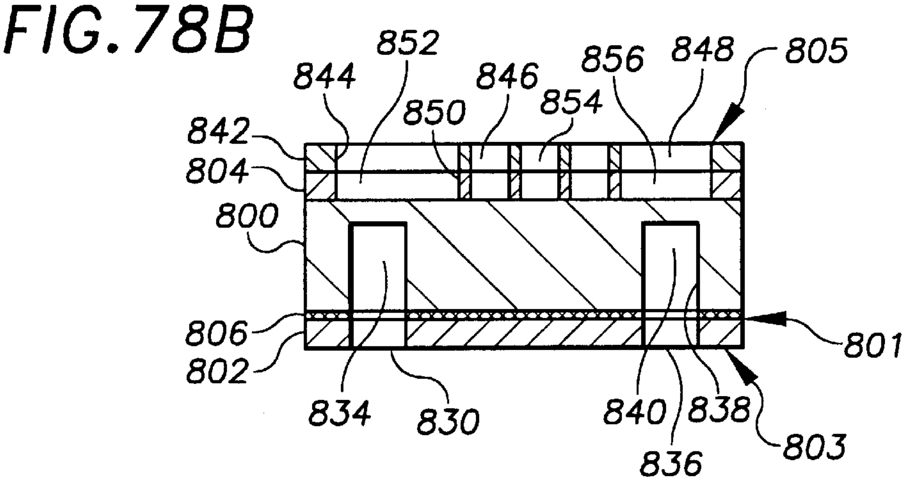
Figure 79:
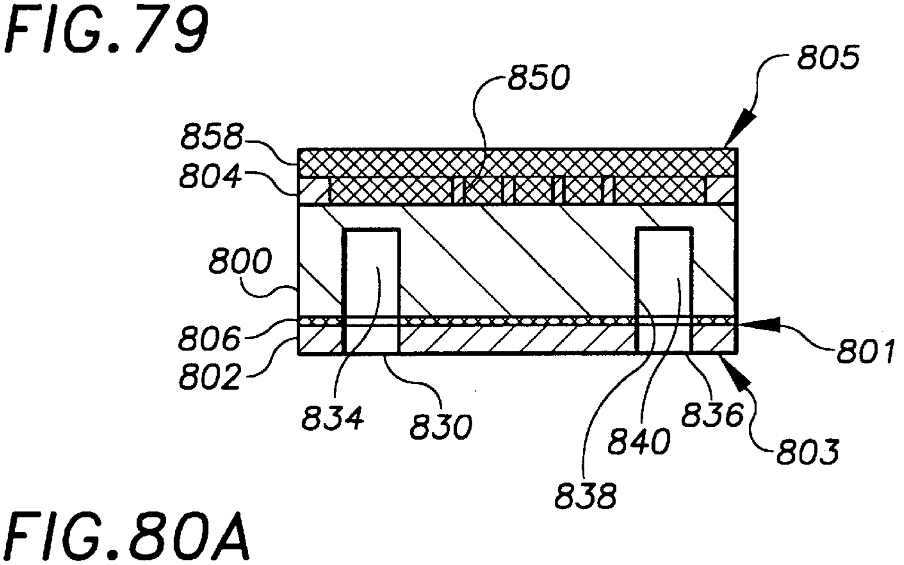
Figure 80A:
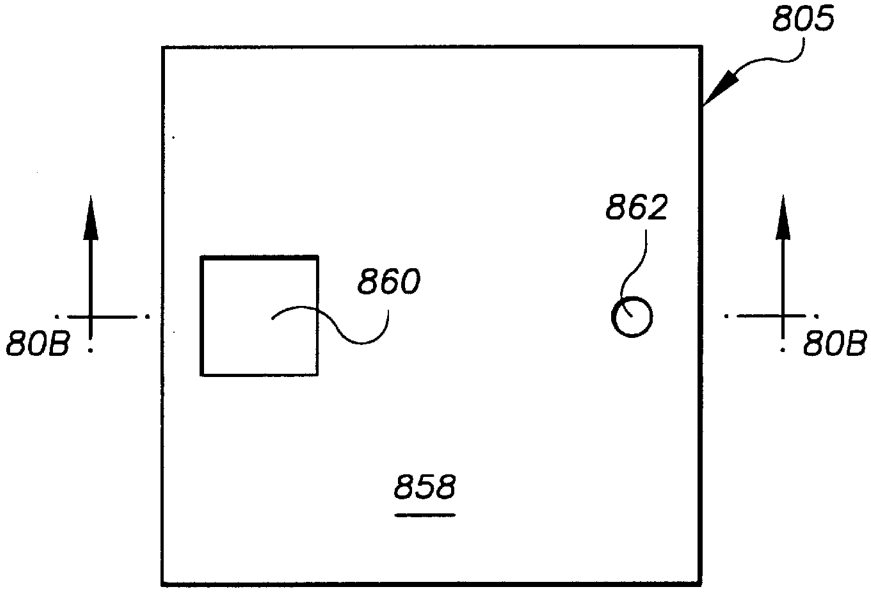
Figure 80B:
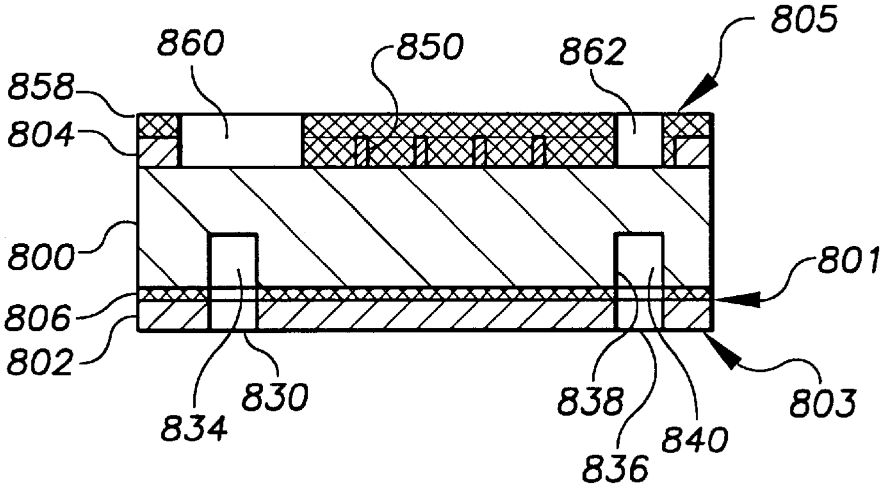
Figure 81:
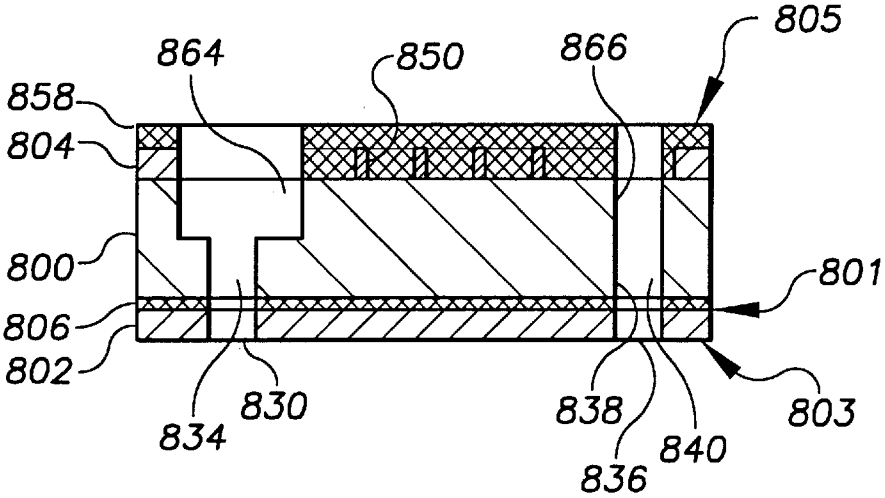
Figure 82A:
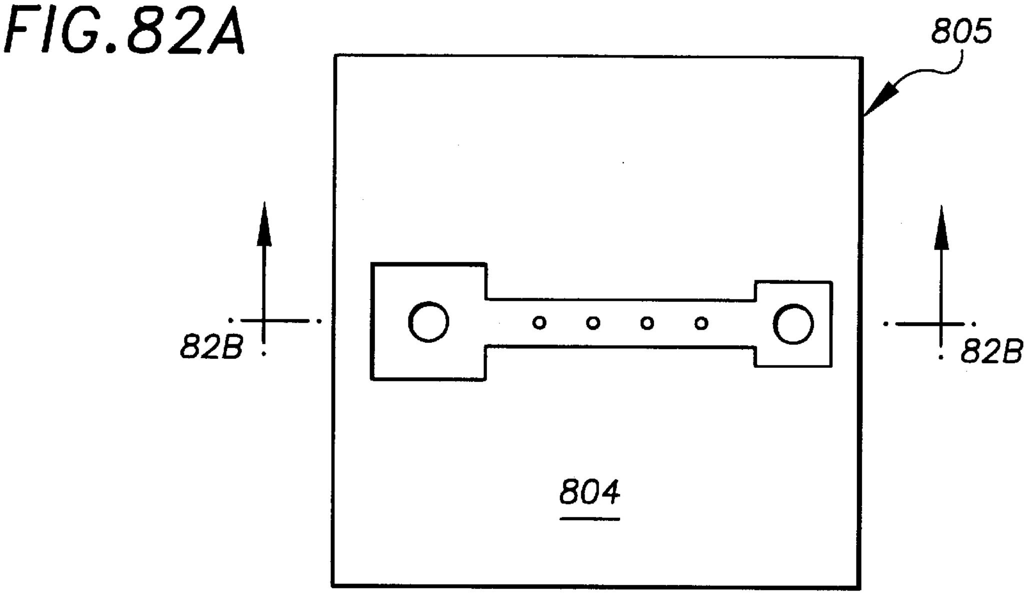
Figure 82B:
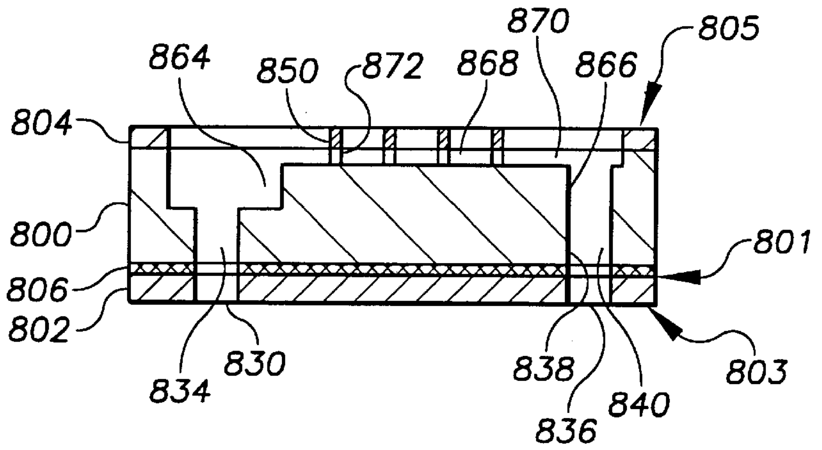
Figure 83:
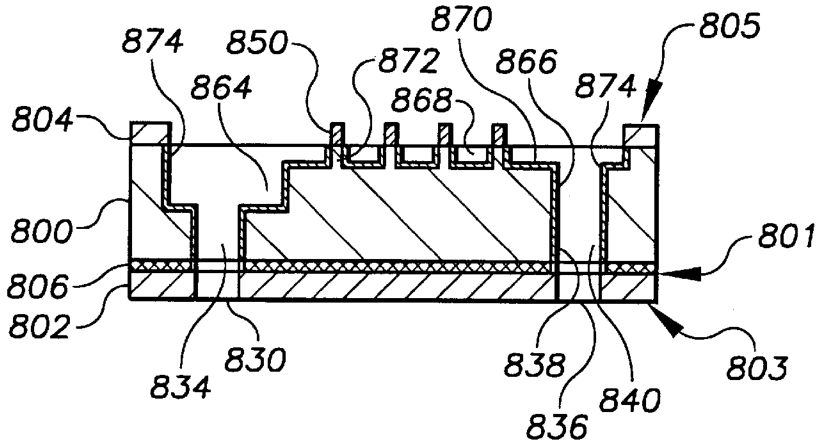
Figure 84A:
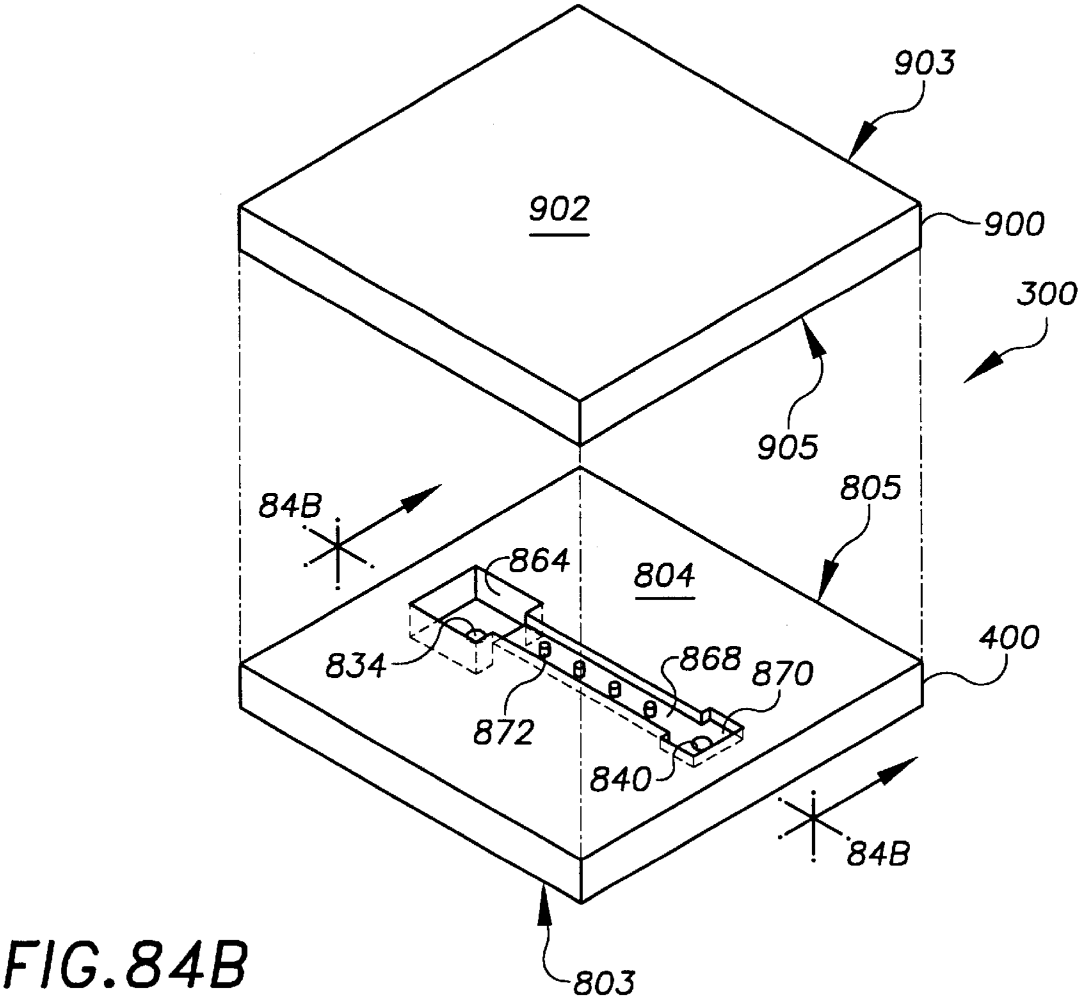
Figure 84B:
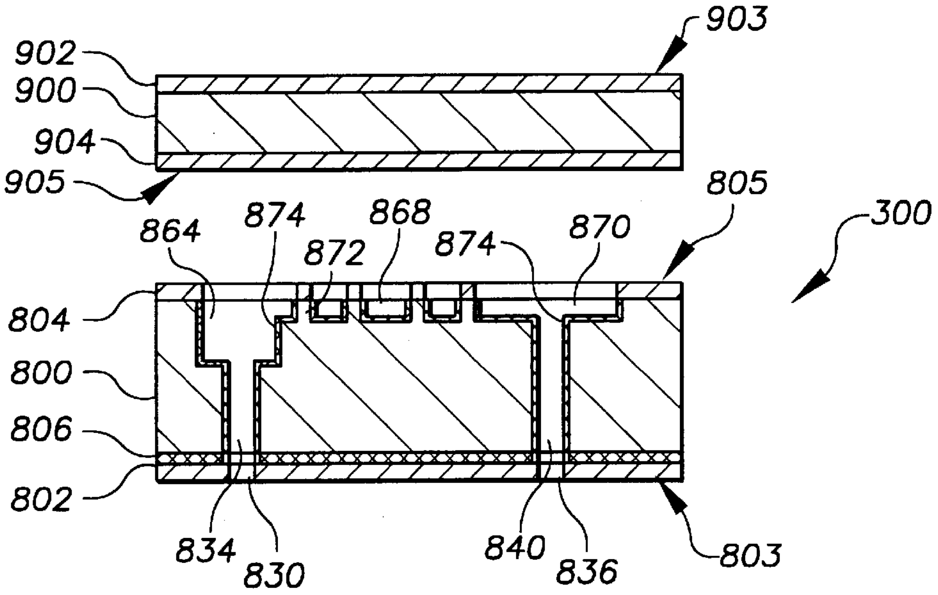
Figure 85:
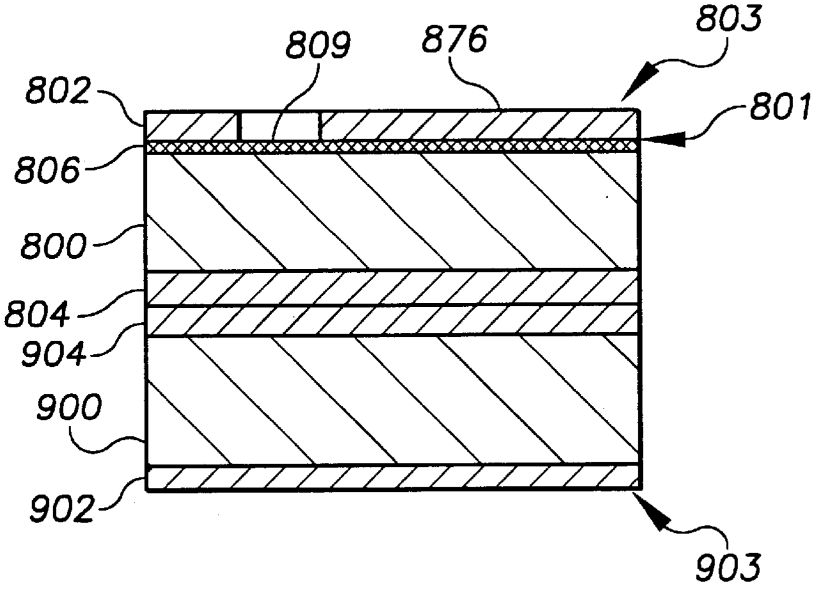
Figure 86:
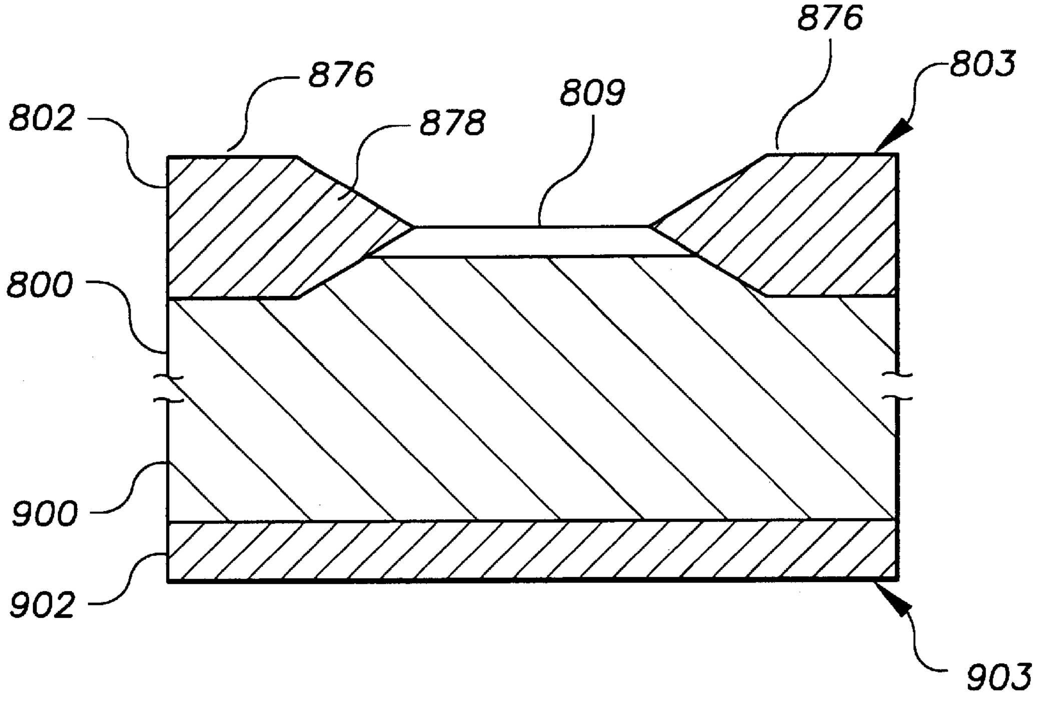
Figure 87A:
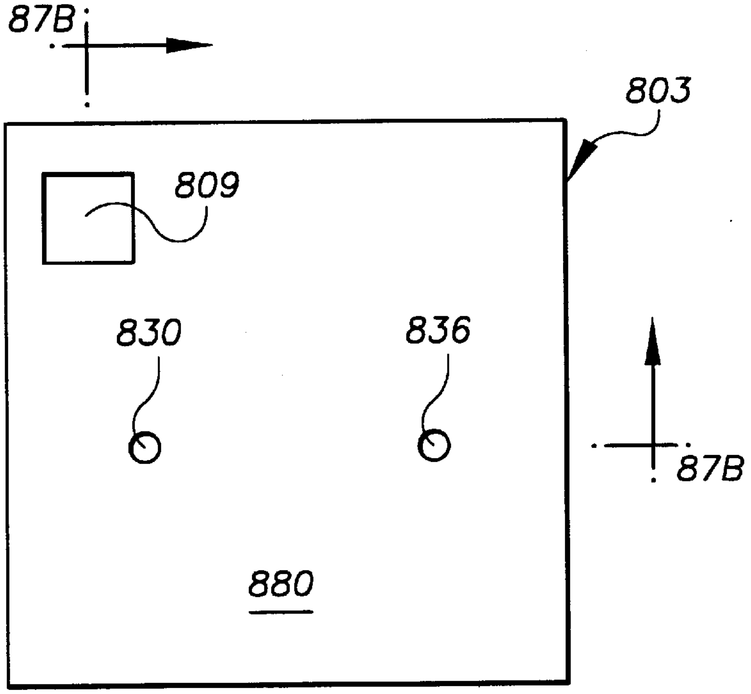
Figure 87B:
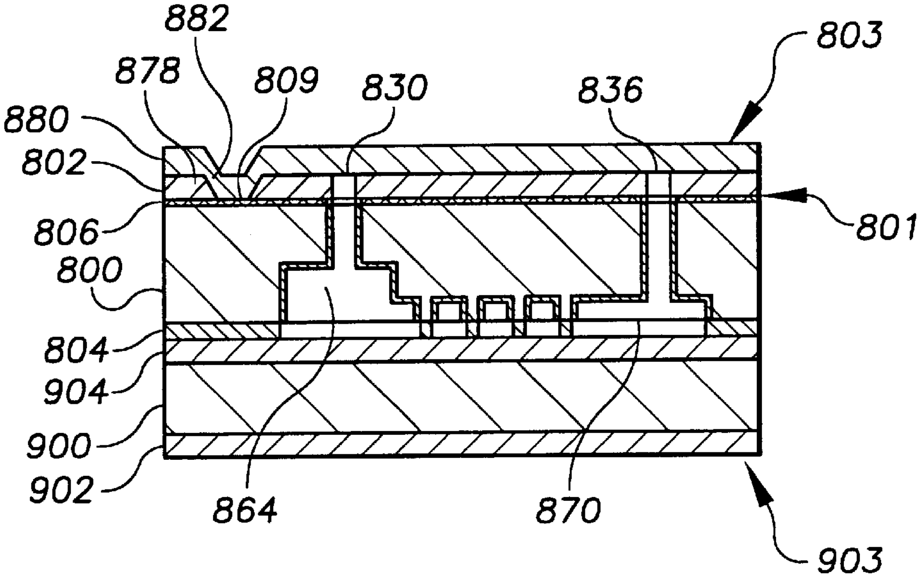
Figure 88A:
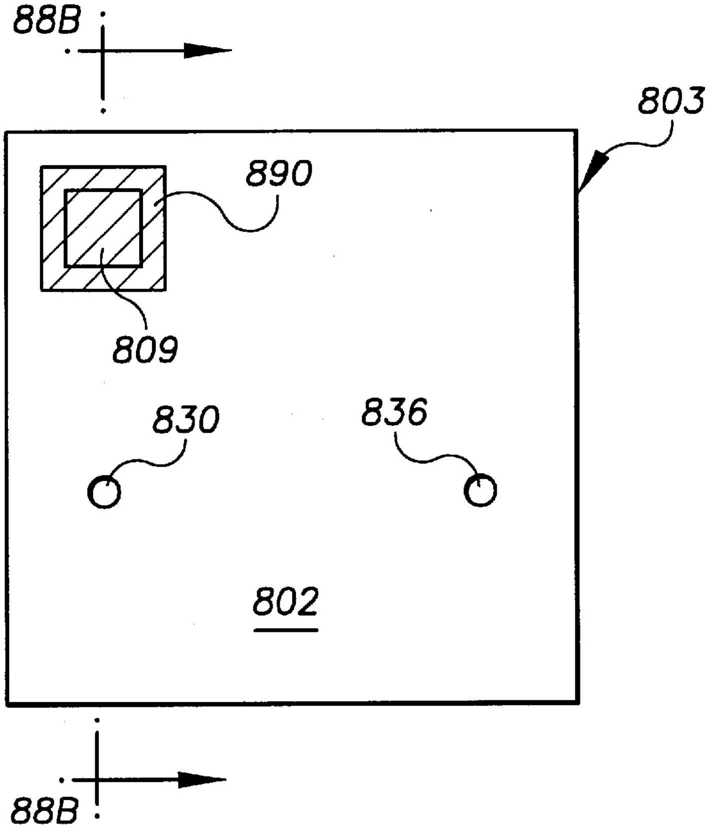
Figure 88B:
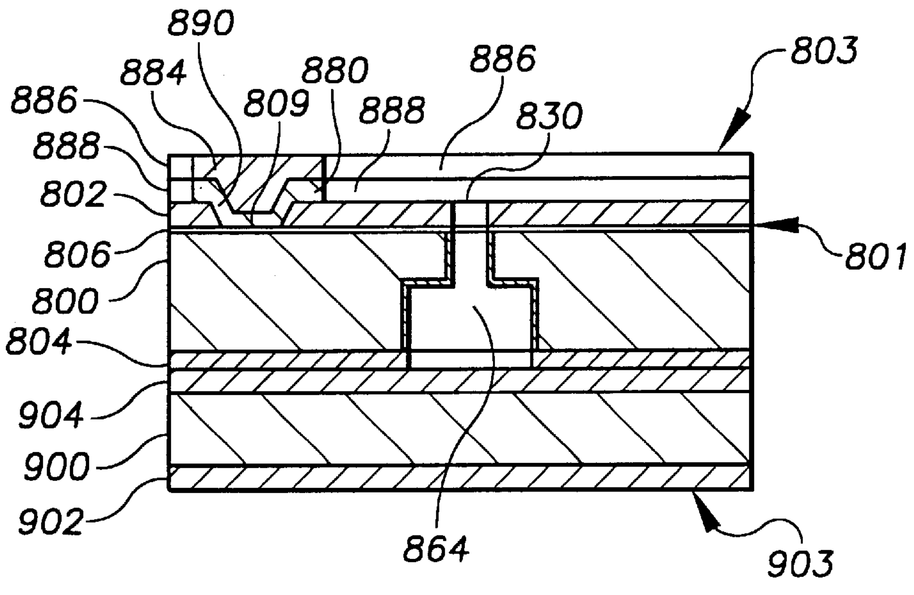
Figure 89A:
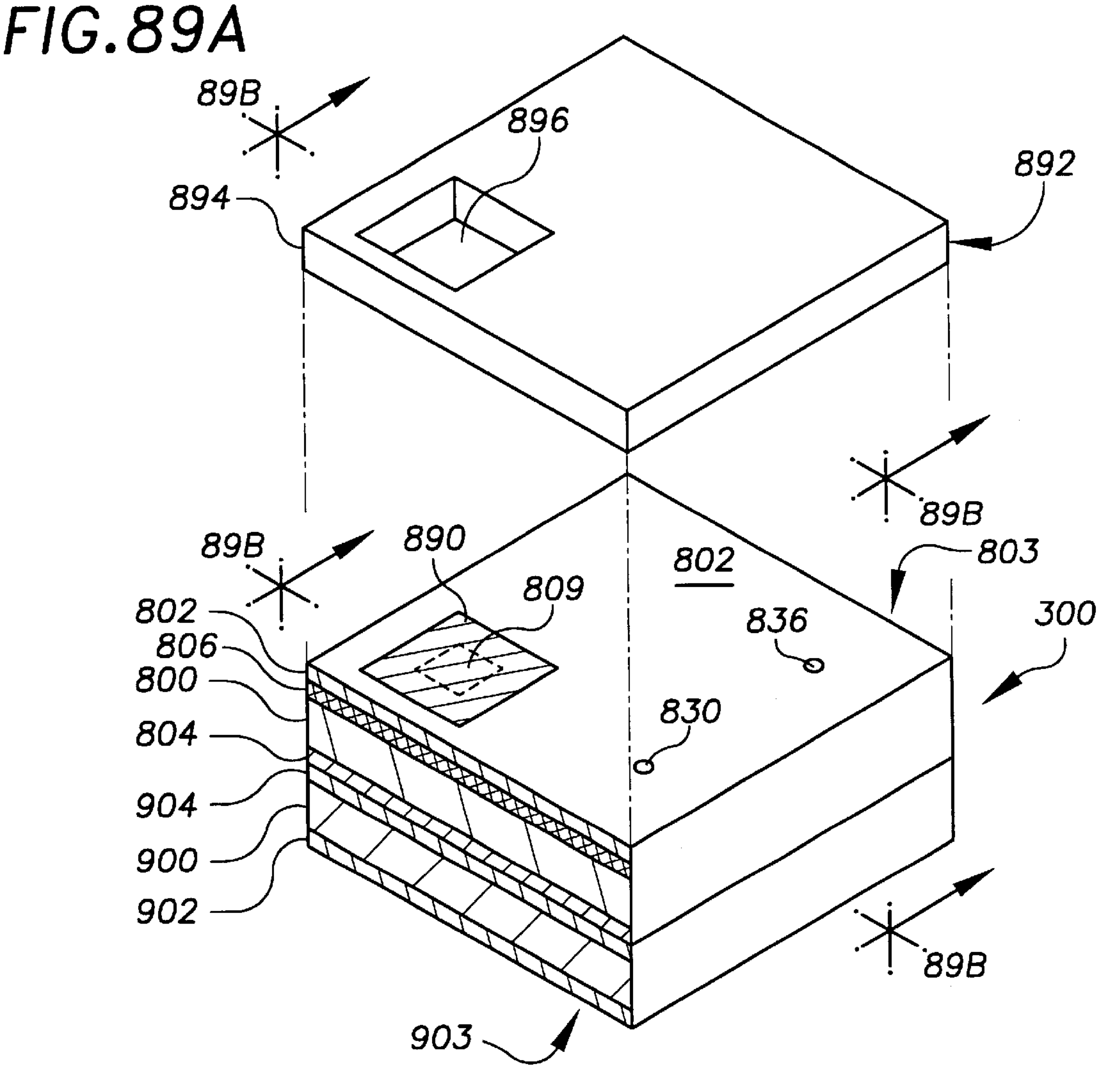
Figure 89B:
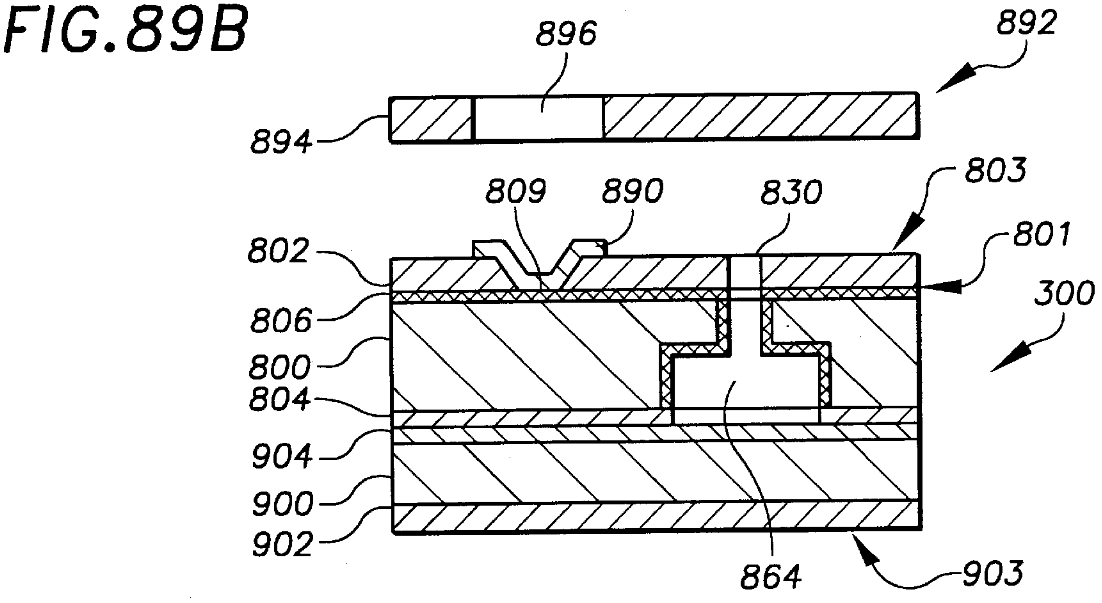

FIG. 77 shows a cross-sectional view of process steps relating to the definition of an oxide mask for latent masking in the fabrication of an LC device;

FIG. 78A shows a plan view of process steps relating to the definition of an oxide mask for latent masking in the fabrication of an LC device;

FIG. 78B shows a cross-sectional view of process steps relating to the definition of an oxide mask for latent masking in the fabrication of an LC device;

FIG. 79 shows a cross-sectional view of process steps relating to the formation of fluid reservoirs and through-wafer channels in the fabrication of an LC device;

FIG. 80A shows a plan view of process steps relating to the formation of fluid reservoirs and through-wafer channels in the fabrication of an LC device;

FIG. 80B shows a cross-sectional view of process steps relating to the formation of fluid reservoirs and through-wafer channels in the fabrication of an LC device;

FIG. 81 shows a cross-sectional view of process steps relating to the formation of fluid reservoirs and through-wafer channels in the fabrication of an LC device;

FIG. 82A shows a plan view of process steps relating to completion of the latent masking aspect of the invention in the fabrication of an LC device;

FIG. 82B shows a cross-sectional view of process steps relating to completion of the latent masking aspect of the invention in the fabrication of an LC device;

FIG. 83 shows a cross-sectional view of an LC device after passivation oxidation;

FIG. 84A shows an exploded perspective view of the first silicon substrate and a cover substrate in the fabrication of an LC device;

FIG. 84B shows an exploded cross-sectional view of the first silicon substrate and a cover substrate in the fabrication of an LC device;

FIG. 85 shows a cross-sectional view of the formation of electrical contact to the substrate in the fabrication of an LC device;

FIG. 86 shows a cross-sectional view of the formation of electrical contact to the substrate in the fabrication of an LC device;

FIG. 87A shows a plan view of the formation of electrical contact to the substrate in the fabrication of an LC device;

FIG. 87B shows a cross-sectional view of the formation of electrical contact to the substrate in the fabrication of an LC device;

FIG. 88A shows a plan view of the formation of electrical contact to the substrate in the fabrication of an LC device;

FIG. 88B shows a cross-sectional view of the formation of electrical contact to the substrate in the fabrication of an LC device;

FIG. 89A shows an exploded perspective view of an alternative method of metallization involving the use of a shadow mask in the fabrication of an LC device; and FIG. 89B shows an exploded cross-sectional view of an alternative method of metallization involving the use of a shadow mask in the fabrication of an LC device.

DESCRIPTION OF THE PREFERRED EMBODIMENT

The present invention generally describes methods by which constraints in the design and fabrication of MEMS and microfluidic devices may be overcome. Six aspects of the invention are described. Three aspects are fundamental, independent, and mutually compatible solutions to frequently encountered design and/or process constraints. Each of the other three aspects is derived by incorporating one or more of the fundamental aspects in an integrated process to fabricate a specific microfluidic device. The problems and limitations discussed are framed in the specific context of fabricating electrospray ionization (ESI), liquid chromatography (LC), and integrated LC/ESI devices. Descriptions of specific applications are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

LATENT MASKING

Figure 1:
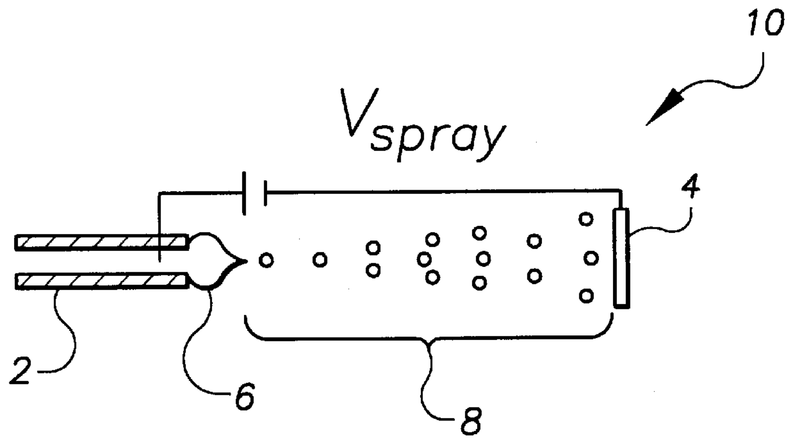
FIG. 1 PRIOR ART
FIG. 1 shows a schematic of an electrospray system.
Figure 2A:
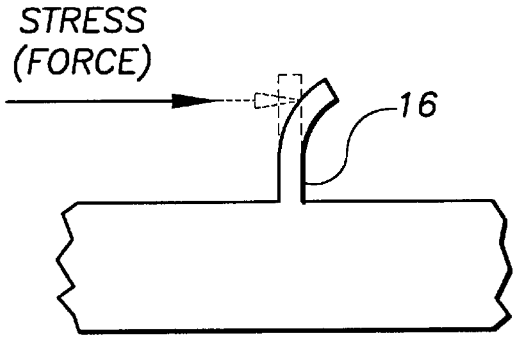
FIG. 2A PRIOR ART
FIG. 2A shows a schematic cross-sectional view of the application of stress to a silicon structure.
Figure 2B:
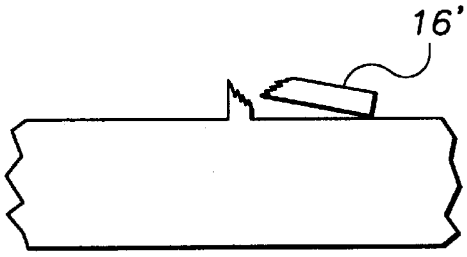
FIG. 2B PRIOR ART
FIG. 2B shows a schematic cross-sectional view of the damage to a silicon structure resulting from application of stress.

A first aspect of the present invention provides a method of preventing damage to small, high-aspect-ratio structures by forming them after all other potentially damaging processing has been completed. Damage may be done to silicon structures 16 in a MEMS or microfluidic device when sufficient stress is applied, as shown schematically in FIG. 2A. Silicon, like all materials, has an ability to accommodate limited stress through strain. However, beyond a critical point irreparable damage can be done to a structure 16', as shown in FIG. 2B. In deep silicon micromachining, high-aspect-ratio structures may be formed by first patterning a silicon oxide film, then using the oxide as a hard mask during an etch of the underlying silicon substrate. After the formation of these structures, further processing may be done on the same wafer surface to form other features. In the course of those lithographic and etch steps, the previously formed structures—which may be typically on the order of several micrometers in diameter and tens of micrometers in height—are subjected to mechanical stress from polymeric (photoresist) over-coating and wet immersion (e.g., wet etching, removal of photoresist, and wafer cleaning). Further, processing on the opposite side of the wafer, if any, requires that the already-structured side be handled as the supporting surface, leading to mechanical stress on the fragile structures from abrasion and clamping. Any or all of the foregoing mechanical stresses can lead to breakage of fragile structures, dramatically reducing manufacturing yield and, concomitantly, increasing the unit cost of such a device. It is therefore highly desirable that fragile structures be protected from the aforementioned stresses or, preferably, that they be formed at a stage in the overall process after which they will not be subjected to any damaging stresses. Inasmuch as stress is inadvertently applied during the course of routine processing, any successful approach to eliminating damage will require a minimum of handling and processing once the structures are formed.

The essential element of this aspect of the present invention is that the silicon etch to form the fragile structures is postponed, rather than being performed immediately following the patterning of the latent mask. After the masking layer, preferably of silicon oxide, is patterned, the photoresist is removed and normal processing operations are performed to process either the same side or the opposite side of the substrate. The patterned latent mask must be robust to the processing that occurs prior to its ultimate use as a mask for silicon etching.

The latent mask must have three qualities that are crucial to its persistence during these intervening steps. First, it must be chemically resistant to lithographic deposition, development, and removal steps. Second, it must be a mechanically hard, durable material. Third, the masking layer must be at most 1–2 $\mu$m in thickness, and therefore the patterned features in the mask are at most several micrometers high. This implies a very low probability of a mask feature having enough lateral force applied to it to do any damage when abrasions occurs and stress is applied. Further, the low profile represented by a mask feature of at most several micrometers in height makes it significantly easier to overcoat and expose photoresist in any desired lithographic step. Coating photoresist over features with high aspect ratio is extremely difficult to do with the required uniformity. Further, as noted before, the use of photoresist itself and the stress produced upon normal baking to remove solvents is sufficient to extensively damage small, fragile features.

Figure 3A:
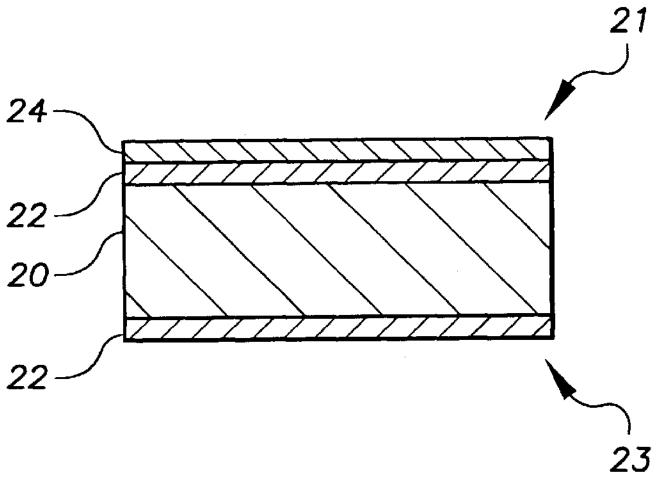
FIG. 3A shows a cross-sectional view of the latent masking process sequence.

A detailed description of the latent masking process sequence is now given using the preferred embodiment of silicon oxide as the masking material. FIGS. 3A–3D show plan and cross-sectional views of the latent masking process sequence. First, a layer of silicon oxide 22 is provided on a silicon substrate 20, as shown in FIG. 3A. The silicon oxide film may be grown thermally by known silicon oxidation techniques such as, for example, processing at elevated temperatures in a steam ambient. Alternatively, the silicon oxide layer 22 may be deposited by a variety of silicon processing techniques, including low-pressure chemical vapor deposition (LPCVD) and plasma-enhanced chemical vapor deposition (PECVD). A photoresist layer 24 is then coated on the silicon oxide layer 22.

Figure 3B:
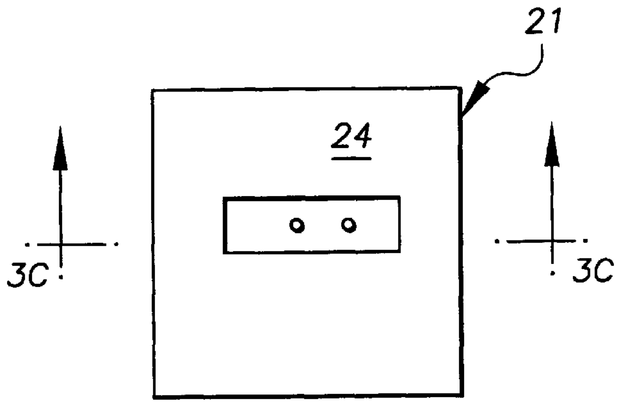
FIG. 3B shows a plan view of the latent masking process sequence.
Figure 3C:
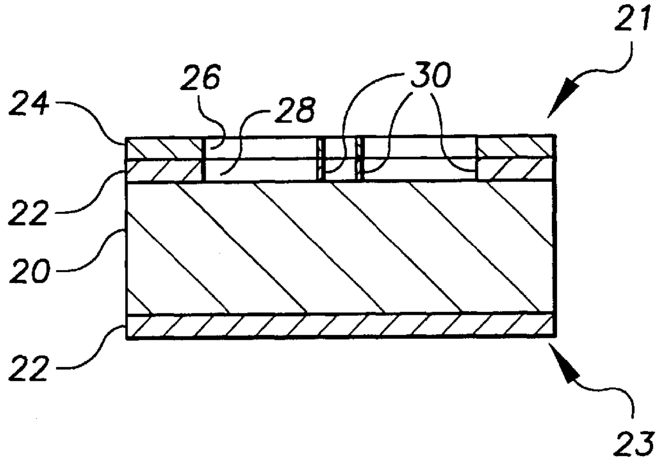
FIG. 3C shows a cross-sectional view of the latent masking process sequence.

Referring to the plan and cross-sectional views, respectively, of FIGS. 3B and 3C, photolithographic processing is used to define a pattern on the silicon oxide layer 22: a pattern is exposed in a photoresist 24 in a known lithographic tool such as a stepper, a scanner, or an aligner; and the exposed pattern is developed, leaving a pattern of openings 26 in the photoresist layer 24. The photoresist layer 24 then serves as a mask during an etch of certain areas 28 of the underlying oxide layer 22, transferring the photoresist pattern to the oxide. The oxide etch may be done wet or dry, although a dry (plasma) etch affords much better dimensional control and allows formation of smaller features. The result of the foregoing is the formation of patterns 30 of oxide that ultimately serve to mask an etch of the underlying silicon substrate 20. The remaining photoresist 24 may be removed in an oxygen plasma or in an actively oxidizing chemical bath such as sulfuric acid ($H_2SO_4$) activated with hydrogen peroxide ($H_2O_2$). Alternatively, the photoresist mask 24 may be retained if compatible with intermediate processing steps to provide additional masking protection during lengthy silicon etches.

Figure 3D:
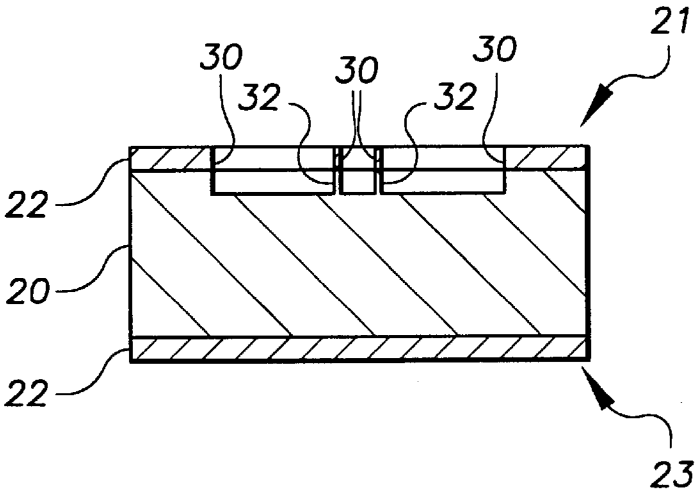
FIG. 3D shows a cross-sectional view of the latent masking process sequence.

Rather than proceeding immediately to etch the underlying silicon using the patterned oxide as a mask, a variety of processing operations may be performed on either a same surface 21 or an opposite surface 23 of the substrate 20. The principal requirement is that none of the operations perturb the latent mask 30. At an appropriate stage of the overall process after the intervening process steps, the latent mask 30 is finally used to protect certain areas 32 corresponding to desired structures during an etch into the underlying silicon substrate 20, as shown in FIG. 3D.

Figure 4A:
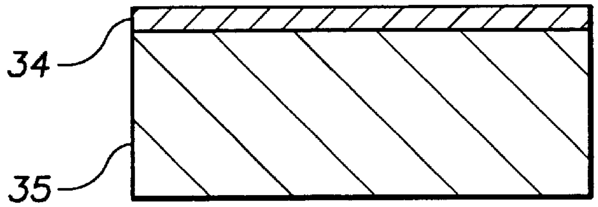
FIG. 4A shows a cross-sectional view of an alternative embodiment of the latent masking aspect of the present invention.
Figure 4B:
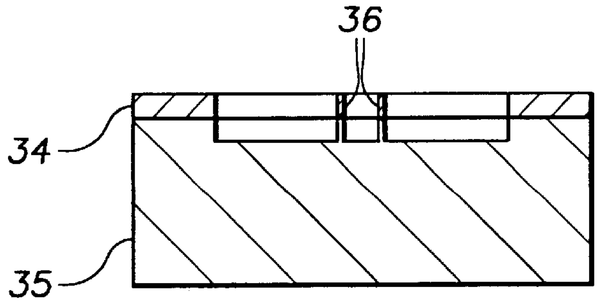
FIG. 4B shows a cross-sectional view of an alternative embodiment of the latent masking aspect of the present invention.

In an alternative embodiment of a latent masking process, an alternative organic photosensitive material such as polyimide may be used alone (i.e., without an underlying oxide layer) in place of photoresist as the masking material. In this case, a polyimide 34 would be coated directly on a silicon substrate 35 (FIG. 4A). The polyimide layer 34 would then be patterned and cured, an operation that requires treatment at an elevated temperature. The cured polyimide material is much more robust than photoresist, and will therefore survive many silicon processing steps that standard photoresist will not, including immersion in some solvents, abrasive handling (e.g., during the course of processing on the opposite side of the wafer), and elevated temperature operations up to 400° C., typically. After intervening processing, a polyimide pattern 34 may be used at a later stage in the process to mask the silicon etch to define silicon structures 36 (FIG. 4B). Additional alternative masking materials include metal, silicon nitride, and amorphous diamond-like carbon.

Figure 5A:
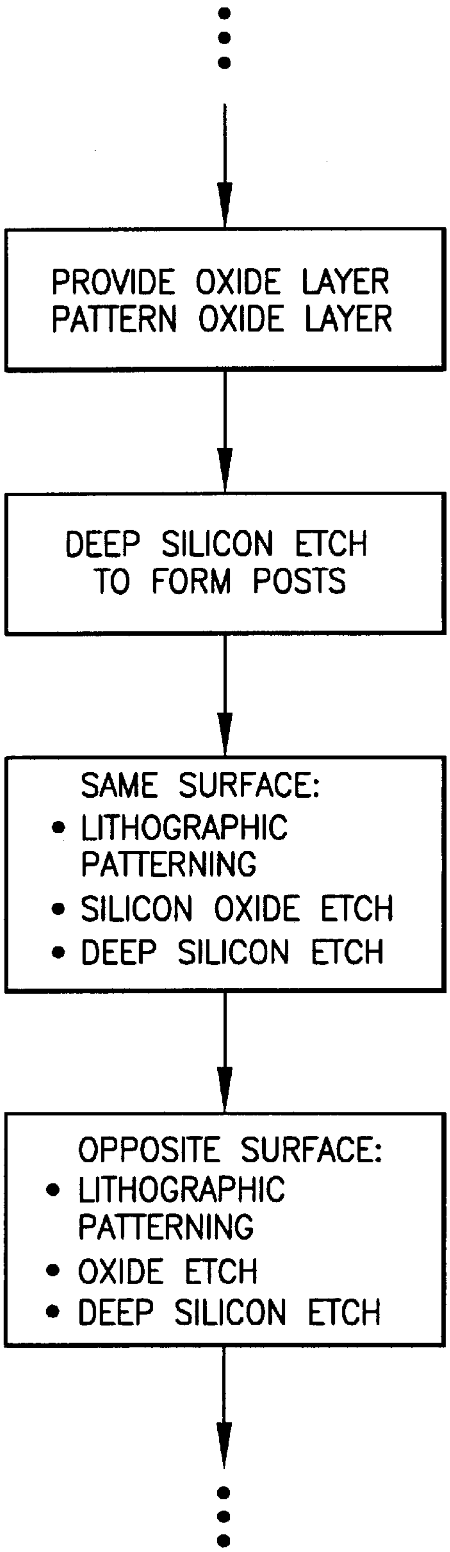
FIG.5A PRIOR ART
FIG. 5A shows a conventional process sequence for fabricating separation posts.
Figure 5B:
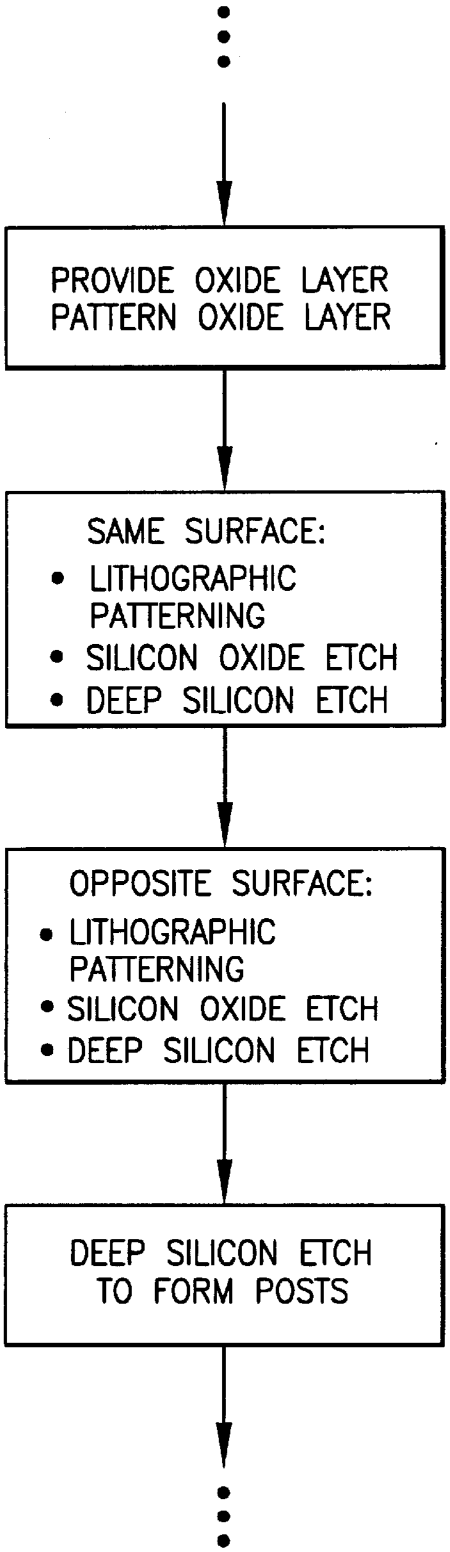
FIG. 5B shows a latent masking block process sequence for fabricating separation posts.
Figure 6A:
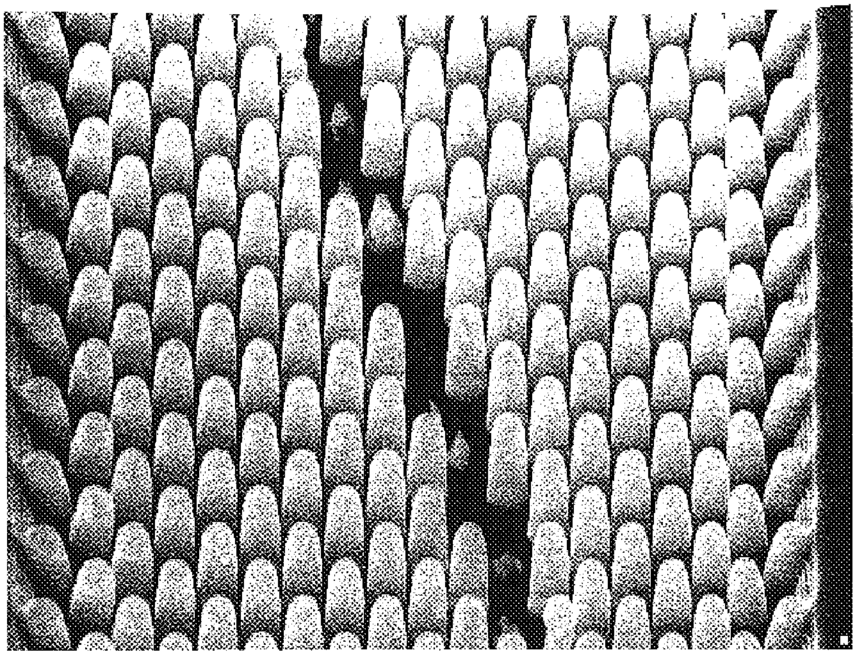
FIG. 6A shows a scanning electron micrograph of separation posts fabricated using conventional processes.
Figure 6B:
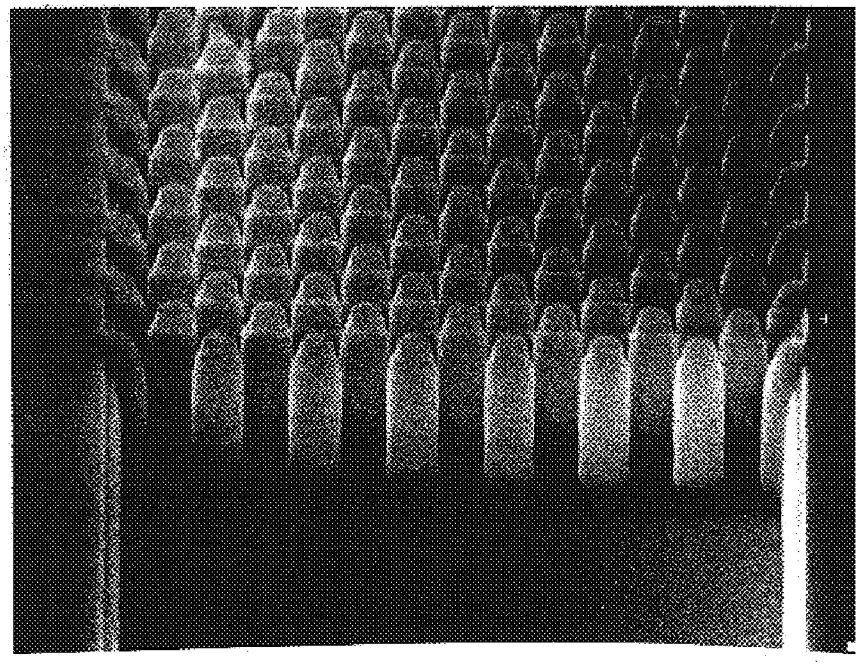
FIG. 6B shows a scanning electron micrograph of separation posts fabricated using latent masking processes.

Structures for performing liquid chromatography have been fabricated as a demonstration of the efficacy of the latent masking process. The structures are posts roughly 1–2 μm in diameter and 10 μm in height, populating a 10 μm deep fluid channel. FIGS. 5A and 5B schematically show conventional and latent masking process sequences, respectively, for fabricating the separation posts. In FIG. 5A, formation of the latent oxide mask is followed immediately by a deep silicon etch to form the channel and posts. Additional lithographic patterning and etching is subsequently done both on the same substrate surface as the separation posts as well as on the opposite surface. The additional processing after formation of the posts subjected them, first, to film stress from photoresist in the same-side processing and, second, to handling abrasion during the opposite-side processing. The damage that is done to the posts as a result of those stresses can be seen in the scanning electron micrograph of FIG. 6A. In comparison, the latent masking process is incorporated as shown schematically in FIG. 5B. In this case, the posts are etched after all other features have been created. FIG. 6B shows a corresponding channel portion from a device fabricated according to the latent masking process of FIG. 5B. The absence of stress-induced damage is representative of all parts of all channels on the device.

It is therefore seen that the latent masking process is highly effective in eliminating stress-related damage to small, fragile features. One advantage of latent masking is that it does not require additional or different photolithographic masks as compared to a conventional process. A further advantage is that the latent mask, once formed, presents a low profile that does not interfere with the ability to uniformly and continuously coat photoresist films. This allows lithographic patterning to be done after the latent mask's formation. When latent masking is not used, as in the process of FIG. 5A, topographical variations are created by the silicon etch that are too extreme to permit the uniform and continuous coating of new photoresist films. Patterning steps on the etched surface are therefore precluded. Yet another benefit of the latent-masking process is that the low profile of the latent mask makes it significantly less susceptible to being damaged by handling and abrasive stresses than completed high-aspect-ratio structures, and may therefore be expected to survive additional processing without being damaged. A final advantage is that the use of the latent mask may be placed at a late enough stage in the overall process to ensure that the resulting fragile structures are not subjected to damaging stresses by subsequent operations.

SIMULTANEOUS MULTI-LEVEL ETCHING (SMILE)

A second aspect of the present invention provides a method of independently controlling etch depths of two patterns while simultaneously etching both patterns. The challenge inherent in etching two patterns to independently controllable depths has two facets. First, the phenomenon known as etch lag causes a small pattern to etch at a generally slower rate than a larger pattern. The effect becomes increasingly pronounced as the smaller pattern diminishes in at least one lateral dimension below 10 μm, resulting in as much as 30–40% slower etch rate in the smaller pattern. Second, two patterns of approximately equal area attain an equivalent depth when etched simultaneously. Under standard processing conditions, it is not possible to etch a small pattern and a large pattern simultaneously to the same depth; nor is it possible to etch equal-area patterns simultaneously to different depths.

A method by which two patterns of arbitrary dimensions may be etched into a substrate must satisfy two requirements: first, that existence of the first pattern does not interfere with the lithographic processing associated with the second pattern; and second, that the final depths of the two etched patterns can be independently controlled.

The essence of this aspect of the present invention is the use of two masking layers, preferably a photoresist layer and a silicon oxide layer, to allow appropriate staging of mask and substrate etches so that both requirements are met. The patternability of the second pattern is ensured by etching the first pattern only through the oxide layer before performing a second lithographic patterning sequence. The second photoresist mask is exposed and developed to comprise both the first and second patterns, i.e., the first pattern is not occluded by the second photoresist mask. The first pattern may then be etched into the silicon to a desired extent in order to advance the etching of the first pattern relative to the second. The exposed oxide layer corresponding to the second pattern prevents the second pattern from being etched into the silicon substrate until the desired amount of advance is given the first pattern, after which the oxide is etched and silicon etching is done in both patterns simultaneously until reaching the desired depths.

Figure 7A:
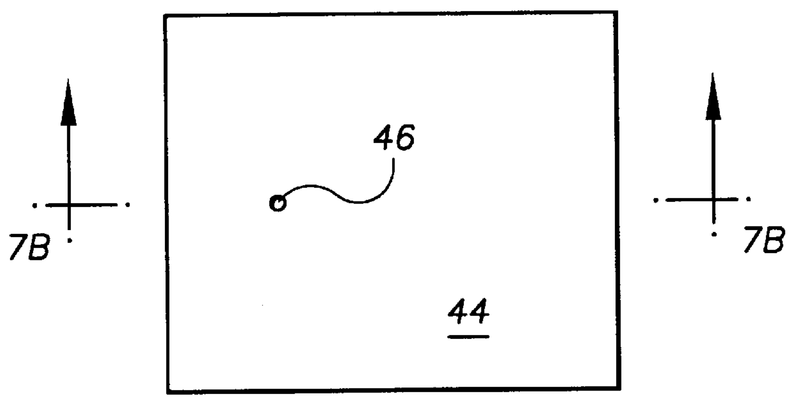
FIG. 7A shows a plan view of the simultaneous multi-level etching (SMILE) process sequence.
Figure 7B:
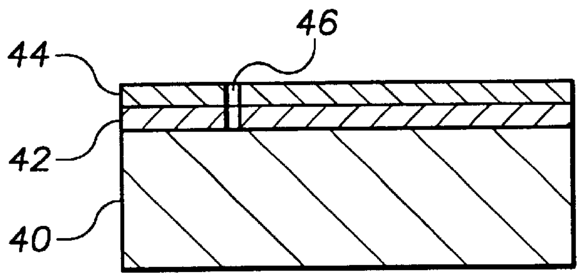
FIG. 7B a cross-sectional view of the simultaneous multi-level etching (SMILE) process sequence.
Figure 7C:
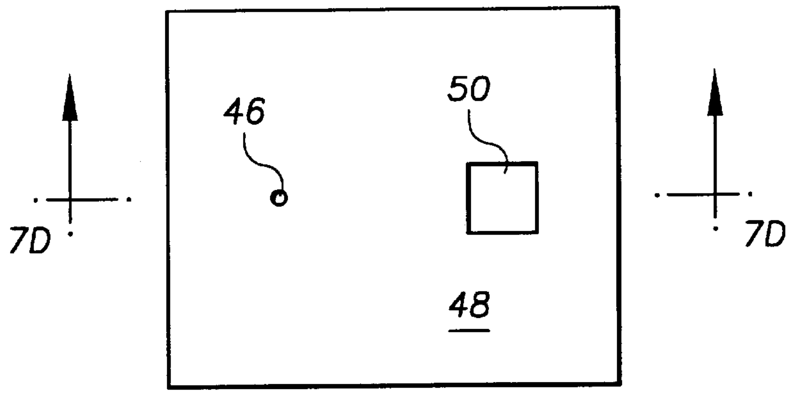
FIG. 7C shows a plan view of the simultaneous multi-level etching (SMILE) process sequence.
Figure 7D:
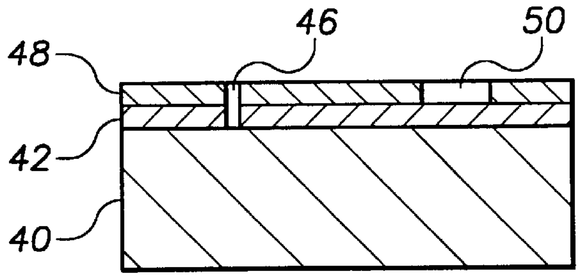
FIG. 7D shows a cross-sectional view of the simultaneous multi-level etching (SMILE) process sequence.

A detailed description of the SMILE process sequence is now given using the preferred embodiment of silicon oxide as a masking material to complement photoresist-masked etching. Referring to the plan and cross-sectional views of FIGS. 7A and 7B, respectively, a required oxide layer 42 on a substrate 40 is created at an earlier stage in the device fabrication sequence. A photoresist layer 44 is deposited uniformly on the oxide layer 42, then photolithographic processing is used to expose and remove certain areas 46 corresponding to a first pattern. The resulting pattern in the photoresist layer 44 is then transferred to the underlying oxide layer 42 by either dry or wet etching the oxide until reaching the silicon substrate 40. Dry (plasma) etching of the oxide will provide tighter dimensional control and an ability to create smaller features than wet etching. A silicon etch is not done at this stage. Rather, as shown in FIGS. 7C and 7D, the photoresist 44 is removed, then a new photoresist layer 48 is coated. The photoresist layer 48 is exposed and developed to open certain areas 46, 50 that correspond to both first and second patterns, respectively. After this photolithographic processing step, the area 46 is open to the silicon substrate 40 and the area 50 is open to the silicon oxide layer 42.

Figure 8:
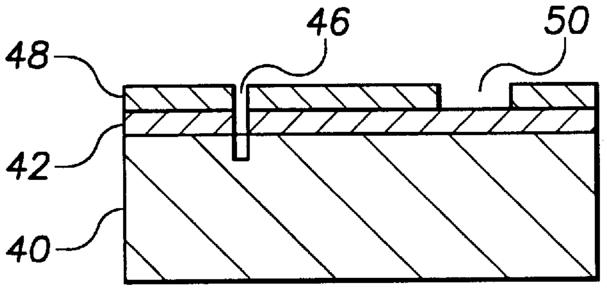
FIG. 8 shows a cross-sectional view of the simultaneous multi-level etching (SMILE) process sequence.
Figure 9:
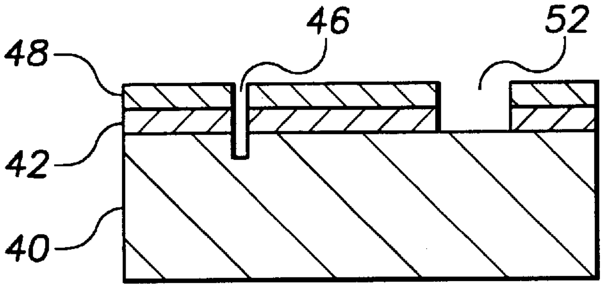
FIG. 9 shows a cross-sectional view of the simultaneous multi-level etching (SMILE) process sequence.
Figure 10:
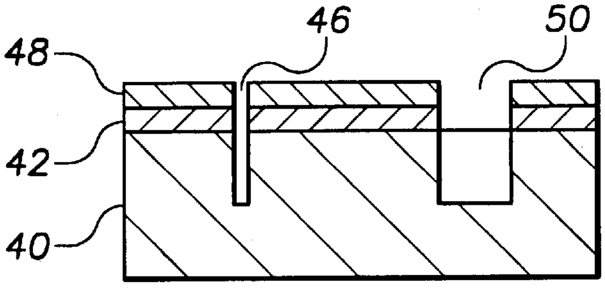
FIG. 10 shows a cross-sectional view of the simultaneous multi-level etching (SMILE) process sequence.

Referring to FIG. 8, a silicon etch is then performed into the substrate 40 using the photoresist 48 and oxide 42 masks, thus beginning the etch of the area 46, corresponding to the first pattern, into the silicon substrate 40. Due to its being masked by the oxide, the area 50, corresponding to the second pattern, is not etched into the silicon substrate 40 at the same time. This gives the first pattern an advance over the second pattern. The silicon etch is stopped when the desired depth has been attained in the area 46, as determined by measurement and/or calculation relying on etch rate (allowing for etch rate lag). As shown in FIG. 9, the remaining photoresist mask 48 is then used to mask an oxide etch, transferring the second pattern to the oxide layer 42 and creating openings 52 in the oxide layer 42 to the underlying silicon substrate 40 corresponding to the second pattern. The area 46 is unaffected during the oxide etch. The combined remaining photoresist 48 and oxide masks 42 are then used to mask a second silicon etch to the desired depth of the first pattern and the second pattern, with etching proceeding simultaneously in both areas 46, 50 (FIG. 10).

Figure 11A:
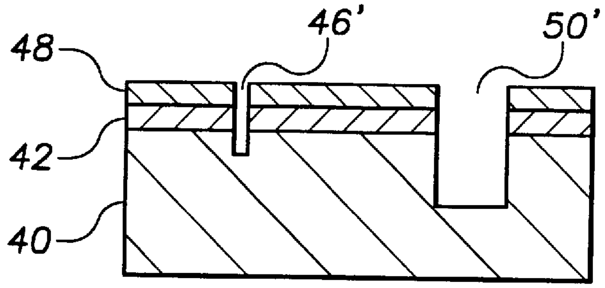
FIG. 11A shows a cross-sectional view of one of three alternative outcomes from the SMILE process.
Figure 11B:
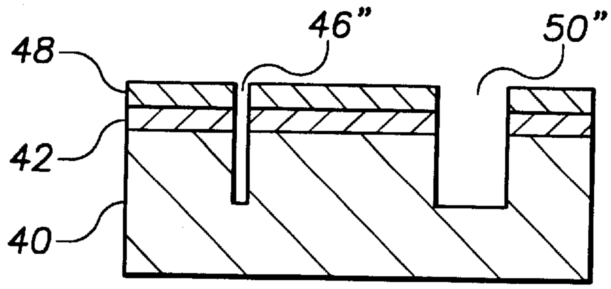
FIG. 11B shows a cross-sectional view of one of three alternative outcomes from the SMILE process.
Figure 11C:
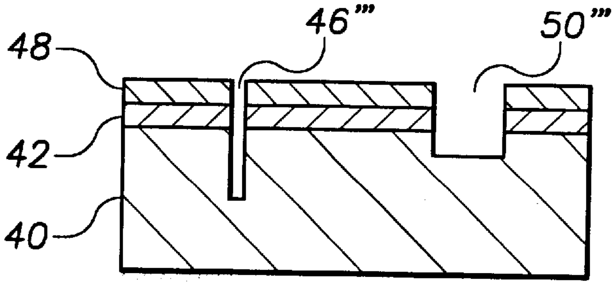
FIG. 11C shows a cross-sectional view of one of three alternative outcomes from the SMILE process.

The amount of first-pattern-only silicon etch, i.e., the first silicon etch, may be designed to be such that one of three general alternative outcomes is attained (FIGS. 11A–11C). A relatively limited amount of first-pattern etch will result in the final depth of a first pattern 46' being less than that of a second pattern 50' (FIG. 11A). (In the limit, where no first-pattern etch is done, the first pattern depth would be that dictated by etch rate lag, if any.) Alternatively, the amount of first-pattern etch may be chosen so as to roughly balance the respective final depths of first and second patterns 46', 50' (FIG. 11B). Lastly, the amount of first-pattern etch may be chosen so as to realize a greater final depth in a first pattern 46''' than in a second pattern 50''' (FIG. 11C).

Figure 12A:
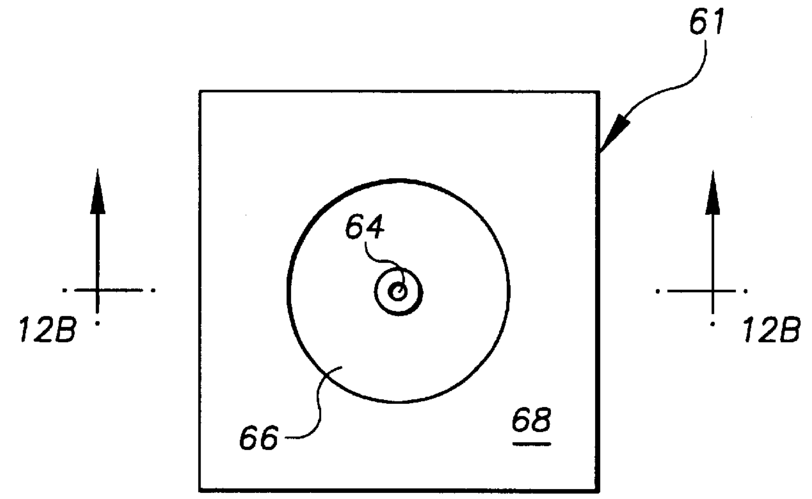
FIG. 12A shows a plan view of a nozzle structure.
Figure 12B:
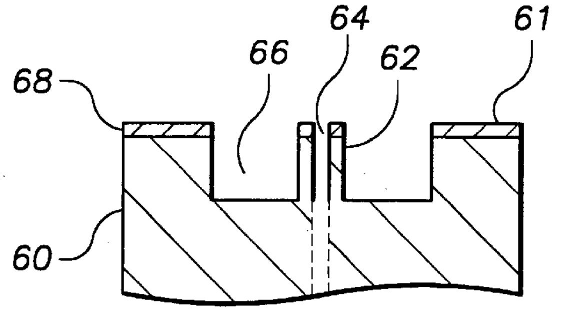
FIG. 12B shows a cross-sectional view of a nozzle structure.

Nozzle structures have been fabricated as a demonstration of the efficacy of the SMILE process. The nozzle structure, shown in the plan and cross-sectional views of FIGS. 12A and 12B, respectively, comprises a cylindrical form generally perpendicular to a surface 61 of a substrate 60, having a nozzle channel 64 centered in and extending along the axis of a nozzle 62, as well as an annular region 66 recessed from the surface 61 and extending radially from the outer diameter of the nozzle 62. A masking oxide 68 covers the surface 61 where it has not been etched. The nozzle is an essential element of an electrospray ionization device, that device further comprising an extension of the nozzle channel continuously to the opposite substrate surface.

Figure 13A:
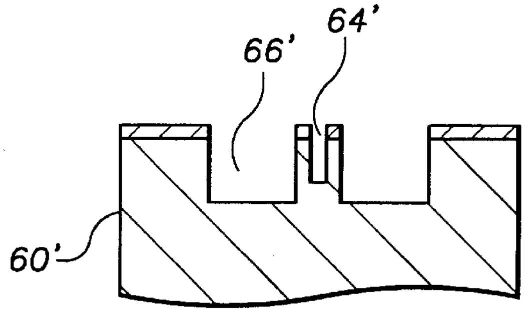
FIG. 13A shows a cross-sectional view of an etched nozzle structure without compensation for etch lag.

If the nozzle channel were etched simultaneously with the recessed region surrounding the nozzle, the etch lag phenomenon would prevent the small nozzle channel from etching as quickly as the recessed region. As shown schematically in the cross-sectional view of FIG. 13A, when the desired depth of a recessed region 66' (or, equivalently, the desired height of the nozzle) is attained, a nozzle channel 64' is etched to only a fraction of the recessed region depth.

Figure 13B:
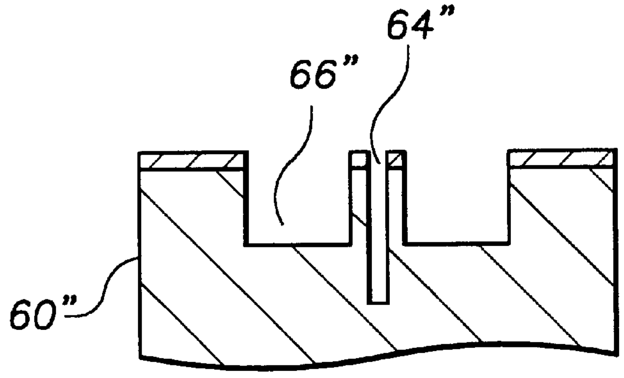
FIG. 13B shows a cross-sectional view of an etched nozzle structure with compensation for etch lag.
Figure 14:
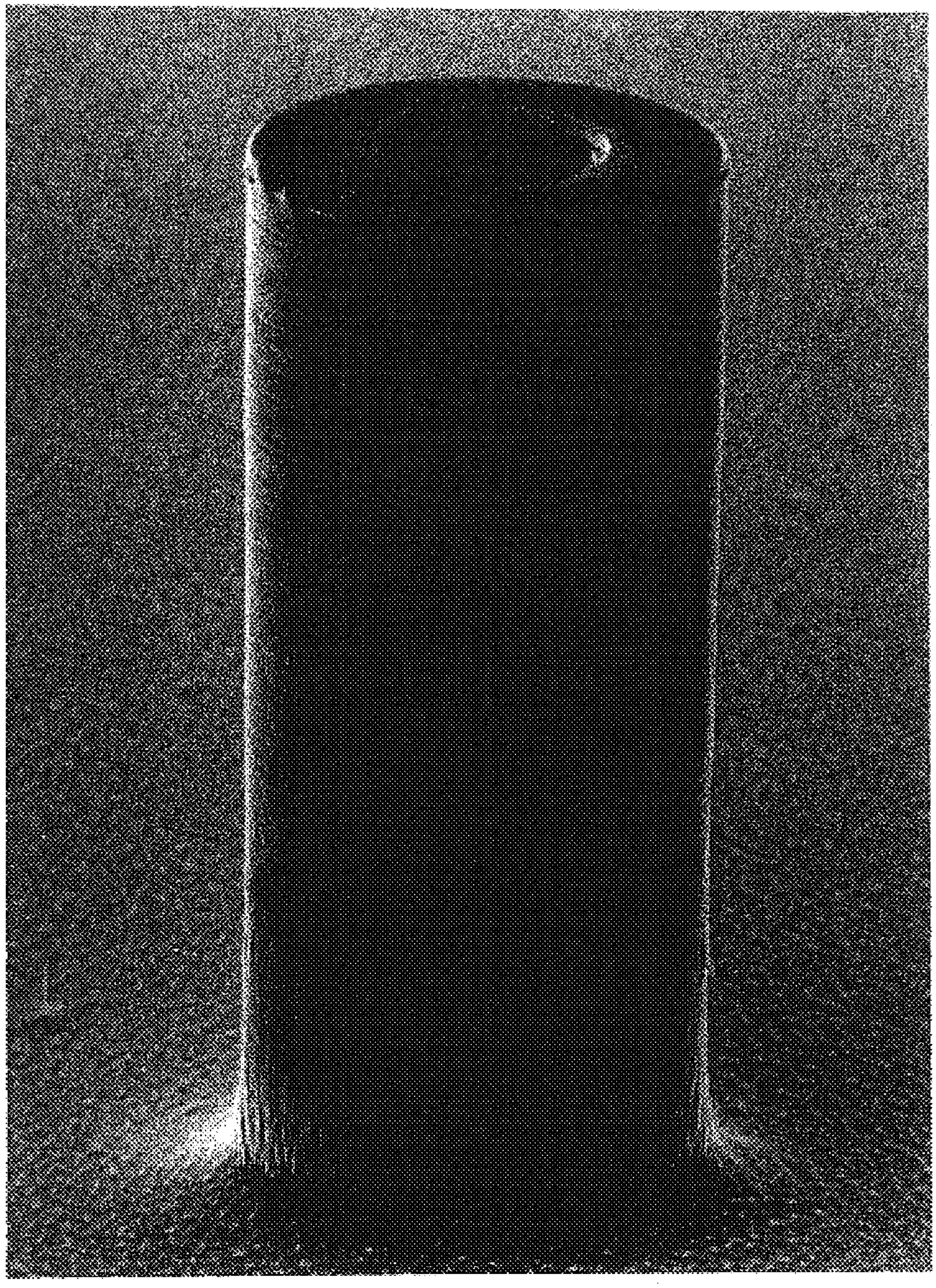
FIG. 14 shows a scanning electron micrograph of a nozzle structure fabricated using the SMILE process.

By advancing the etch of a nozzle channel 64' over a recessed region 66' according to the SMILE process, the effects of etch lag may be compensated for, thereby producing the preferred structure shown schematically in FIG. 13B. In the context of the SMILE aspect of the present invention, the nozzle channels 64, 64', 64' correspond to the first pattern and the recessed regions 66, 66', 66' to the second pattern. The scanning electron micrograph of FIG. 14 shows a nozzle structure fabricated according to the method taught herein. The desired height of the nozzle shown was attained while ensuring that the nozzle channel was etched to a sufficient depth to reach an etched region on the opposite surface of the substrate, thereby completing the required through-substrate channel.

The SMILE process is thus shown to be a highly effective means of satisfying the two requirements for two-pattern etching—namely, that the establishment of the first pattern does not impede photolithographic patterning for the second pattern, and that the final depths of the two patterns may be independently controlled.

SMILE has a significant advantage over the standard approach to etching two different patterns into a substrate. In the standard approach, one pattern would first be created by standard lithographic processing and etched to the desired depth into the silicon substrate, then a second pattern would be created and etched in the same manner. A serious shortcoming of the standard method is that the severe topography created by the first lithographic patterning and etch greatly inhibits the ability to uniformly and continuously coat photoresist for the second patterning sequence. By limiting the amount of etching prior to second-mask lithography, topographical variation is limited to the thickness of the oxide layer, preferably 1–2 $\mu$m, which presents no obstacle to uniform and continuous photoresist coating. A second shortcoming of the standard method, also overcome by the present invention, is the potentially substantial incremental amount of etching time required to create the two patterns sequentially rather than partly to mostly in parallel. By etching both patterns simultaneously, up to half the standard amount of etch time may be eliminated, thereby increasing throughput and manufacturing efficiency and consequently lowering manufacturing cost.

A further significant advantage of the SMILE process may be seen in the important context of nozzle structures and through-substrate channel formation for electrospray ionization devices. The invention provides a method by which the relative amount of etching from injection and ejection sides of the substrate may be designed independently of the desired depth of the recessed region surrounding the nozzle.

If the nozzle-side portion of the through-substrate channel is no deeper than the recessed region, the remaining part of the through-substrate channel must be, at most, equal in diameter to the nozzle-side portion and preferably smaller to allow for alignment tolerances. In the case of relatively shallow recessed regions, etch lag would prevent completion of the through-substrate channel. As an example, if the nozzle-side portion of the through-substrate channel and recessed region are 100 $\mu$m deep, the remaining 300 $\mu$m of a 400 μm-thick substrate must be etched from the injection side. At a maximum, the injection-side channel leading to a 10 μm nozzle channel would be 10 μm (and, practically, less than 10 μm to allow for misalignment). With a practical aspect ratio limit of 20:1 (vertical:horizontal etch dimensions), the deepest 10 μm hole that could be etched from the injection side would be 200 μm, leaving the intended through-substrate channel unconnected.

Figure 15:
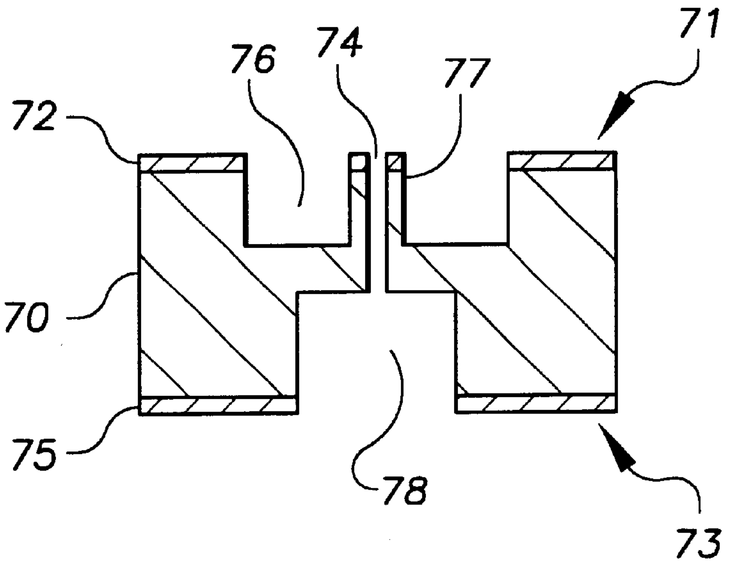
FIG. 15 shows a cross-sectional view of a nozzle and through-substrate channel fabricated using the SMILE process to overcome certain limitations on design geometries.

This limitation on design geometries may be overcome through the application of the SMILE aspect of the present invention. The critical outcome would be to extend a portion 74 of a channel through a substrate 70 on a nozzle side 71 below a bottom of a recessed region 76, as shown in FIG. 15. A patterned silicon oxide layer 72 and photoresist masking are used according to the SMILE process. Preferably, this extension of portion 74 would be at least 50 μm to allow for adequate mechanical strength of the resulting structure, but in principle could be any positive amount, limited only by aspect ratio. The significance of extending the nozzle-side channel portion 74 is that a portion 78 etched from an injection side 73 is no longer constrained to be the same or smaller diameter. The reason for this, as can be seen in the figure, is that the injection-side portion 78 no longer undercuts nozzle sidewalls 77 when it is larger in diameter than the nozzle-side channel portion 74. The injection-side channel 78 may thus be designed to be large enough to eliminate etch rate lag and aspect ratio constraints. By extending the nozzle-side 10 μm hole to a depth of 150 μm, i.e., 50 μm below the bottom of the recessed region, the through-substrate channel may be completed by etching a portion from the injection side to the depth of 250 μm, which can be achieved in a hole as small as 12.5 μm in diameter. If the injection-side etch depth is required to be limited to a lesser depth, e.g., 200 μm, in order to determine the depth of simultaneously-etched features, the nozzle-side portion may be extended to make up the difference, up to a limit dictated by aspect ratio (200 μm for a 10 μm nozzle hole). Thus, we see that the application of the invention decouples design geometries of injection and nozzle-side features while still ensuring the completion of the through-substrate channel.

Several collateral advantages may be seen to proceed from the foregoing. First, required photolithographic alignment tolerances in fabrication may be loosened, thereby directly increasing manufacturing yield. This is due to elimination of the need to align a small injection-side channel within a small inner diameter of the nozzle, in favor of aligning the nozzle channel within a much larger injection-side channel. A further consequence of the foregoing is that the nozzle channel diameter may be reduced as desired for more effective electrospray to a limit dictated by aspect ratio with no adverse impact on required alignment tolerances.

Figure 16A:
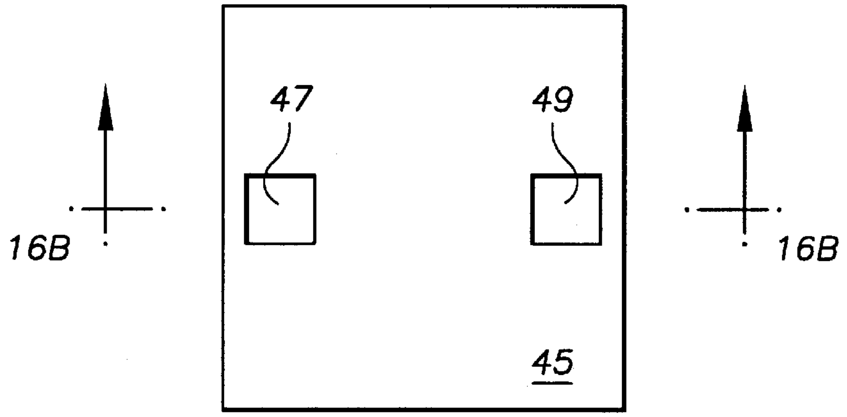
FIG. 16A shows a plan view of an alternative embodiment of the SMILE process sequence to independently control etch depths of three patterns.
Figure 16B:
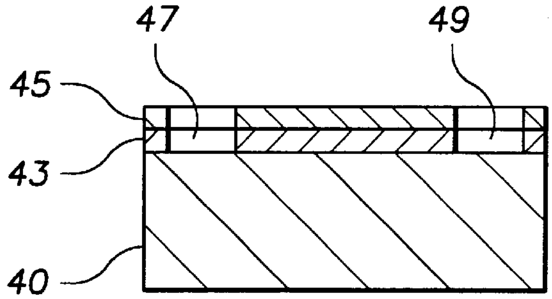
FIG. 16B shows a cross-section a l view of an alternative embodiment of the SMILE process sequence to independently control etch depths of three patterns.
Figure 16C:
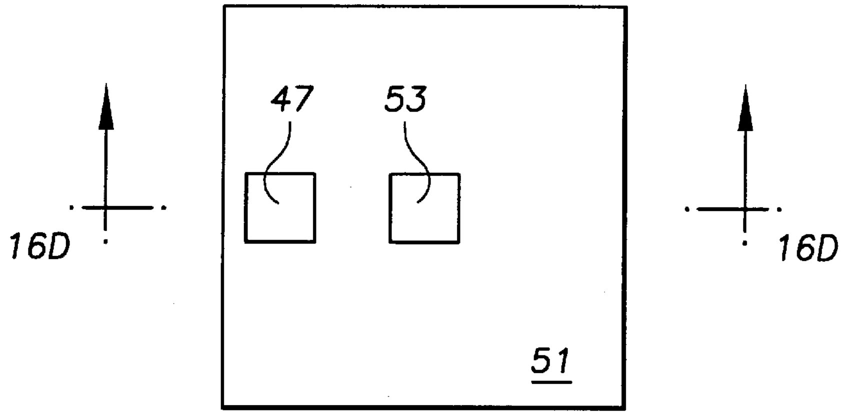
FIG. 16C shows a plan view of an alternative embodiment of the SMILE process sequence to independently control etch depths of three patterns.
Figure 16D:
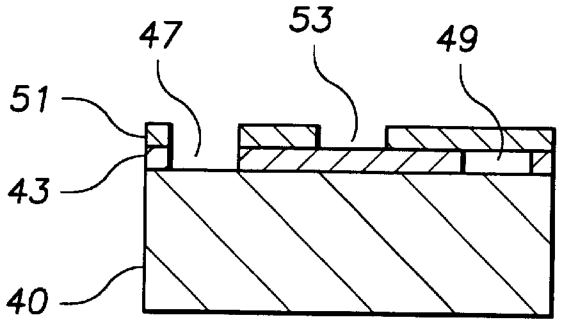
FIG. 16D shows a cross-sectional view of an alternative embodiment of the SMILE process sequence to independently control etch depths of three patterns.

An alternative embodiment of the SMILE method may be used to independently control the etch depths of three patterns. The process sequence for three patterns is depicted in FIGS. 16A–16I. Referring to the plan and cross-sectional views of FIGS. 16A and 16B, respectively, a required oxide layer 43 on a substrate 40 is created at an earlier stage in the device fabrication sequence. A photoresist layer 45 is deposited uniformly on the oxide layer 43, then photolithographic processing is used to expose and remove photoresist from certain areas 47, 49 corresponding to a first and a second pattern, respectively. The resulting patterns in the photoresist layer 45 are then transferred to the underlying oxide layer 43 by either dry or wet etching the oxide until reaching the silicon substrate 40. Dry (plasma) etching of the oxide will provide tighter dimensional control and an ability to create smaller features than wet etching. A silicon etch is not done at this stage. Rather, as shown in FIGS. 16C and 16D, the photoresist 45 is removed, after which a new photoresist layer 51 is coated. The photoresist layer 51 is exposed and developed to open certain areas 47, 53 that correspond to first and third patterns, respectively. After the photolithographic processing step, the area 47 is open to the silicon substrate 40, and the area 53 is open to the silicon oxide layer 43. Note that area 49 (the second pattern) remains protected by the photoresist layer 51.

Figure 16E:
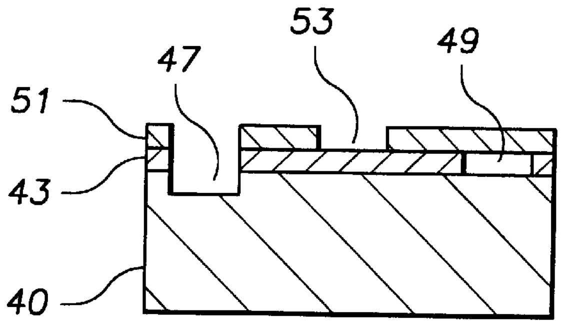
FIG. 16E shows a cross-sectional view of an alternative embodiment of the SMILE process sequence to independently control etch depths of three patterns.
Figure 16F:
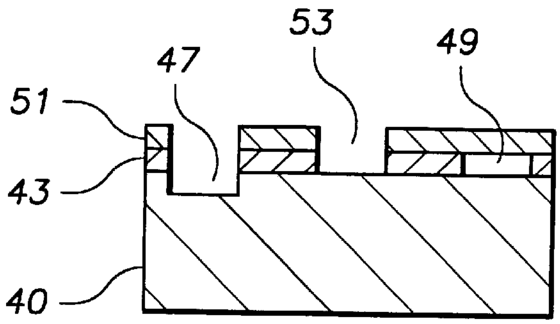
FIG. 16F shows a cross-sectional view of an alternative embodiment of the SMILE process sequence to independently control etch depths of three patterns.
Figure 16G:
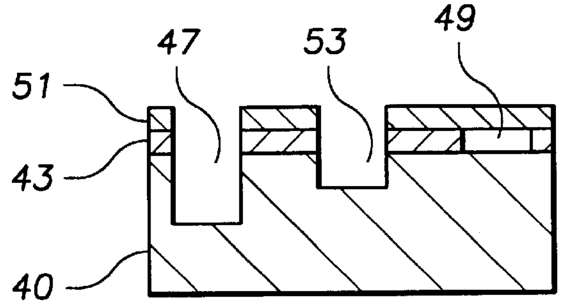
FIG. 16G shows a cross-sectional view of an alternative embodiment of the SMILE process sequence to independently control etch depths of three patterns.

Referring to FIG. 16E, a silicon etch is then performed into the substrate 40 using the photoresist 51 and oxide 43 masks, thus beginning the etch of area 47, corresponding to the first pattern, into the silicon substrate 40. Due to its being masked by the oxide 43, the area 53, corresponding to the third pattern, is not etched into the silicon substrate 40 at the same time. This gives the first pattern an advance over the third pattern. The silicon etch is stopped when the desired depth has been attained in the area 47, as determined by measurement and/or calculation relying on etch rate (allowing for etch rate lag). As shown in FIG. 16F, the remaining photoresist mask 51 is then used to mask an oxide etch, transferring the third pattern to the oxide layer 43 and creating openings 53 in the oxide layer 43 to the underlying silicon substrate 40 corresponding to the third pattern. The area 47 is unaffected during the oxide etch. The combined remaining photoresist 51 and oxide 43 masks are then used to mask a second silicon etch to the desired depth of the first pattern and third pattern, with etching proceeding simultaneously in both areas 47, 53 (FIG. 16G).

Figure 16H:
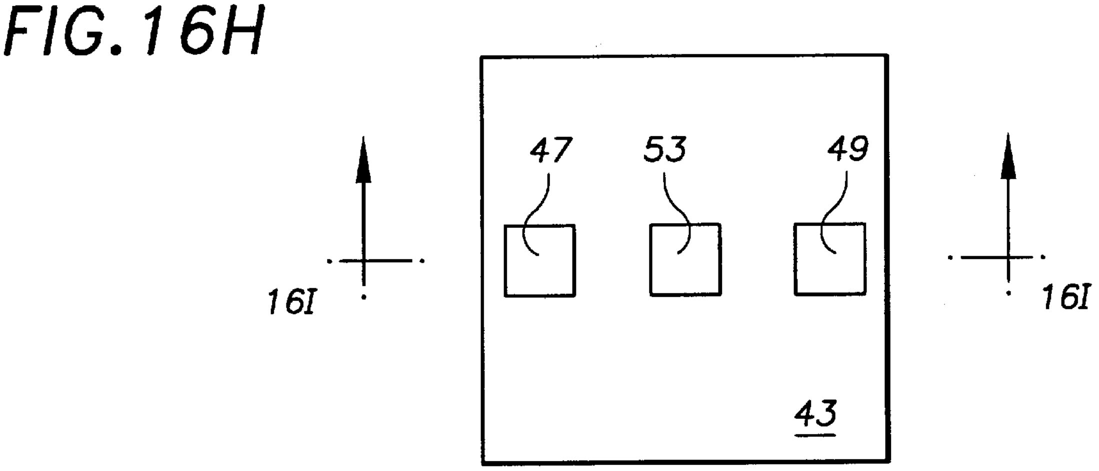
FIG. 16H shows a plan view of an alternative embodiment of the SMILE process sequence to independently control etch depths of three patterns.
Figure 16I:
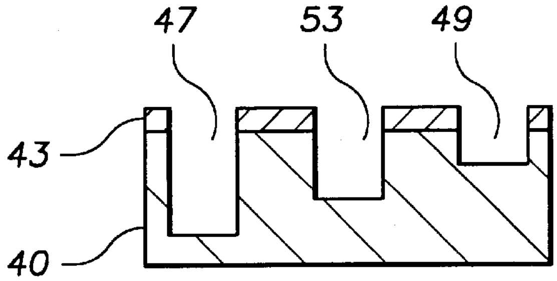
FIG. 16I shows a cross-sectional view of an alternative embodiment of the SMILE process sequence to independently control etch depths of three patterns.
Figure 17:
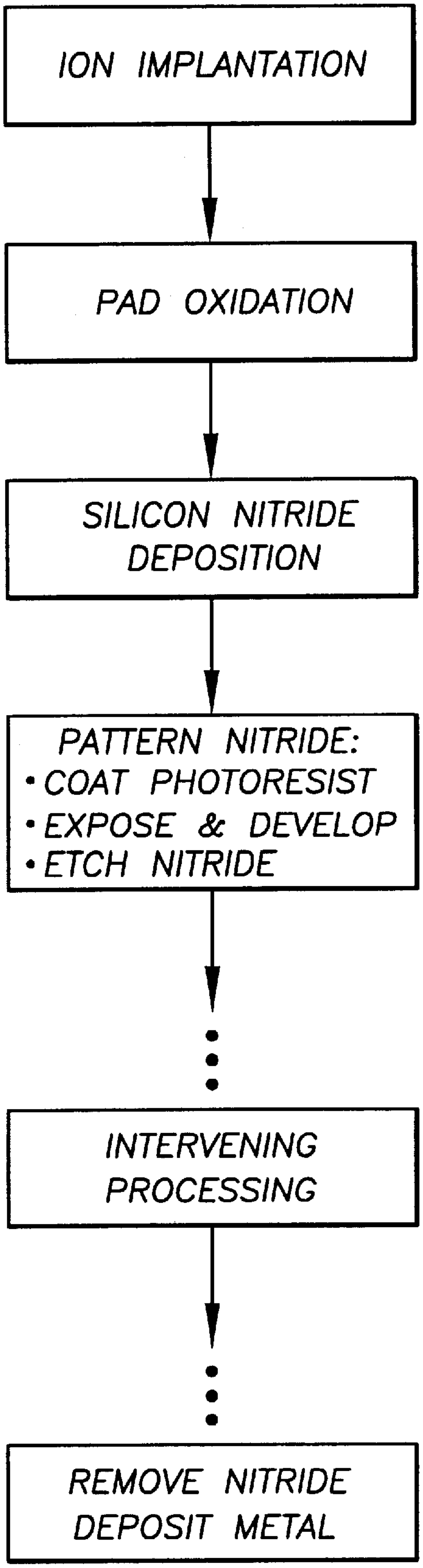
FIG. 17 shows the delayed LOCOS block process sequence.
Figure 18:
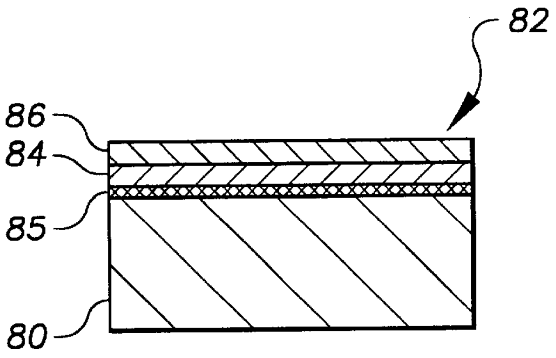
FIG. 18 shows a cross-sectional view of the initial steps of the delayed LOCOS process.

The remaining photoresist 51 is then removed to expose area 49, corresponding to the second pattern, that was etched earlier through the oxide layer 43 to the underlying silicon substrate 40. The oxide mask 43 is then used to mask a third silicon etch simultaneously in areas 47, 49, 53 to the desired depth of the first, second, and third patterns, respectively (FIGS. 16H and 16I).

The foregoing alternative embodiment of the SMILE process is a highly effective method of satisfying the principal requirements for three-pattern etching—namely, that the establishment of the first pattern does not impede photolithographic patterning for the second or third patterns, that the establishment of the second pattern does not impede photolithographic patterning for the third pattern, and that the final depths of the three patterns may be independently controlled. All advantages attributable to the SMILE process in the preferred embodiment also pertain to the foregoing alternative embodiment.

LOCOS

A third aspect of the present invention provides an improved method for the formation of an electrical contact to a substrate. The purpose of the contact is to provide a method of fixing or modulating the electrical potential of the substrate. The difficulty inherent in forming an electrical contact to the substrate at a later stage of the overall process arises primarily from the presence of severe topography. The topography, in the form of previously defined features, makes it very difficult to successfully coat photoresist uniformly and continuously. It is particularly difficult to ensure photoresist coverage and protection of isolated structures surrounded by etched, recessed regions. In order to ensure high manufacturing yield, an alternative means of providing electrical contact to the substrate is required.

The essential element of this aspect of the present invention is the modification of a <u>LOC</u>al <u>O</u>xidation of <u>S</u>ilicon (LOCOS) process to allow the definition and delayed opening of contact(s) to the substrate. LOCOS has been routinely used in integrated circuit design and manufacturing to create electrically isolated regions on a silicon chip.

Figure 19:
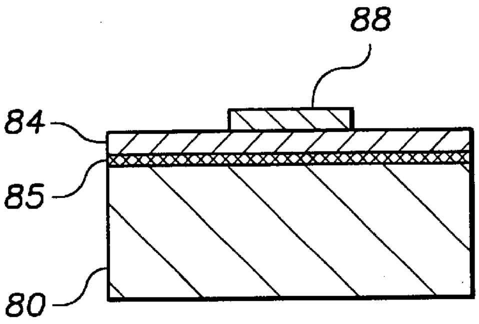
FIG. 19 shows a cross-sectional view of the initial steps of the delayed LOCOS process.

The delayed LOCOS process sequence is shown schematically in FIG. 17, and FIGS. 18–22C show cross-sectional views of the progression of process steps. In the preferred embodiment of the invention, an entire surface 82 of a substrate 80 is heavily implanted with the same type of dopant species as the substrate itself (i.e., n-type or p-type) to form an implanted region 85 and to thereby ensure a non-rectifying contact between the substrate 80 and metal deposited at the time of contact formation. A pad oxide 84 of 10–20 nm is then grown, as in standard LOCOS. A film of silicon nitride 86 is then deposited, e.g., by low-pressure chemical vapor deposition (LPCVD) or plasma-enhanced chemical vapor deposition (PECVD). Referring to FIG. 19, after deposition, the nitride layer 86 is patterned by lithography and etching to leave patterns of silicon nitride 88 where contacts will ultimately be formed. In a standard LOCOS process, the nitride etch would be followed immediately by a thick field oxidation, then by removal of the nitride to expose active areas that are electrically isolated from their lateral neighbors.

Figure 20:
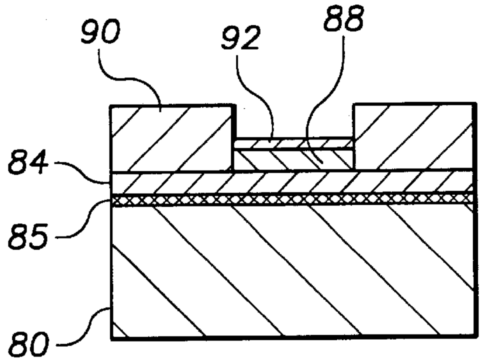
FIG. 20 shows a cross-sectional view of the initial steps of the delayed LOCOS process.
Figure 21:
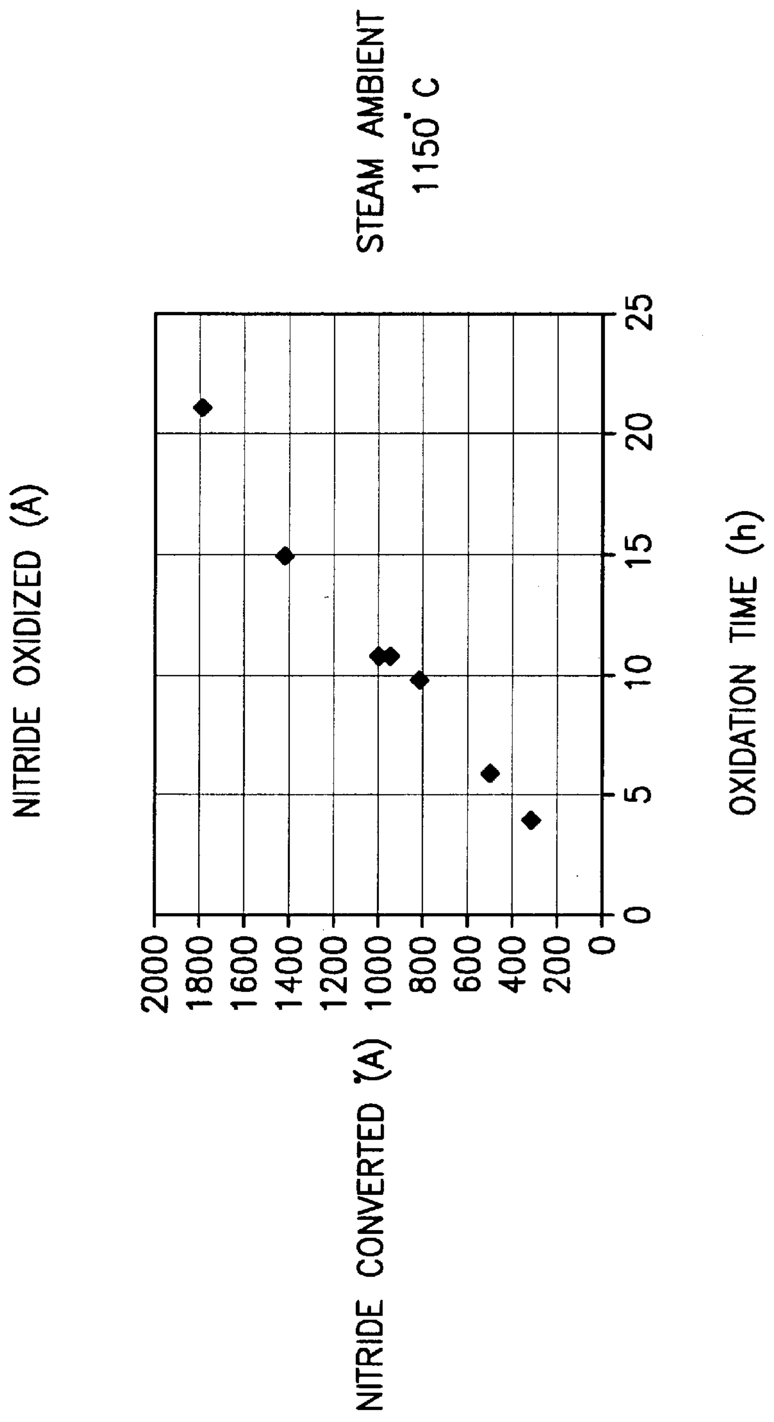
FIG. 21 shows data relating to the oxidation of silicon nitride.

At this stage of the delayed LOCOS process, however, the focus of processing shifts to other structures and objectives. While the intervening process steps are executed, the patterns of silicon nitride 88 continue to define and protect the intended contact areas. During oxidation steps, for example, oxidation is suppressed under the silicon nitride, as shown in FIG. 20, while growing in adjacent regions 90. The silicon nitride itself oxidizes to form a thin oxide layer 92 under such conditions as are used to oxidize silicon, and care must be taken to ensure that enough silicon nitride 86 is deposited to last through all subsequent oxidations. The data of FIG. 21 show the amount of nitride oxidized for various times of oxidation. In order to complete contact formation, the silicon nitride, as well as any small amount of silicon oxide 92 formed from silicon nitride during oxidations and the original pad oxide 84, is etched until the underlying silicon substrate 80 is reached.

Figure 22A:
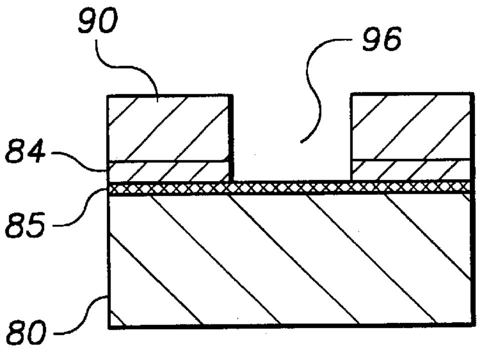
FIG. 22A shows a cross-sectional view of an alternative method for silicon nitride removal to open contact holes.
Figure 22B:
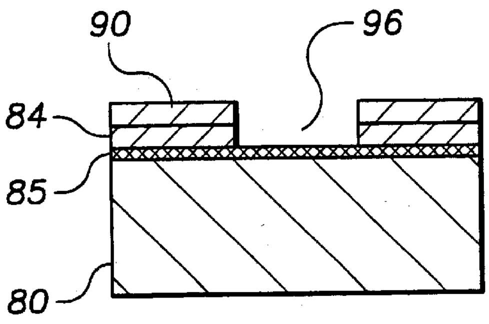
FIG. 22B shows a cross-sectional view of an alternative method for silicon nitride removal to open contact holes.
Figure 22C:
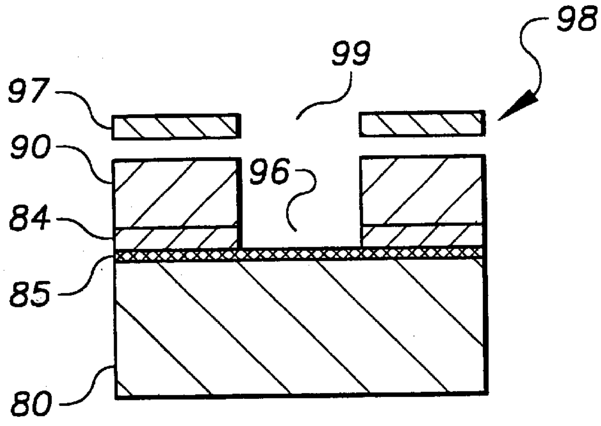
FIG. 22C shows a cross-sectional view of an alternative method for silicon nitride removal to open contact holes.

Removal of silicon nitride to open contact holes 96 to the substrate 80 may be done in several ways, as shown in FIGS. 22A–22C. In one method (FIG. 22A), the silicon nitride 88 may be removed by wet etching in hot phosphoric acid, an etch that will remove nitride strongly preferentially to oxide. If this method is used, however, it is essential that any oxide 92 on nitride be first removed by dry or wet etching. The pad oxide 84 must also be removed by dry or wet etching after removal of nitride 88. In a second method (FIG. 22B), a blanket, i.e., unmasked, etch may be done by reactive-ion etching to remove the nitride 88 in the contact areas, as well as the grown oxide 92 and the underlying pad oxide 84. This method removes more of the adjacent oxide 90 than the first method. In a third method (FIG. 22C), a shadow mask 98, i.e., a substrate 97 with holes 99 provided in the same pattern as the pattern of contacts, may be used to mask a reactive-ion etch of the grown oxide 92, the nitride 88 and underlying oxide 84. After opening the contact hole(s) by one of the methods of FIGS. 22A–22C, a metal, preferably aluminum, is deposited and subsequently patterned in another lithographic sequence to define interconnecting wires on the chip.

In an alternative embodiment, the heavy ion implantation may be done directly into the contact hole after removal of the nitride contact pattern, prior to metallization, rather than at the beginning of the process.

The delayed LOCOS process has several advantages over the standard contact formation sequence. First, the definition of the contact area is done early in the overall process, thereby avoiding the need for conducting lithography on a surface with severe topography. Second, the use of this approach significantly reduces the amount of etching required to open the contact to the substrate, since a substantially thinner film must be etched to open the contact. This is a consequence of the silicon nitride not oxidizing to the same extent as non-contact areas during process steps between nitride patterning and nitride removal to open contacts. Thus, a blanket etch may be performed to open the contact areas while still having the required oxide film everywhere else. A third advantage is that the nitride is removed immediately before metallization, thus guaranteeing a clean, undamaged metal/silicon interface.

Figure 23:
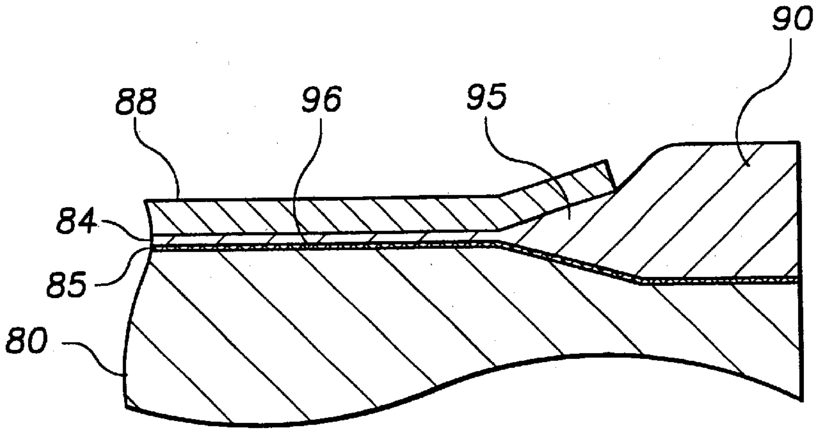
FIG. 23 shows a cross-sectional view of the bird's beak region at the edge of a contact hole.

A fourth advantage of the delayed LOCOS process has to do with the shape of the transition region from the bottom of an opened contact hole to the surrounding oxide region. A well-known collateral outcome of a LOCOS sequence is the formation of the so-called “bird’s beak”. Shown in FIG. 23 in close-up view at one edge of the nitride island 88, is a lateral extension 95 (bird’s beak) of the field oxide region 90 under a small edge portion of the silicon nitride 88 which occurs as a result of diffusing oxidizing species during the high-temperature field oxidation. The consequence of this lateral extension 95 is that, after removal of the nitride 88, the oxide film transitions smoothly and gradually from the contact area 96 to the surrounding thick isolation region 90. This is an advantage because of the necessity of subsequently depositing a film of metal, typically aluminum, uniformly and without discontinuities, because, whereas an abrupt vertical step is extremely difficult to cover without discontinuities, a gradual transition such as that produced by the LOCOS process is easily covered by either evaporative or sputtering methods of metal deposition.

The delayed LOCOS aspect of the present invention may be viewed as an extension or another embodiment of the latent masking aspect. The essential element of the latent masking aspect is to create a mask, or pattern, that is held abeyant rather than being immediately used to mask an etch as would customarily be done. The mask, preferably a silicon oxide mask in the present invention, persists during intervening process steps until it is finally used to mask an etch into the silicon substrate. Similarly, the delayed LOCOS process creates a pattern, preferably in silicon nitride in the present invention, that is held abeyant during subsequent processing until it is removed to provide access to the underlying substrate. Thus it is seen that both aspects provide a pattern that is ultimately used after an interval of process steps during which it remains inert—its ultimate use being, in one aspect, to act as a mask for an etch; in the other aspect, to act as a mask during several oxidations.

Improved Integrated Liquid Chromatography(LC)/Electrospray Ionization (ESI) Device Fabrication Procedure The fourth aspect of the present invention, the fabrication of an integrated LC/ESI device, is explained with reference to FIGS. 24–48B. A process to fabricate an integrated LC/ESI device is shown in block form in FIG. 24. The process flow shown omits standard but important steps such as cleaning, and is intended only to show the interrelationships of the three fundamental aspects of the present invention and the integrated process sequence. It will be apparent to a skilled practitioner of the art that subtle changes may be made in the detailed process without materially affecting the function and form of the resulting device. As one example, the insertion or deletion of a wafer cleaning step may have a measurable impact on manufacturing yield, but will have no influence on the form, appearance, or function of a successfully yielding device.

Figure 24:
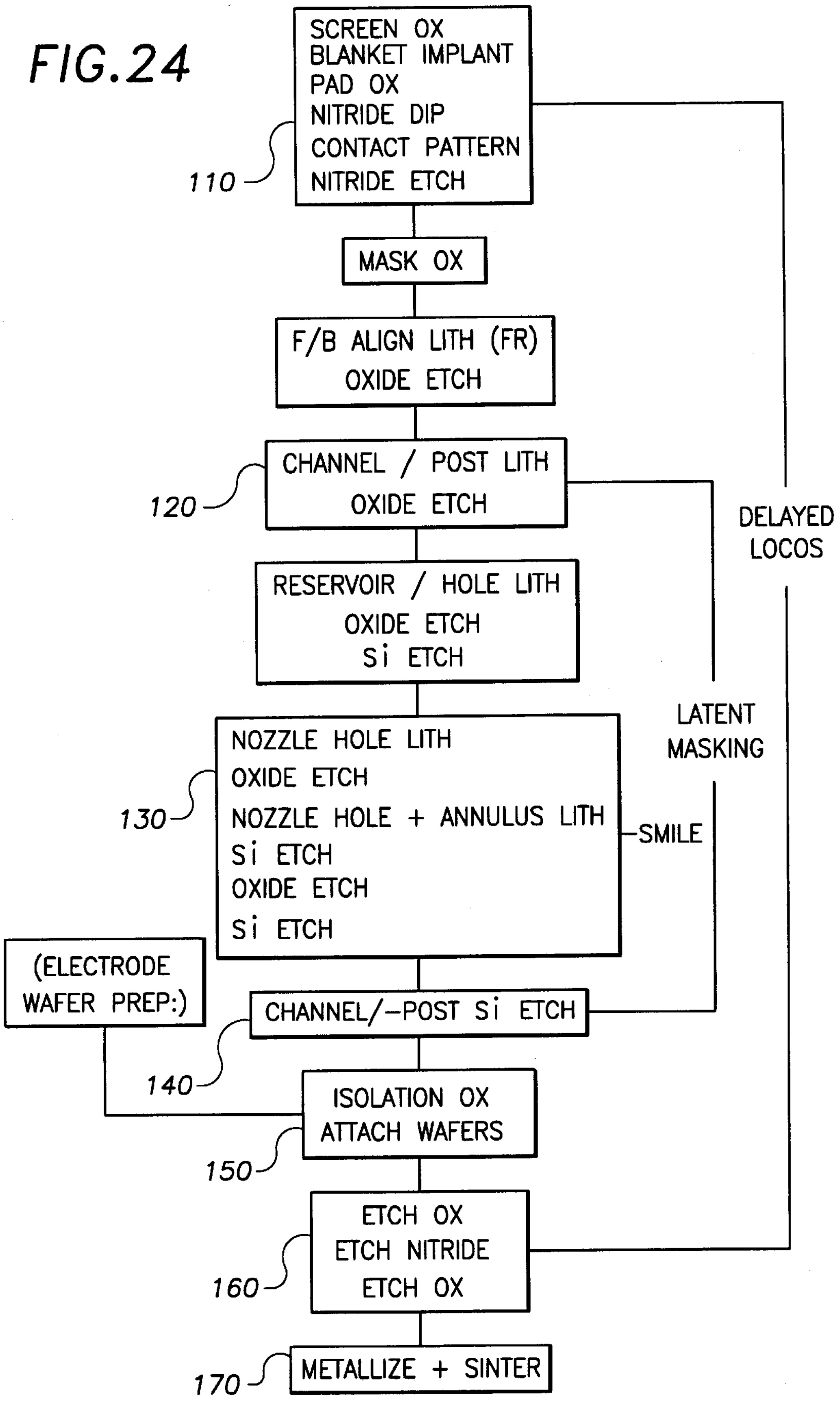
FIG. 24 shows a block process sequence for fabricating an integrated LC/ESI device.

The block process shown in FIG. 24 incorporates the three fundamental aspects of the present invention. The outcome of this particular process sequence is an integrated LC/ESI device 100 (FIGS. 25A–25C) in which a fluid reservoir 438 is filled through an introduction orifice 457 on an ejection side 403 of the device 100 (the same surface as that on which a substrate contact 409, nozzle 472, and recessed region 474 are formed), and through an introduction channel 468 extending between the introduction orifice 457 and the fluid reservoir 438; in which a liquid chromatographic separation is performed in a separation channel 478 populated with a plurality of separation posts 482 and extending between the fluid reservoir 438 and a separation channel terminus 480; and in which fluid exiting the separation channel 478 via the separation channel terminus 480 flows through a nozzle channel 442 where the fluid is electrosprayed in a direction generally perpendicular to the ejection surface 403 from a nozzle 472 on the ejection surface 403. All surfaces of the LC/ESI device preferably have a layer of silicon oxide 484 to electrically isolate the liquid sample from the substrate 400 and to provide for biocompatibility.

The three fundamental aspects of the present invention are incorporated in the integrated fabrication sequence in the manner shown in FIG. 24. After any preparatory processing, the nitride deposition and patterning steps for the delayed LOCOS process are performed at 110. Next, the channel and separation posts are patterned according to the latent masking process at 120. After patterning and etching of fluid reservoirs and part of the introduction and nozzle channels on the separation surface of the substrate, processing continues on the ejection surface according to the SMILE process at 130. The fluid reservoirs are optionally patterned at the same time as the channel and separation posts instead of with the introduction and nozzle channels. The delayed channel/post etch using the latent mask is then performed on the separation surface at 140, after which the substrate is attached or bonded to the second substrate at 150. Finally, the delayed LOCOS process is completed by opening the required contact hole at 160, followed by metallization at 170.

The fabrication of the LC/ESI device 100 (FIGS. 25A–25C) using the fundamental aspects of the present invention will now be explained with reference to FIGS. 26A–48B. The integrated process utilizes established, well-controlled thin-film silicon processing techniques such as thermal oxidation, photolithography, reaction-ion etching (RIE), ion implantation, and metal deposition. Fabrication using such silicon processing techniques facilitates massively parallel processing of similar devices, is time-efficient and cost-efficient, allows for tighter control of critical dimensions, is easily reproducible, and results in a wholly integral device, thereby eliminating any assembly requirements. Further, the fabrication sequence is easily extended to create physical aspects or features on the ejection surface of the LC/ESI device to facilitate interfacing and connection to a fluid delivery system or to facilitate integration with a fluid delivery sub-system to create a single integrated system.

Ejection Surface Processing: Contact Pattern Definition (Delayed LOCOS)

Figure 25A:
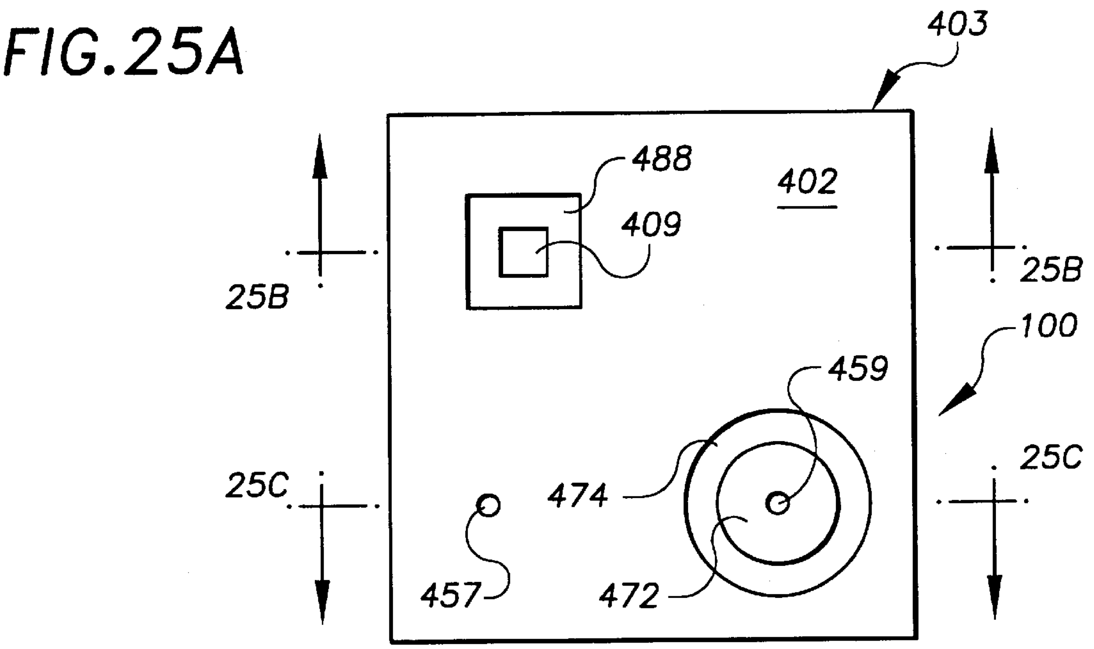
FIG. 25A shows a plan view of a completed LC/ESI device.
Figure 25B:
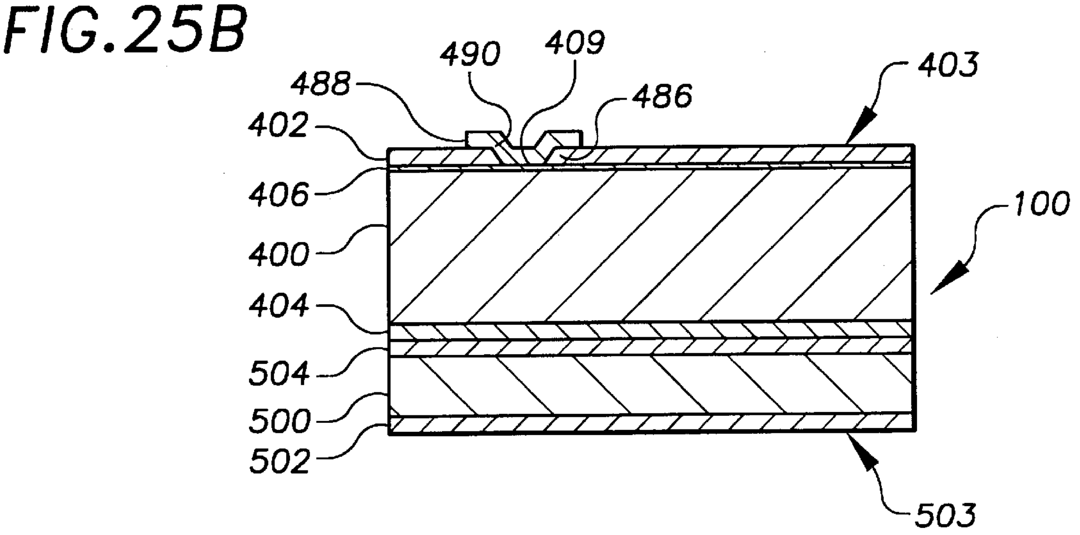
FIG. 25B shows a cross-sectional view of a completed LC/ESI device.
Figure 25C:
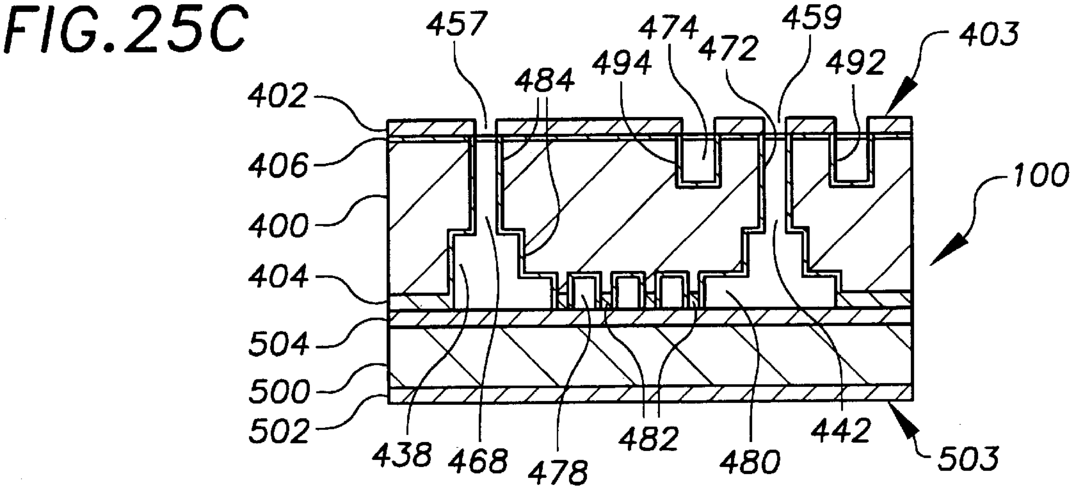
FIG. 25C shows a cross-sectional view of a completed LC/ESI device.
Figure 26A:
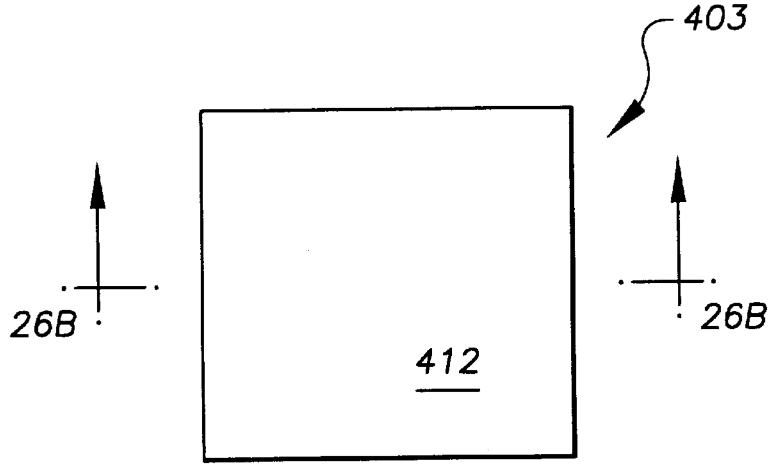
FIG. 26A shows a plan view of the initial process steps relating to the delayed LOCOS aspect of the invention, as part of a fabrication sequence for an integrated LC/ESI device.
Figure 26B:
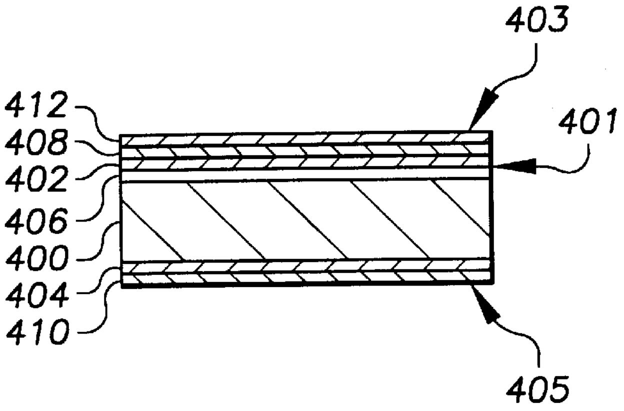
FIG. 26B shows a cross-sectional view of the initial process steps relating to the delayed LOCOS aspect of the invention, as part of a fabrication sequence for an integrated LC/ESI device.

FIGS. 26A and 26B illustrate the initial processing steps for the ejection side of the first substrate in fabricating the LC/ESI device 100 (FIGS. 25A–25C). A double-side-polished silicon wafer substrate 400 is subjected to an elevated temperature in an oxidizing ambient to grow a layer or film of silicon oxide 402 on an ejection side 403 and a layer or film of silicon oxide 404 on a separation side 405 of the substrate 400. Each of the resulting silicon oxide layers 402, 404 has a thickness of approximately 10–20 nm. The silicon oxide layer 402 provides some protection to the surface of the silicon substrate 400 at a silicon/silicon oxide interface 401.

A high-dose implantation is made through the silicon oxide layer 402 to form an implanted region 406 to ensure a low-resistance electrical connection between an electrode that will be formed at a later stage of the process and the substrate 400. If the starting substrate 400 is acceptor-doped (i.e., p-type), the high-dose implantation is done with a p-type species such as boron, resulting in a p+ implanted region 406. If the starting substrate 400 is donor-doped (i.e., n-type), the high-dose implantation is done with an n-type species such as arsenic or phosphorus, resulting in an n+ implanted region 406.

A layer or film of silicon nitride 408 is deposited on the silicon oxide layer 402 on the ejection side 403 of the substrate 400. Deposition of the silicon nitride layer 408 is done in the preferred embodiment by low-pressure chemical vapor deposition (LPCVD), which also deposits a layer of silicon nitride 410 on the separation side 405 of the substrate 400. Each of the resulting silicon nitride layers 408, 410 has a thickness of approximately 150–200 nm. Deposition of the silicon nitride layer 408 may be done by plasma-enhanced chemical vapor deposition (PECVD) in an alternative embodiment.

Figure 26C:
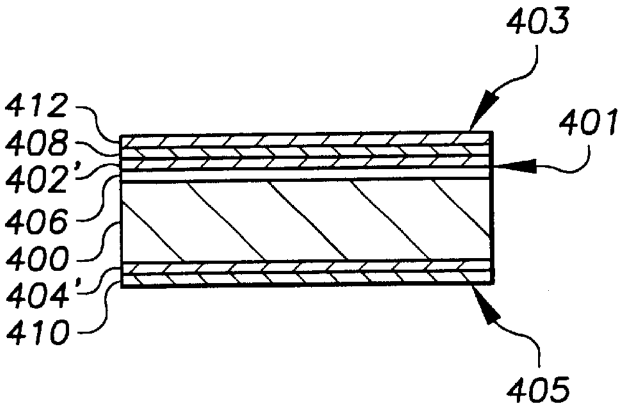
FIG. 26C shows a cross-sectional view of the initial process steps relating to the delayed LOCOS aspect of the invention, as part of a fabrication sequence for an integrated LC/ESI device.

In an alternative embodiment shown in the cross-sectional view of FIG. 26C, the silicon oxide layer 402 may be removed after the high-dose implantation, the silicon oxide layer 402 having presumptively been damaged by the implantation. Removal would preferably be accomplished by immersion in hydrofluoric acid (HF) or a buffered solution of HF. Silicon oxide layer 404 would be simultaneously removed. After removal, new silicon oxide layers 402', 404' would then be re-grown to a thickness of 10–20 nm by subjecting the substrate 400 to an elevated temperature in an oxidizing ambient.

Referring again to FIGS. 26A and 26B, a film of positive-working photoresist 412 is deposited on the silicon nitride layer 408 on the ejection side 403 of the substrate 400. All areas of the photoresist 412 exclusive of a contact area that will be protected by silicon nitride until ultimately being opened to form a contact to the substrate 400 are selectively exposed through a mask by an optical lithographic exposure tool.

Figure 27A:
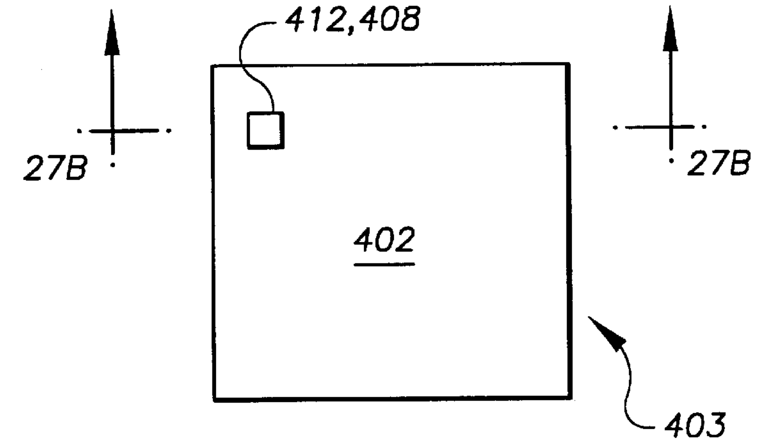
FIG. 27A shows a plan view of the initial process steps relating to the delayed LOCOS aspect of the invention, as part of a fabrication sequence for an integrated LC/ESI device.
Figure 27B:
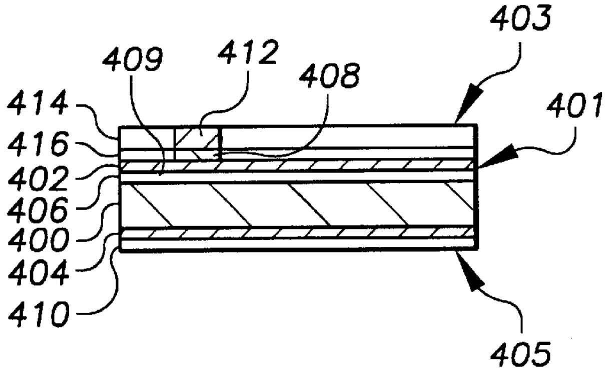
FIG. 27B shows a cross-sectional view of the initial process steps relating to the delayed LOCOS aspect of the invention, as part of a fabrication sequence for an integrated LC/ESI device.

Referring to the plan and cross-sectional views, respectively, of FIGS. 27A and 27B, after development of the photoresist 412, the exposed area 414 of the photoresist is removed and open to the underlying silicon nitride layer 408, while the unexposed areas remain protected by photoresist 412. The exposed area 416 of the silicon nitride layer 408 is then etched by a fluorine-based plasma with a high degree of anisotropy and selectivity to the protective photoresist 412 until the silicon oxide layer 402 is reached. Next, the entire layer of silicon nitride 410 on the separation side 405 of the substrate 400 is etched by a fluorine-based plasma until the silicon oxide layer 404 is reached. Any remaining photoresist 412 on the ejection side 403 of the substrate 400 is then removed in an oxygen plasma or in an actively oxidizing chemical bath such as sulfuric acid ($H_2SO_4$) activated with hydrogen peroxide ($H_2O_2$).

This completes the first set of process steps for the delayed LOCOS aspect of the present invention. The area of the silicon substrate 400 directly below the patterned silicon nitride layer 408 will ultimately become a contact area 409 to the substrate 400 when the nitride layer 408 is removed prior to metallization.

Oxidation for Masked Silicon Etching

Figure 28:
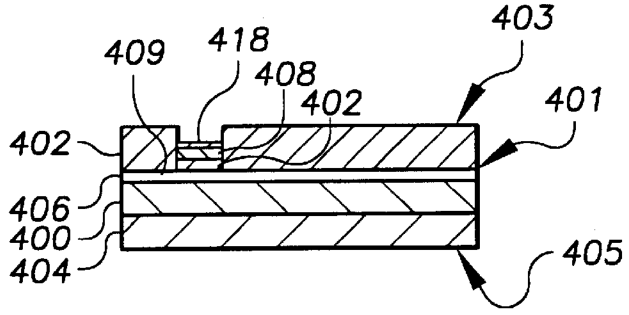
FIG. 28 shows a cross-sectional view of further process steps in the fabrication of an integrated LC/ESI device.

Referring to FIG. 28, the silicon oxide layer 402 is made thicker on the ejection side 403 of the substrate 400 by subjecting the silicon substrate 400 to elevated temperature in an oxidizing ambient. The silicon oxide layer 404 is also made thicker on the separation side 405 of the substrate 400 at the same time by the same method. For example, the oxidizing ambient may be an ultra-pure steam produced by oxidation of hydrogen for a silicon oxide thickness greater than approximately several hundred to several thousand nanometers, or pure oxygen for a silicon oxide thickness of approximately several hundred nanometers or less. In the preferred embodiment, the silicon oxide layers 402, 404 are increased in thickness to 150–200 nm. The layers of silicon oxide 402, 404 provide electrical isolation and also serve as masks for subsequent selective etching of certain areas of the silicon substrate 400. As a result of the oxidation of a small amount of the silicon nitride layer 408 on the ejection side 403 of the substrate 400, a thin silicon oxide layer 418 is formed on the silicon nitride layer 408.

Separation Surface Processing: Alignment to Ejection Surface

Figure 29:
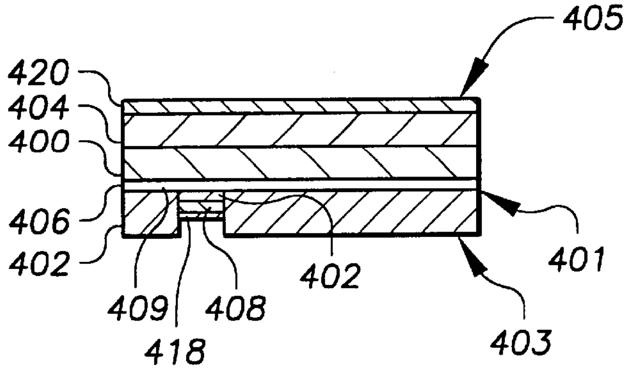
FIG. 29 shows a cross-sectional view of further process steps in the fabrication of an integrated LC/ESI device.
Figure 30A:
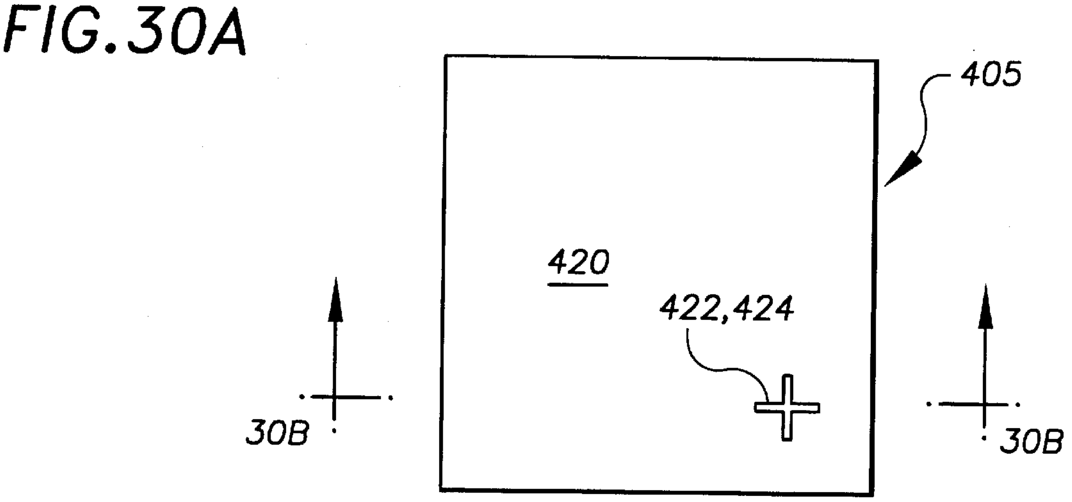
FIG. 30A shows a plan view of further process steps in the fabrication of an integrated LC/ESI device.
Figure 30B:
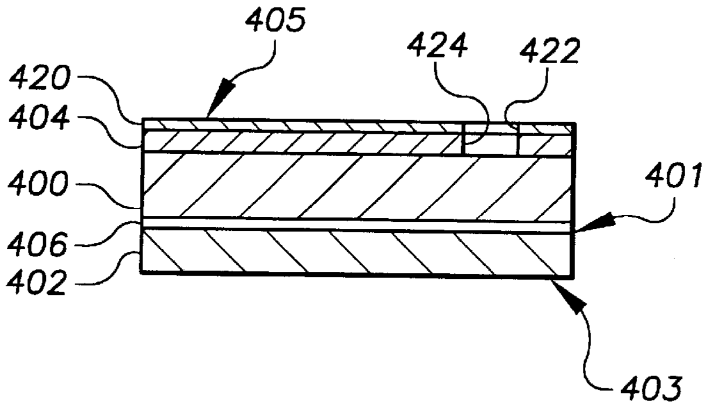
FIG. 30B shows a cross-sectional view of further process steps in the fabrication of an integrated LC/ESI device.
Figure 31:
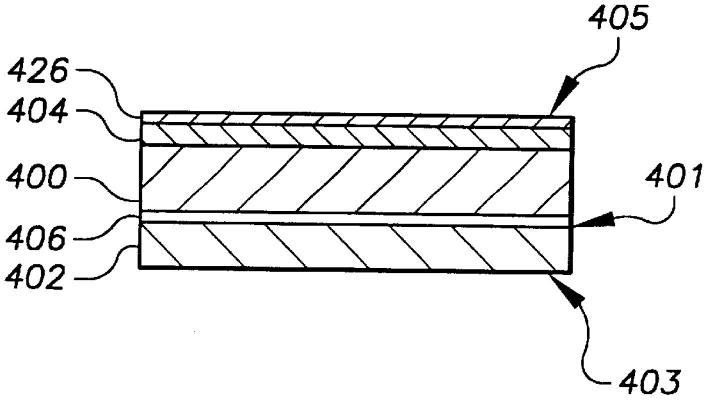
FIG. 31 shows a cross-sectional view of process steps relating to the definition of an oxide mask for latent masking in the fabrication of an integrated LC/ESI device.

As shown in the cross-sectional view in FIG. 29 (shown inverted from FIG. 28), a film of positive-working photoresist 420 is deposited on the silicon oxide layer 404 on the separation side 405 of the substrate 400. Patterns on the separation side 405 are aligned to those previously formed on the ejection side 403 of the substrate 400. Because silicon and its oxide are inherently relatively transparent to light in the infrared wavelength range of the electromagnetic spectrum, i.e., approximately 700–1000 nm, the extant pattern on the ejection side 403 can be distinguished with sufficient clarity by illuminating the substrate 400 from the patterned ejection side 403 with infrared light. Thus, the photolithographic mask for the separation side 405 can be aligned within required tolerances.

After alignment, certain areas of the photoresist 420 corresponding to alignment keys are selectively exposed through the separation-side lithographic mask by an optical lithographic exposure tool. As shown in the plan and cross-sectional views, respectively, of FIGS. 30A and 30B, the photoresist 420 is then developed to remove the exposed areas of the photoresist 422 such that an alignment key pattern is open to the underlying silicon oxide layer 404 while the unexposed areas remain protected by photoresist 420. The exposed area 424 of the silicon oxide layer 404 is then etched by a fluorine-based plasma with a high degree of anisotropy and selectivity to the protective photoresist 420 until the silicon substrate 400 is reached. The remaining photoresist 420 is then removed in an oxygen plasma or in an actively oxidizing chemical bath such as sulfuric acid ($H_2SO_4$) activated with hydrogen peroxide ($H_2O_2$).

Separation Surface Processing: Latent Mask Definition

A latent mask for eventual use in fabricating separation posts and channels is now defined. As shown in the cross-sectional view of FIG. 31, a film of positive-working photoresist 426 is deposited on the silicon oxide layer 404 on the separation surface 405 of the substrate 400. After alignment, certain areas of the photoresist film 426 corresponding to a reservoir, separation channel separation posts, and separation channel terminus that will be subsequently etched are selectively exposed through a lithographic mask by an optical lithographic exposure tool.

Figure 32A:
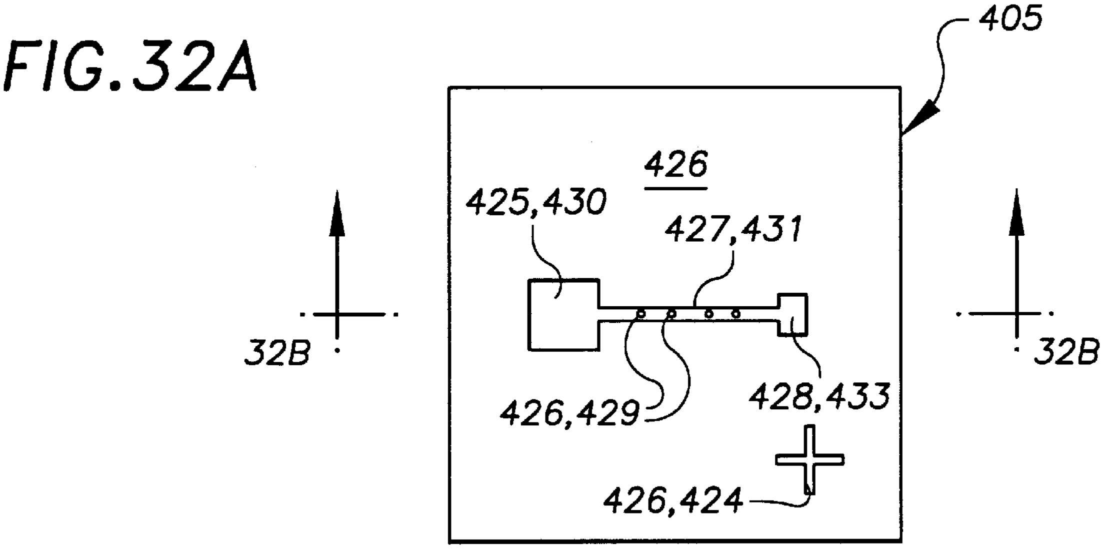
FIG. 32A shows a plan view of process steps relating to the definition of an oxide mask for latent masking in the fabrication of an integrated LC/ESI device.
Figure 32B:
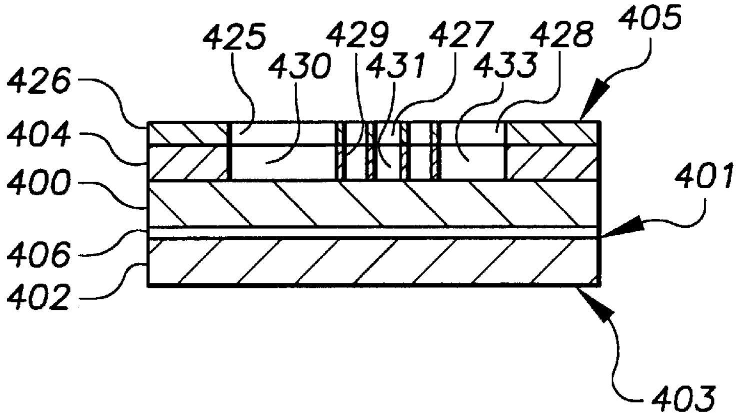
FIG. 32B shows a cross-sectional view of process steps relating to the definition of an oxide mask for latent masking in the fabrication of an integrated LC/ESI device.

Referring to the plan and cross-sectional views, respectively, of FIGS. 32A and 32B, after development of the photoresist 426 the exposed areas 425, 427, 428 of the photoresist corresponding to the reservoir, separation channel, and separation channel terminus, respectively, are removed and open to the underlying silicon oxide layer 404, while the unexposed areas remain protected by photoresist 426. The protected areas 429 of the silicon oxide layer 404 correspond to the pattern of separation posts. The exposed areas 430, 431, 433 of the silicon oxide layer 404 corresponding to the reservoir, separation channel and separation channel terminus, respectively, are then etched by a fluorine-based plasma with a high degree of anisotropy and selectivity to the protective photoresist 426 until the silicon substrate 400 is reached. The remaining photoresist 426 is then removed in an oxygen plasma or in an actively oxidizing chemical bath such as sulfuric acid ($H_2SO_4$) activated with hydrogen peroxide ($H_2O_2$). This concludes the definition of the latent channel/post mask.

Separation Surface Processing: Reservoir/Nozzle Channel

Figure 33:
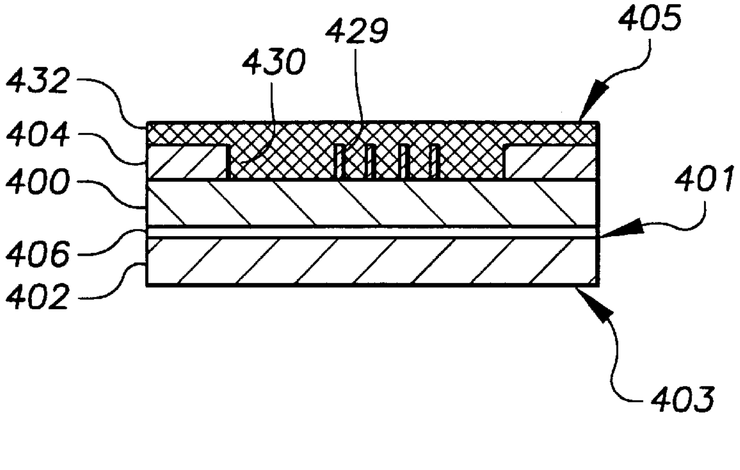
FIG. 33 shows a cross-sectional view of process steps relating to the formation of fluid reservoirs and through-wafer channels in the fabrication of an integrated LC/ESI device.
Figure 34A:
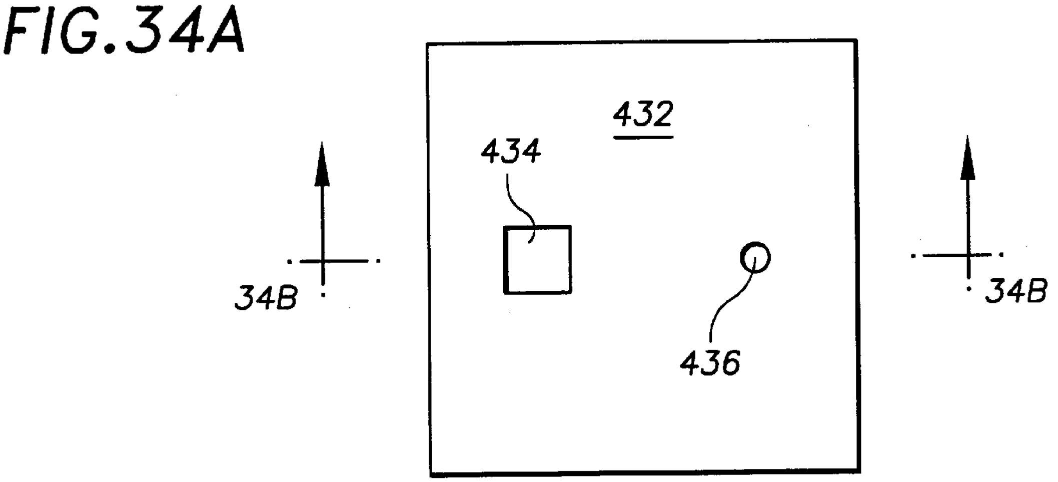
FIG. 34A shows a plan view of process steps relating to the formation of fluid reservoirs and through-wafer channels in the fabrication of an integrated LC/ESI device.
Figure 34B:
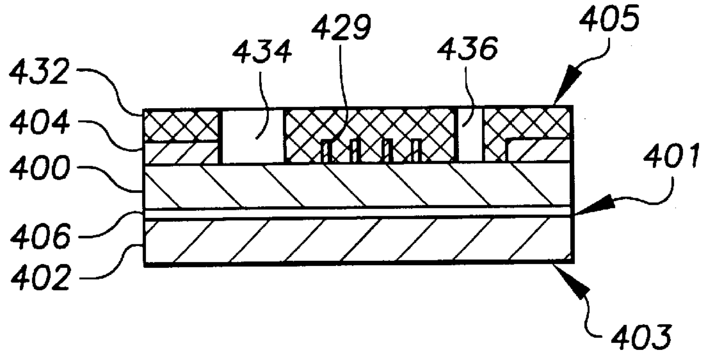
FIG. 34B shows a cross-sectional view of process steps relating to the formation of fluid reservoirs and through-wafer channels in the fabrication of an integrated LC/ESI device.

As shown in the cross-sectional view of FIG. 33, a film of positive-working photoresist 432 is deposited on the separation side 405 of the substrate 400. The photoresist film 432 uniformly and continuously covers both areas 430 that are open through the silicon oxide layer 404 to the silicon substrate 400 as well as remaining areas of the silicon oxide layer 404. Areas of the photoresist film 432 corresponding to a fluid reservoir and nozzle channel that will subsequently be etched are selectively exposed through a photolithographic mask by an optical lithographic exposure tool. Referring to FIGS. 34A and 34B, we see a plan and cross-sectional view, respectively, of the LC/ESI device 100 (FIGS. 25A–25C) after processing to form fluid reservoirs and partial through-substrate nozzle channels. The photoresist 432 is developed to remove the exposed areas of the photoresist such that the reservoir area 434 and the nozzle channel area 436 are open to the underlying silicon substrate 400 while the unexposed areas remain protected by photoresist 432. The open areas 434, 436 are open to the silicon substrate 400 rather than the silicon oxide layer 404 in this preferred embodiment because equal or larger areas 430 were opened through the silicon oxide layer 404 when the channel/post latent mask was defined.

Figure 35:
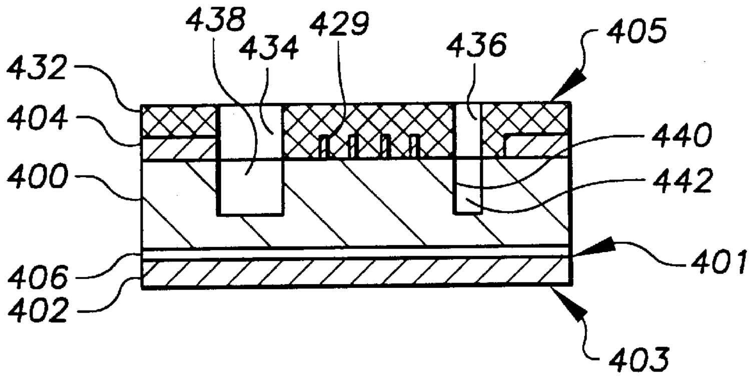
FIG. 35 shows a cross-sectional view of process steps relating to the formation of fluid reservoirs and through-wafer channels in the fabrication of an integrated LC/ESI device.

As shown in the cross-sectional view of FIG. 35, the remaining photoresist 432 provides masking during a subsequent fluorine-based silicon etch to vertically etch certain patterns into the separation side 405 of the silicon substrate 400. The fluorine-based silicon etch creates a reservoir 438 and a separation-side portion 440 of a nozzle channel 442 in the silicon substrate 400. The remaining photoresist 432 is then removed in an oxygen plasma or in an actively oxidizing chemical bath such as sulfuric acid ($H_2SO_4$) activated with hydrogen peroxide ($H_2O_2$).

Ejection Surface Processing: Nozzle, Nozzle Channel, Introduction Channel

Figure 36:
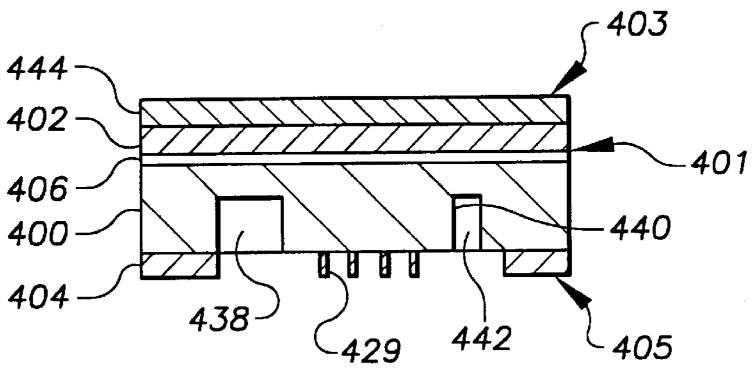
FIG. 36 shows a cross-sectional view of process steps relating to nozzle and through-substrate channel formation using the SMILE aspect of the invention, as part of a continuing fabrication sequence for an integrated LC/ESI device.

FIG. 36 (shown inverted from FIG. 35) shows a cross-sectional view of the LC/ESI device 100 (FIGS. 25A–25C)

prior to nozzle formation using the simultaneous multi-level etching (SMILE) aspect of the present invention. A film of positive-working photoresist 444 is deposited on the ejection side 403 of the substrate 400. After alignment, areas of the photoresist film 444 corresponding to a nozzle orifice and an introduction orifice that will be subsequently etched are selectively exposed through a photolithographic mask by an optical lithographic exposure tool.

Figure 37A:
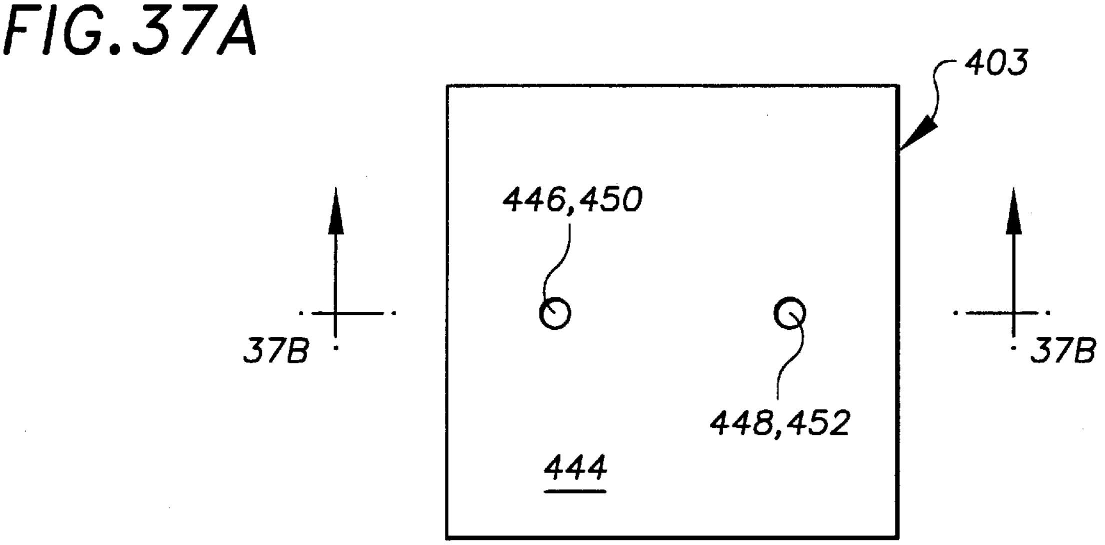
FIG. 37A shows a plan view of process steps relating to nozzle and through-substrate channel formation using the SMILE aspect of the invention, as part of a continuing fabrication sequence for an integrated LC/ESI device.
Figure 37B:
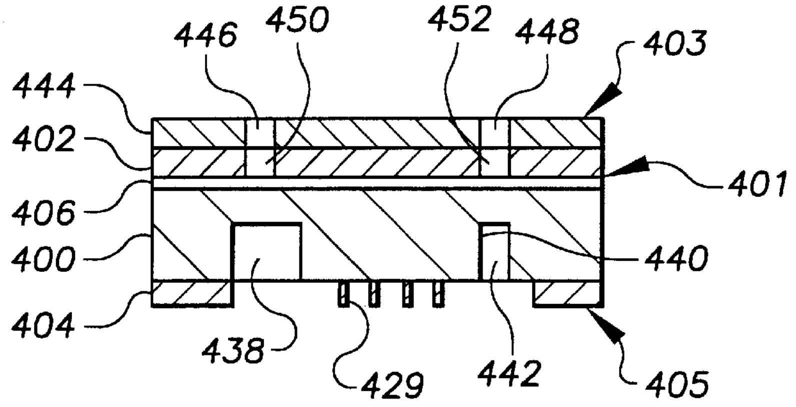
FIG. 37B shows a cross-sectional view of process steps relating to nozzle and through-substrate channel formation using the SMILE aspect of the invention, as part of a continuing fabrication sequence for an integrated LC/ESI device.

As shown in the plan and cross-sectional views, respectively, of FIGS. 37A and 37B, the photoresist 444 is developed to remove the exposed areas of the photoresist such that an introduction orifice area 446 and a nozzle orifice area 448 are open to the underlying silicon oxide layer 402 while the unexposed areas remain protected by photoresist 444. An exposed introduction orifice area 450 and an exposed nozzle orifice area 452 of the silicon oxide layer 402 are then etched by a fluorine-based plasma with a high degree of anisotropy and selectivity to the protective photoresist 444 until the silicon substrate 400 is reached. The remaining photoresist 444 is then removed in an oxygen plasma or in an actively oxidizing chemical bath such as sulfuric acid ($H_2SO_4$) activated with hydrogen peroxide ($H_2O_2$).

Figure 38:
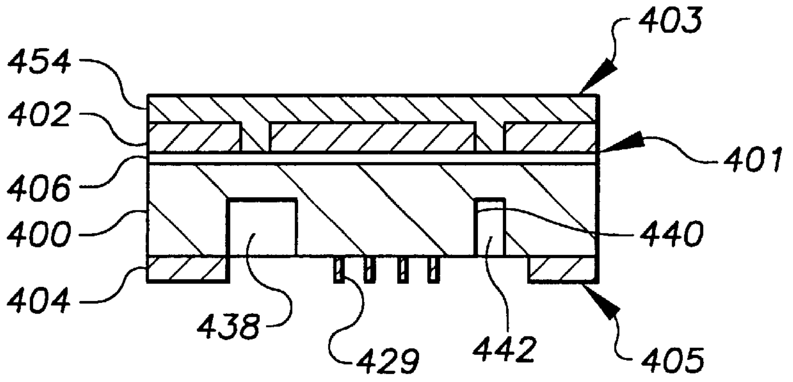
FIG. 38 shows a cross-sectional view of process steps relating to nozzle and through-substrate channel formation using the SMILE aspect of the invention, as part of a continuing fabrication sequence for an integrated LC/ESI device.

Referring now to FIG. 38, a new film of positive-working photoresist 454 is deposited over the ejection side 403 of the substrate 400. After alignment, certain areas of the photoresist film 454 corresponding to an introduction orifice, an introduction channel, a nozzle orifice, a nozzle channel, a nozzle, and a recessed region surrounding and defining the nozzle that will be subsequently etched are selectively exposed through a photolithographic mask by an optical lithographic exposure tool.

Figure 39A:
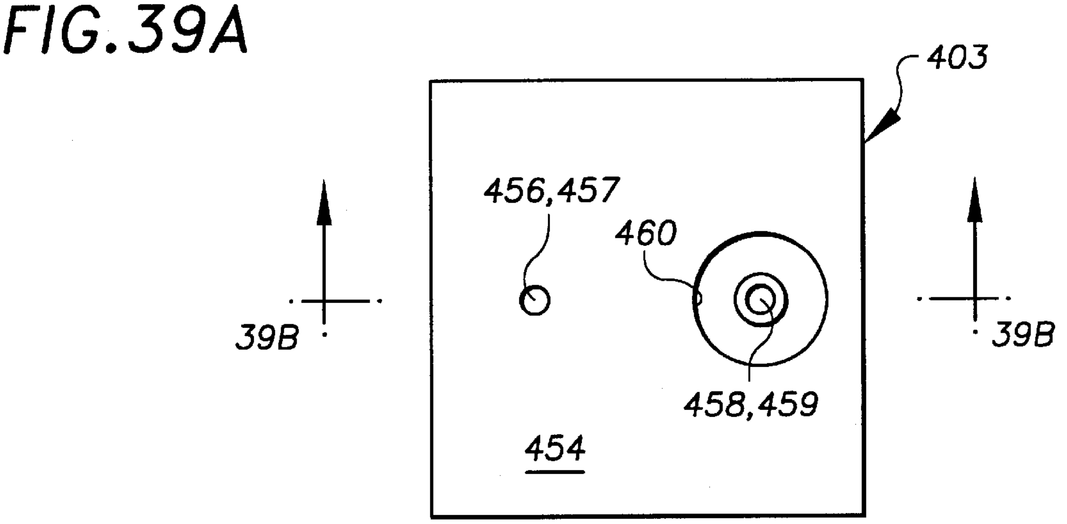
FIG. 39A shows a plan view of process steps relating to nozzle and through-substrate channel formation using the SMILE aspect of the invention, as part of a continuing fabrication sequence for an integrated LC/ESI device.
Figure 39B:
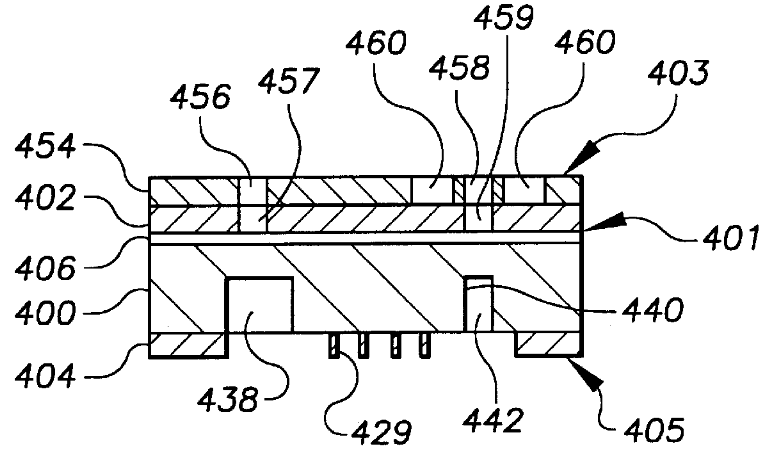
FIG. 39B shows a cross-sectional view of process steps relating to nozzle and through-substrate channel formation using the SMILE aspect of the invention, as part of a continuing fabrication sequence for an integrated LC/ESI device.

As shown in the plan and cross-sectional views, respectively, of FIGS. 39A and 39B, the photoresist 454 is developed to remove the exposed areas of the photoresist such that an exposed area 456 of the photoresist 454 corresponding to an introduction orifice 457 and an exposed area 458 of the photoresist 454 corresponding to a nozzle orifice 459 are open to the silicon substrate 400. The exposed area 460 of the photoresist 454 corresponding to a recessed region 474 (FIG. 41) is open to the underlying silicon oxide layer 402, while the unexposed areas remain protected by photoresist 454.

Figure 40:
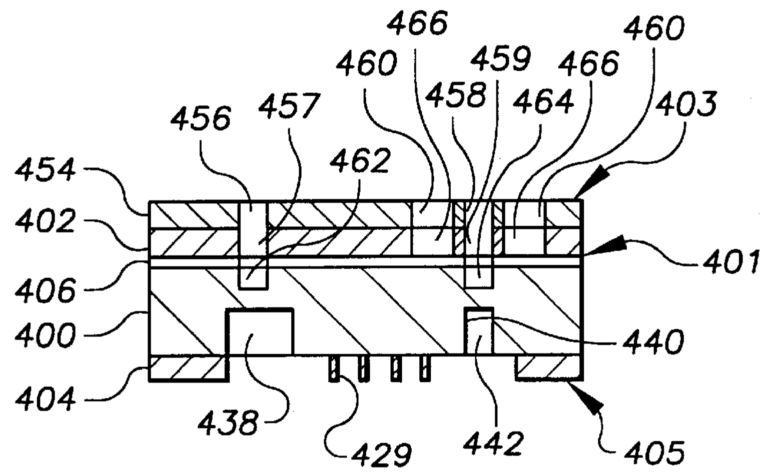
FIG. 40 shows a cross-sectional view of process steps relating to nozzle and through-substrate channel formation using the SMILE aspect of the invention, as part of a continuing fabrication sequence for an integrated LC/ESI device.

Referring to the cross-sectional view of FIG. 40, exposed areas 462, 464 of the silicon substrate 400 corresponding to the introduction orifice 457 and the nozzle orifice 459, respectively, are vertically etched into the silicon by a fluorine-based plasma with a high degree of anisotropy and selectivity to the protective photoresist 454 until a desired depth is reached. The remaining photoresist mask 454 is then used to protect unexposed areas while a fluorine-based oxide etch of an exposed silicon oxide area 466 is performed with a high degree of anisotropy and selectivity to the protective photoresist 454 until the silicon substrate 400 is reached.

Figure 41:
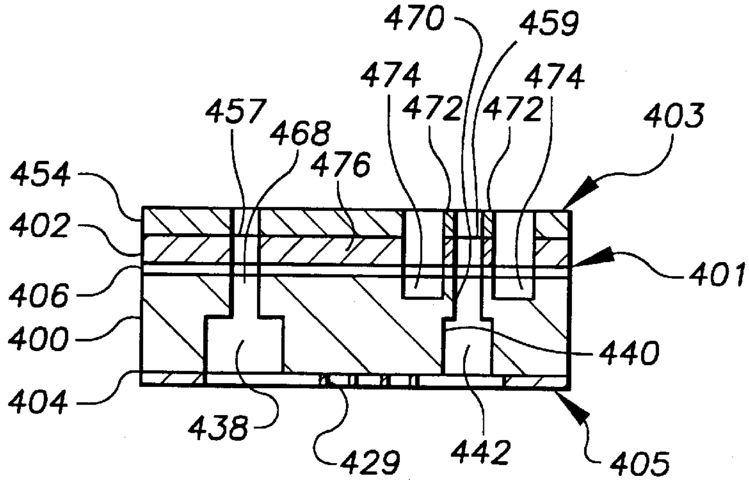
FIG. 41 shows a cross-sectional view of process steps relating to nozzle and through-substrate channel formation using the SMILE aspect of the invention, as part of a continuing fabrication sequence for an integrated LC/ESI device.

As shown in the cross-sectional view of FIG. 41, the remaining photoresist 454 and oxide layer 402 provide masking during a subsequent fluorine-based silicon etch to vertically etch certain patterns into the ejection side 403 of the silicon substrate 400. The fluorine-based silicon etch completes an introduction channel 468 and a nozzle channel 442 through the silicon substrate 400 by forming an ejection-side portion 470 of the nozzle channel 442 aligned with and reaching to a separation-side portion 440 of the nozzle channel 442 previously formed. The silicon etch also creates an ejection nozzle 472, a recessed region 474 exterior to the nozzle 472, and a grid-plane region 476 exterior to both the nozzle 472 and the recessed region 474 on the ejection side 403 of the substrate 400. The grid-plane region 476 is preferably co-planar with the tip of the nozzle 472 so as to physically protect the nozzle 472 from casual abrasion, stress fracture in handling and/or accidental breakage. The remaining photoresist 454 is then removed in an oxygen plasma or in an actively oxidizing chemical bath such as sulfuric acid ($H_2SO_4$) activated with hydrogen peroxide ($H_2O_2$).

This completes the part of the fabrication sequence corresponding to the SMILE aspect of the present invention. The use of the SMILE process ensures that the nozzle 472 is etched to the desired height while still ensuring that the introduction channel 468 and the nozzle channel 442 are completed.

Figure 42A:
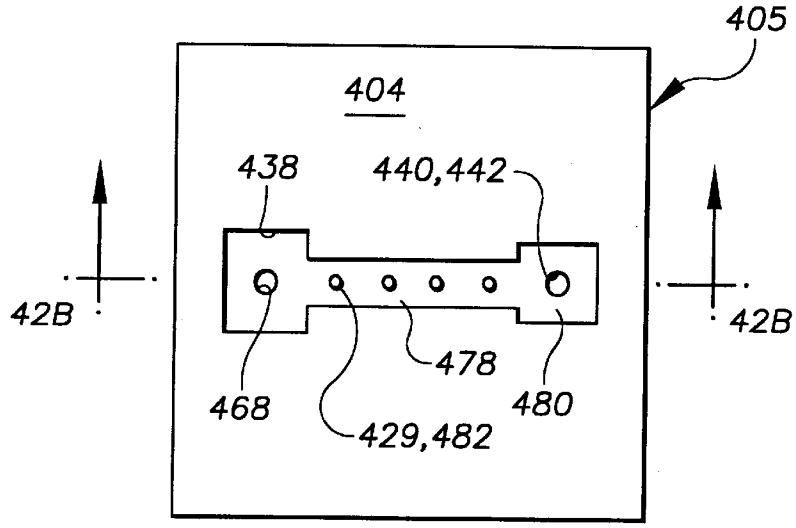
FIG. 42A shows a plan view of process steps relating to completion of the latent masking aspect of the invention in the fabrication of an integrated LC/ESI device.
Figure 42B:
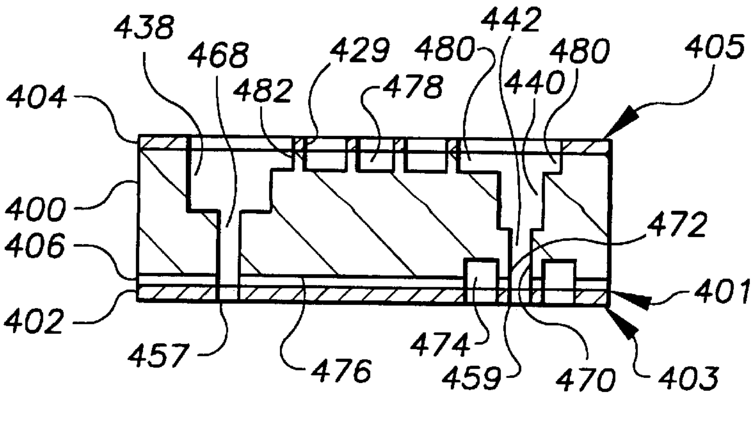
FIG. 42B shows a cross-sectional view of process steps relating to completion of the latent masking aspect of the invention in the fabrication of an integrated LC/ESI device.

Separation surface processing: separation channel and post formation Referring to the plan and cross-sectional views, respectively, of FIGS. 42A and 42B (shown inverted from FIG. 41), certain patterns on the separation side 405 of the substrate 400 that are open to the silicon substrate 400 are now etched by a fluorine-based plasma with a high degree of anisotropy and selectivity to the latent mask previously formed in the silicon oxide layer 404. The silicon etch creates a separation channel 478 and a separation channel terminus 480 on the separation side 405 of the silicon substrate 400. Further, where masked by the separation post pattern 429 in the silicon oxide layer 404, separation posts 482 are formed by the silicon etch. The etch continues until the desired separation channel depth is reached, preferably between approximately 5–20 μm and more preferably approximately 10 μm. The reservoir 438 and separation-side portion 440 of the nozzle channel 442 are simultaneously etched into the silicon substrate 400 by an additional amount equivalent to the channel/post silicon etch.

This completes the fabrication steps corresponding to the latent masking aspect of the present invention. The potentially damaging effects of intervening process steps on fragile, high-aspect-ratio silicon structures 482 are avoided by postponing the use of the latent mask 404 until the present stage. Subsequent steps will not subject the silicon structures 482 to mechanical stress.

Oxidation for Electrical Isolation and Biocompatibility

Figure 43:
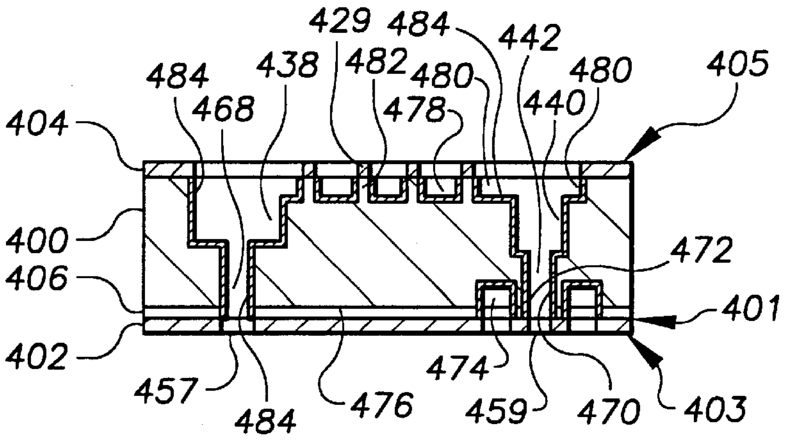
FIG. 43 shows a cross-sectional view of an integrated LC/ESI device after passivation oxidation.

As shown in the cross-sectional view of FIG. 43, a layer of silicon oxide 484 is grown on all silicon surfaces of the substrate 400 by subjecting the substrate 400 to elevated temperature in an oxidizing ambient. For example, the oxidizing ambient may be an ultra-pure steam produced by oxidation of hydrogen for a silicon oxide thickness greater than approximately several hundred nanometers, or pure oxygen for a silicon oxide thickness of approximately several hundred nanometers or less. The layer of silicon oxide 484 over all silicon surfaces of the substrate electrically isolates a fluid in the introduction channel 468, reservoir 438, separation channel 478, separation channel terminus 480 and nozzle channel 442 from the silicon substrate 400 and permits the application and sustenance of different electrical potentials to the fluid in those channels. In addition to electrical isolation, oxidation renders a surface relatively inactive compared to a bare silicon surface, resulting in surface passivation and enhanced biocompatibility.

Cover Substrate Processing and Bonding

Figure 44A:
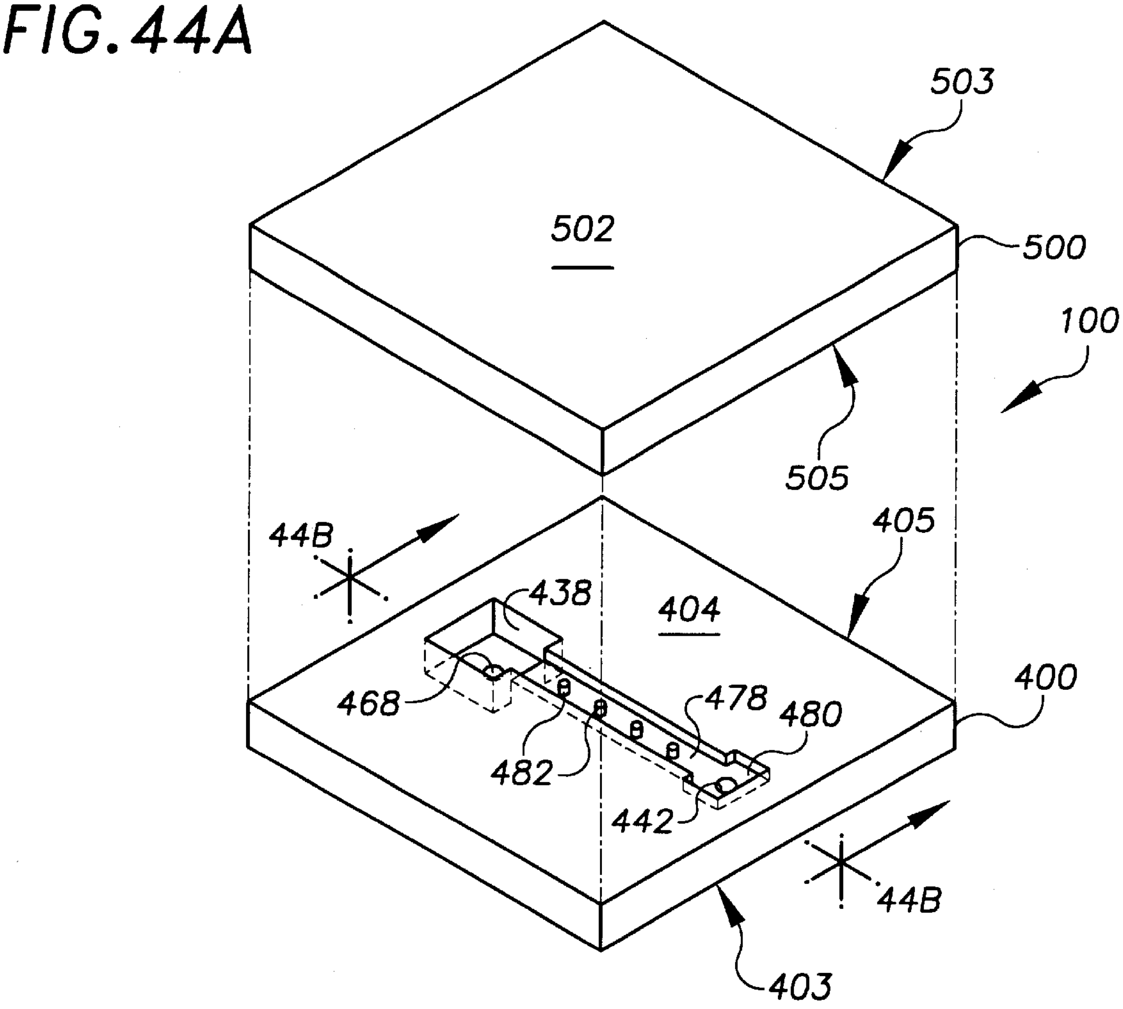
FIG. 44A shows an exploded perspective view of the first silicon substrate and a cover substrate in the fabrication of an integrated LC/ESI device.
Figure 44B:
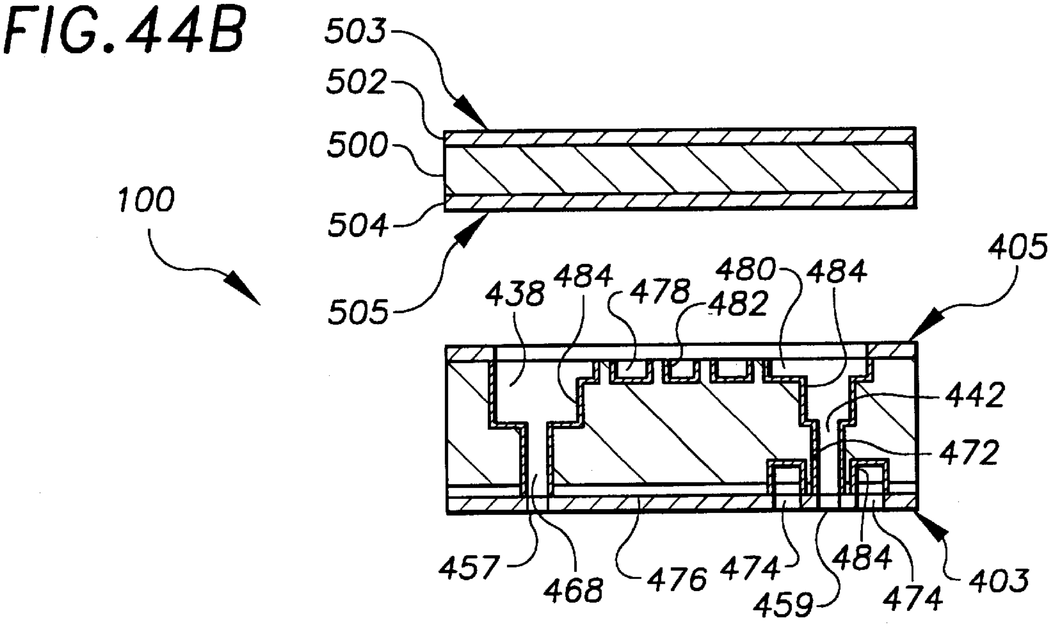
FIG. 44B shows an exploded cross-sectional view of the first silicon substrate and a cover substrate in the fabrication of an integrated LC/ESI device.
Figure 45:
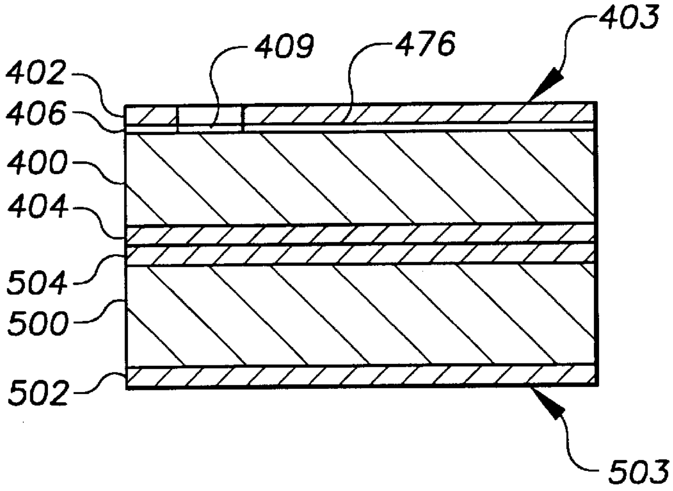
FIG. 45 shows a cross-sectional view of the formation of electrical contact to the substrate in the fabrication of an integrated LC/ESI device.

The exploded perspective and cross-sectional views of FIGS. 44A and 44B, respectively, show the LC/ESI device 100 that generally includes the first silicon substrate 400 and a cover substrate 500, preferably silicon. The substrate 400 defines the introduction channel 468 through the substrate 400 extending between the introduction orifice 457 on the ejection side 403 and the fluid reservoir 438 on the separation side 405 of the substrate 400; the separation channel 478 extending between the reservoir 438 and the channel terminus 480, and separation posts 482 along the separation channel 478 on the separation side 405; the nozzle orifice 459, the nozzle 472, the recessed region 474, and the grid-plane region 476 on the ejection side 403; and the nozzle channel 442 extending between the nozzle orifice 459 on the ejection side 403 and the separation channel terminus 480 on the separation side 405 of substrate 400. All aforementioned features defined on substrate 400 are formed according to the process sequence described above. The purpose of the cover substrate 500 is to provide an enclosure surface 505 for the reservoir 438, the separation channel 478, and the separation channel terminus 480 on the separation side 405 of the substrate.

All surfaces of the cover substrate 500 are subjected to thermal oxidation in a manner that is the same as or similar to the process described above in the processing of substrate 400. A film or layer of silicon oxide 502 is created on a support side 503 of the substrate 500. A film or layer of silicon oxide 504 is created on an enclosure side 505 of the substrate 500. The cover substrate 500 is then preferably hermetically attached or bonded by any suitable method to the separation side 405 of substrate 400 for containment and isolation of fluids in the LC/ESI device 100. Any of several methods of bonding known in the art, including anodic bonding, sodium silicate bonding, eutectic bonding, and fusion bonding can be used.

Ejection Surface Processing: Contacts and Metallization

FIGS. 45–48B illustrate the formation of electrical contact to the substrate 400 by completion of the delayed LOCOS aspect of the present invention and metallization. As shown in the cross-sectional view of FIG. 45, and referring again to FIG. 28, an unmasked fluorine-based etch is first done to remove surface oxide 418 that has grown on the nitride contact pattern 408 as a result of the several oxidations which formed masking oxides 402, 404 and the isolation oxide 484 (FIG. 43). Next, a blanket (unmasked) fluorine-based etch is done until the silicon substrate 400 is reached in the contact area 409, etching through the silicon nitride layer 408 and the underlying silicon oxide layer 402. Since oxide is also uniformly removed from the ejection side 403, care must be taken to halt the etch once the silicon substrate 400 is reached. The contact area 409 preferentially clears while leaving regions 476 exterior to the contact area 409 still protected by silicon oxide 402 because the nitride 408 strongly inhibited oxide growth in the contact area 409 during the aforementioned oxidations.

In alternative embodiments, as discussed above in the context of the third aspect of the present invention (delayed LOCOS), the contact areas may also be cleared by hot phosphoric acid etching of the nitride or by shadow-masked etching.

Figure 46:
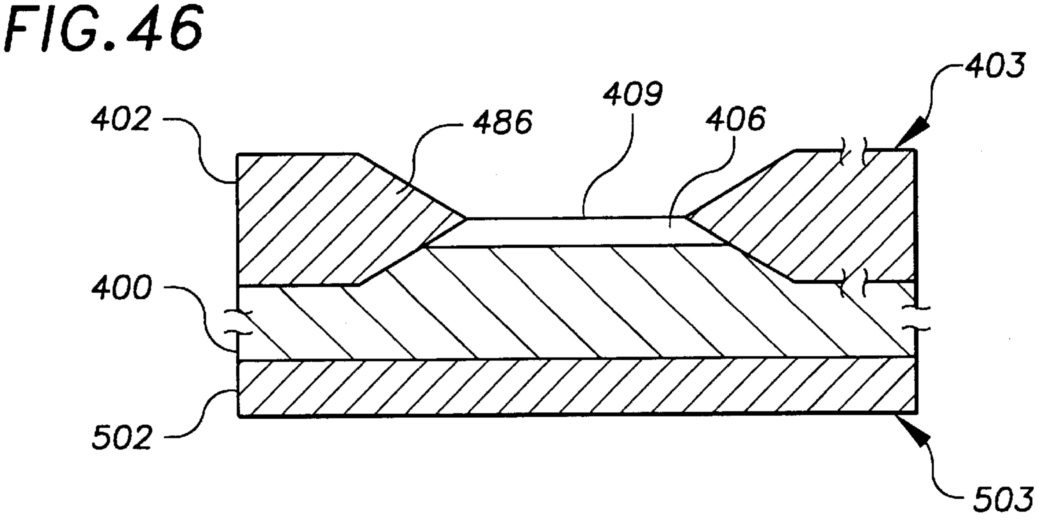
FIG. 46 shows a cross-sectional view of the formation of electrical contact to the substrate in the fabrication of an integrated LC/ESI device.

FIG. 46 shows a detailed cross-sectional view of the contact area 409 and adjacent areas in order to illustrate another advantage of the use of the delayed LOCOS aspect of the present invention. As a result of the lateral diffusion of oxidizing species under the edge of the nitride layer 408 adjacent the grid-plane region 476 during oxidation, a transitional region of silicon oxide 486 is grown, so that there is not an abrupt step from the silicon substrate 400 at the bottom of the contact area 409 to the height of the surrounding oxide layer 402. This transitional region is referred to in the art as a "bird's beak". The non-abrupt topography of the bird's beak provides a significant advantage in the remaining process block (metallization).

Figure 47A:
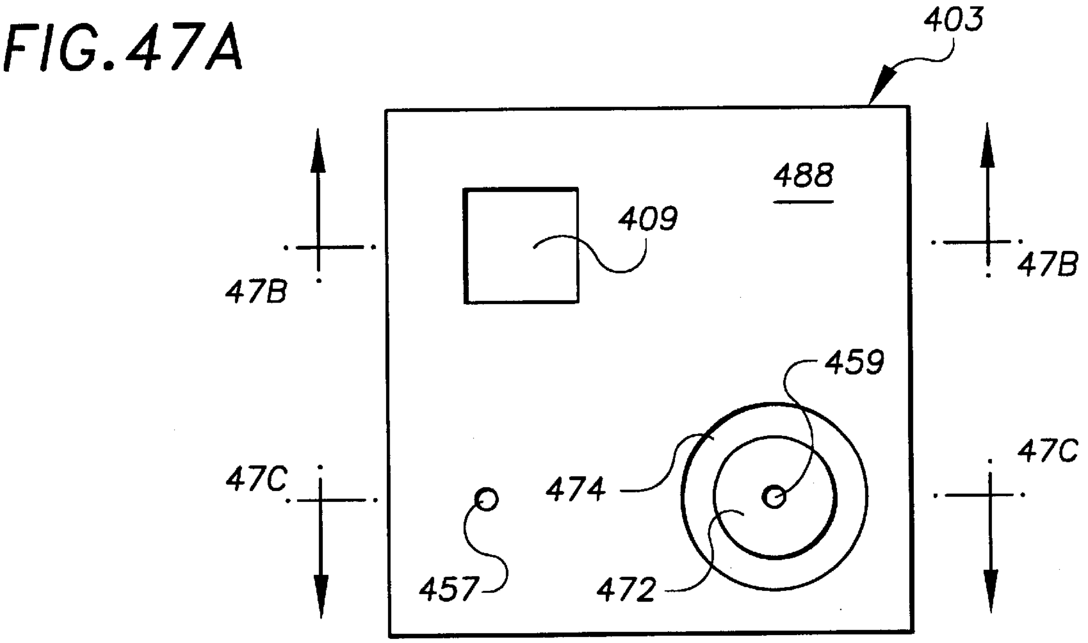
FIG. 47A shows a plan view of the formation of electrical contact to the substrate in the fabrication of an integrated LC/ESI device.
Figure 47B:
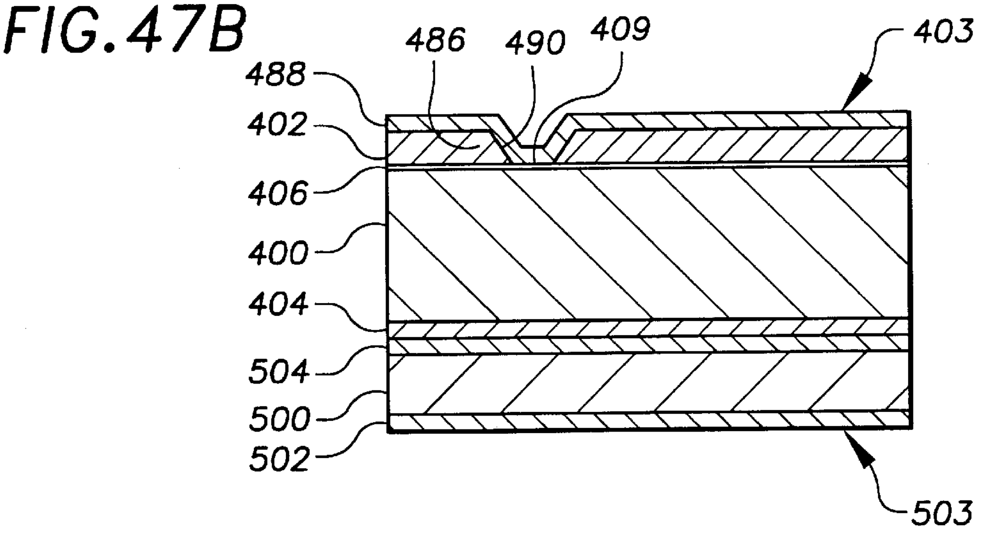
FIG. 47B shows a cross-sectional view of the formation of electrical contact to the substrate in the fabrication of an integrated LC/ESI device.
Figure 47C:
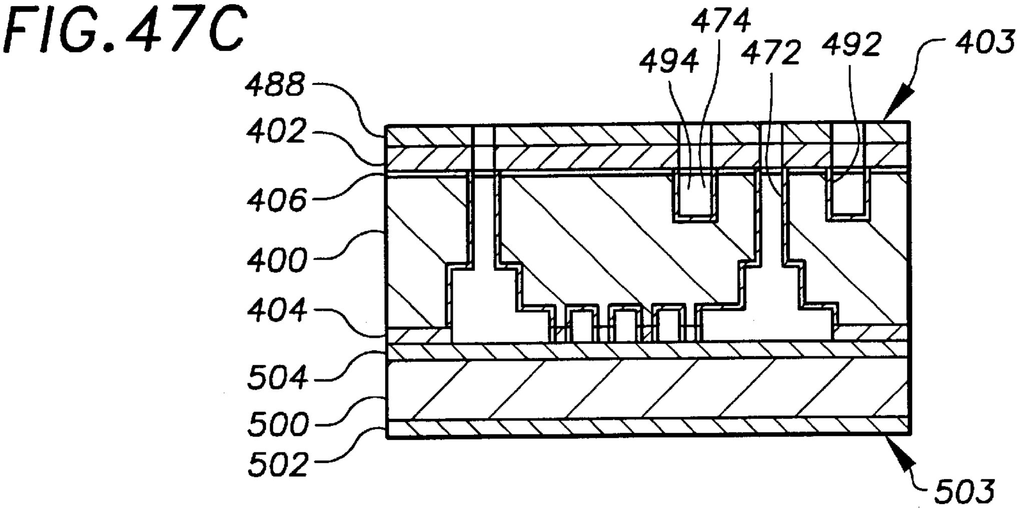
FIG. 47C shows a cross-sectional view of the formation of electrical contact to the substrate in the fabrication of an integrated LC/ESI device.

Referring to the plan and cross-sectional views of FIGS. 47A, 47B, and 47C, a conductive film 488 such as aluminum may be uniformly deposited on the ejection side 403 of the substrate 400, including on contact sidewalls 490 and onto the contact area 409. The bird's beak topography, as characterized by the silicon oxide transitional region 486, ensures continuous contact sidewall 490 coverage into the contact area 409. The slope is exaggerated in FIG. 47B to effectively show the required contact sidewall 490 coverage.

The conductive film 488 may be deposited by any method that does not produce a continuous film of the conductive material on sidewalls 492 of the ejection nozzle 472 or on sidewalls 494 of the recessed region 480. Such a continuous film would electrically connect the fluid in the nozzle channel 442 to the substrate 400 so as to prevent the independent control of their respective electrical potentials. For example, the conductive film may be deposited by thermal or electron-beam evaporation of the conductive material, resulting in line-of-sight deposition on presented surfaces. Orienting the substrate 400 such that the sidewalls 492 of the ejection nozzle 472 are out of the line-of-sight of the evaporation source ensures that no conductive material is deposited as a continuous film on the sidewalls of the ejection nozzle 472. Sputtering of conductive material in a plasma is an example of a deposition technique that would result in deposition of conductive material on all surfaces and thus is undesirable.

Figure 48A:
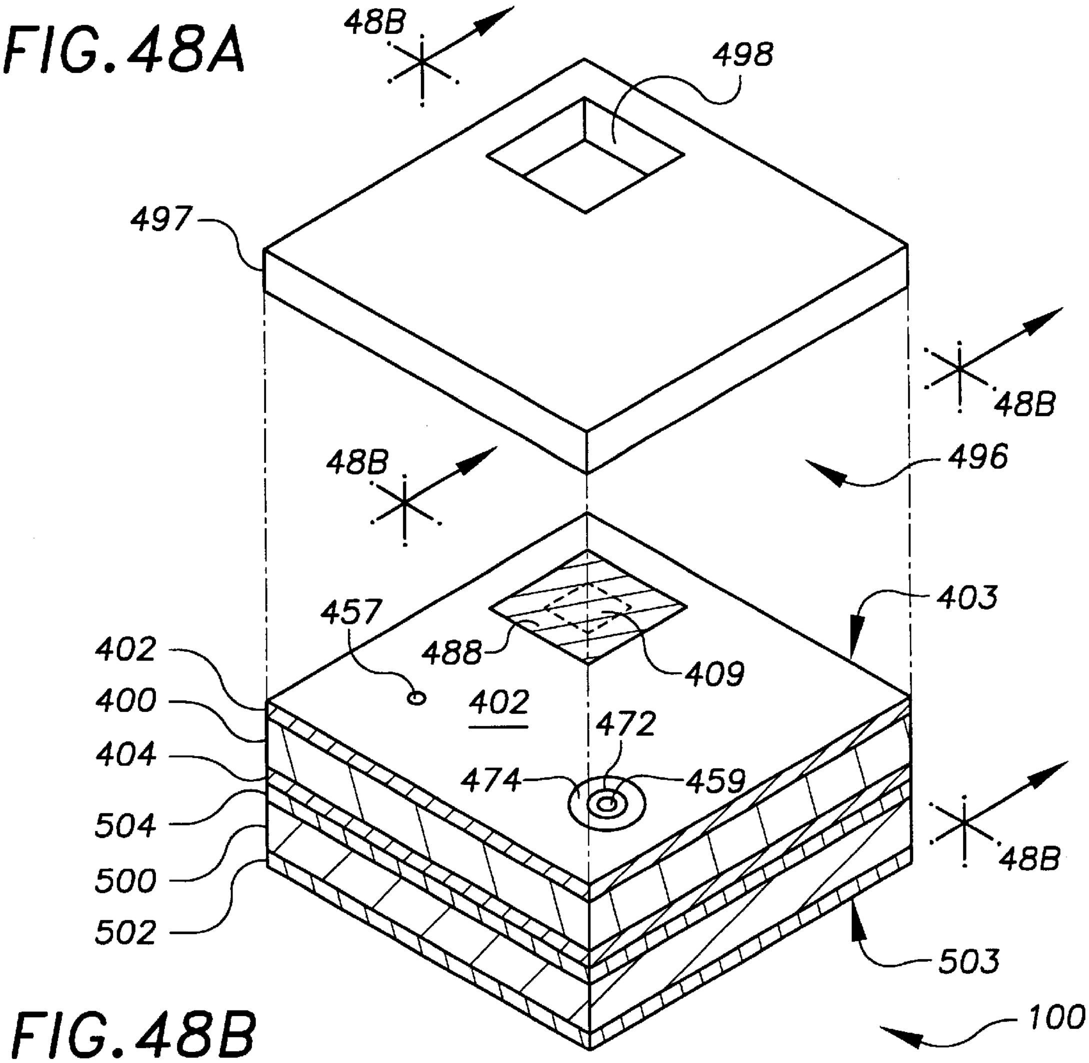
FIG. 48A shows an exploded perspective view of an alternative method of metallization involving the use of a shadow mask in the fabrication of an integrated LC/ESI device.
Figure 48B:
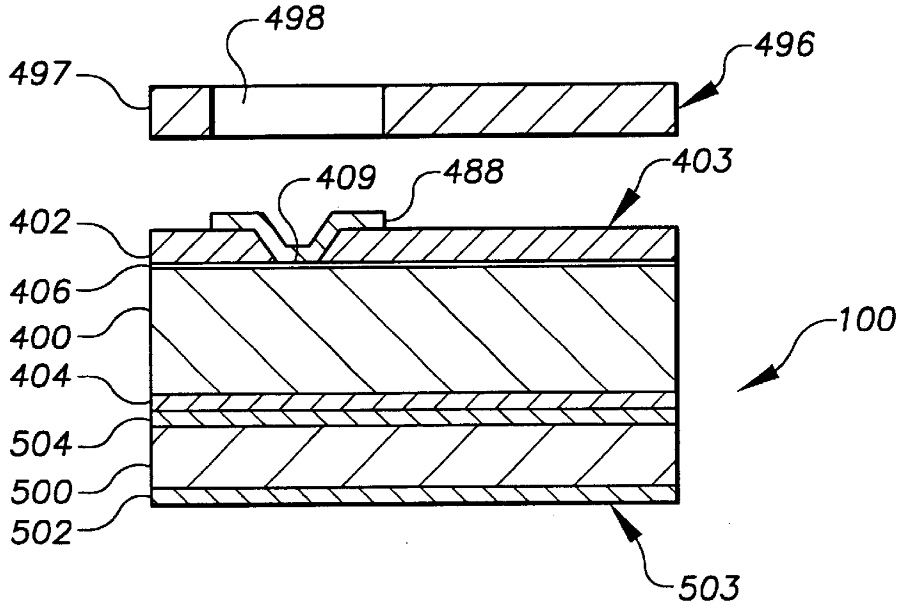
FIG. 48B shows an exploded cross-sectional view of an alternative method of metallization involving the use of a shadow mask in the fabrication of an integrated LC/ESI device.

In an alternative embodiment, shown in exploded perspective and cross-sectional views in FIGS. 48A and 48B, respectively, a shadow mask 496 may be used to ensure that the conductive film 488 is not deposited on the nozzle 472. The shadow mask 496 includes a solid, rigid substrate 497 in which a through-hole 498 has been created by any of a number of suitable means, including etching and stamping. In this alternative embodiment, the shadow mask 496 is held in alignment during the deposition of the conductive film 488 and then removed. Since no conductive film 488 deposition occurs on or near the nozzle 472, any standard deposition technique may be used, including evaporation and sputtering.

The foregoing process is provided for two purposes: first, to provide a significantly improved process for the fabrication of integrated LC/ESI devices; and second, to illustrate the application of the three fundamental aspects disclosed hereinabove. A practitioner skilled in the art will recognize that (a) any or all of the aspects may be incorporated without altering the essential functionality of the device, and that (b) any or all of the inventions may be applied to other devices having similar or dissimilar functionality. The three fundamental aspects are mutually compatible and act individually and in concert to significantly enhance the manufacturability of the LC/ESI device. In alternative embodiments of this aspect of the present invention, any two or only one of the three aspects may be incorporated in the integrated process for fabricating an LC/ESI device. The essential outcome from incorporation of the fundamental aspects is a significant improvement in manufacturing yield, and in the case of the SMILE aspect, significant extension of permissible design geometries.

Improved Electrospray Ionization (ESI) Device Fabrication Procedure

The fifth aspect of the present invention, the fabrication of an ESI device, is explained with reference to FIGS. 49–69B.

Figure 49:
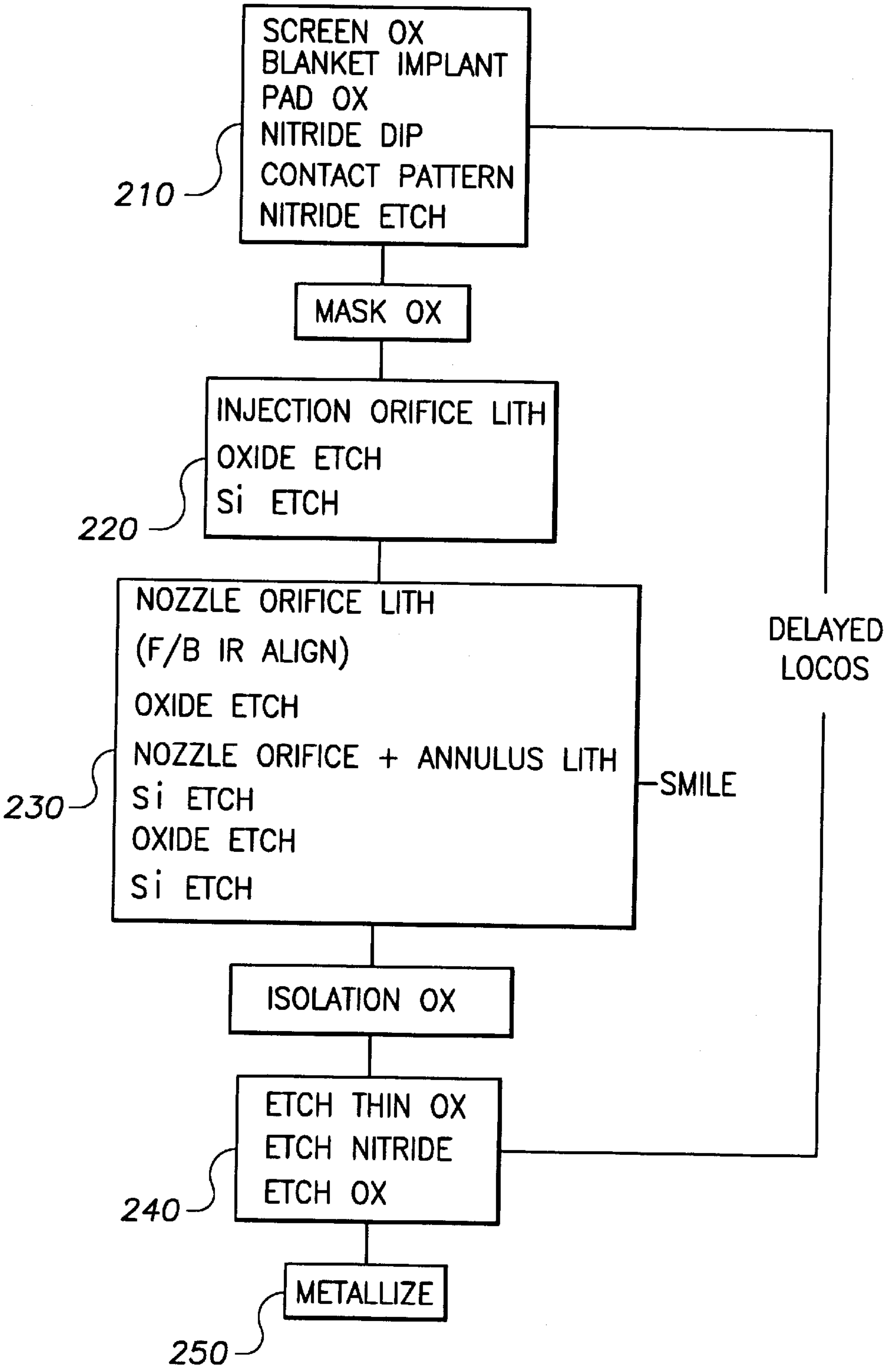
FIG. 49 shows a block process sequence for fabricating an ESI device.

A process to fabricate an ESI device is shown in block form in FIG. 49. It will be apparent to a skilled practitioner of the art that subtle changes may be made in the detailed process without materially affecting the function and form of the resulting device. As one example, the insertion or deletion of a wafer cleaning step may have a measurable impact on manufacturing yield, but will have no influence on the form, appearance, or function of a successfully yielding device.

The block process shown in FIG. 49 incorporates two of the fundamental aspects of the present invention, simultaneous multi-level etching (SMILE) and delayed LOCOS, to significantly improve fabrication reliability and manufacturing yield. The outcome of this particular process sequence is an ESI device 200 (FIGS. 50A–50B) in which a silicon substrate 600 defines a nozzle channel 630 between a nozzle 656 on an ejection surface 603 and an injection orifice 626 on an injection surface 605 such that the electrospray generated by the electrospray device 200 is generally approximately perpendicular to the ejection surface 603. In the preferred embodiment of the process in the present invention, the device produced defines a nozzle 656 with an inner and an outer diameter delineated by an annular region 658 recessed from the ejection surface 603 and extending radially from the outer diameter. The tip of the nozzle 656 is co-planar with the ejection surface 603. All surfaces of the ESI device 200 preferably have a layer of silicon oxide 662 to electrically isolate a fluid sample from the substrate 600 and to provide for biocompatibility.

Two fundamental aspects of the present invention, SMILE and delayed LOCOS, are incorporated in the integrated fabrication sequence in the manner shown in FIG. 49. After any preparatory processing, the nitride deposition and patterning steps for the delayed LOCOS process are performed as shown at 210, preferably on the injection surface. Next the injection orifice is patterned on the injection surface, followed by a deep etch through the oxide film and into the silicon substrate as shown at 220. Processing then continues on the ejection surface according to the SMILE process to form the nozzle, complete the nozzle channel, and form the recessed region as shown at 230. Finally, the delayed LOCOS process is completed by opening the required contact hole on the injection surface, shown at 240, followed by metallization, shown at 250.

Injection Surface Processing: Contact Pattern Definition (Delayed LOCOS)

Figure 50A:
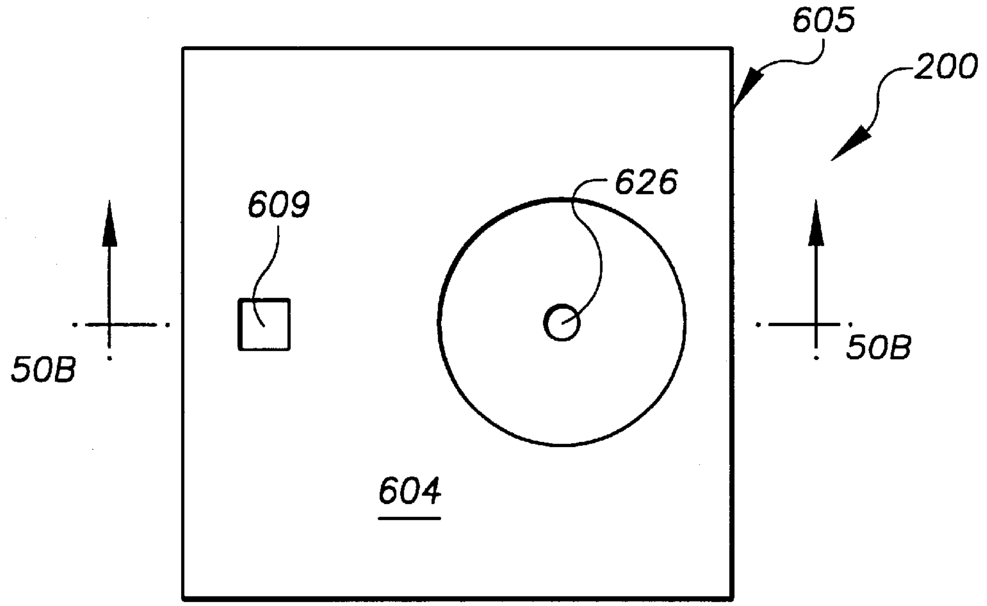
FIG. 50A shows a plan view of a completed ESI device.
Figure 50B:
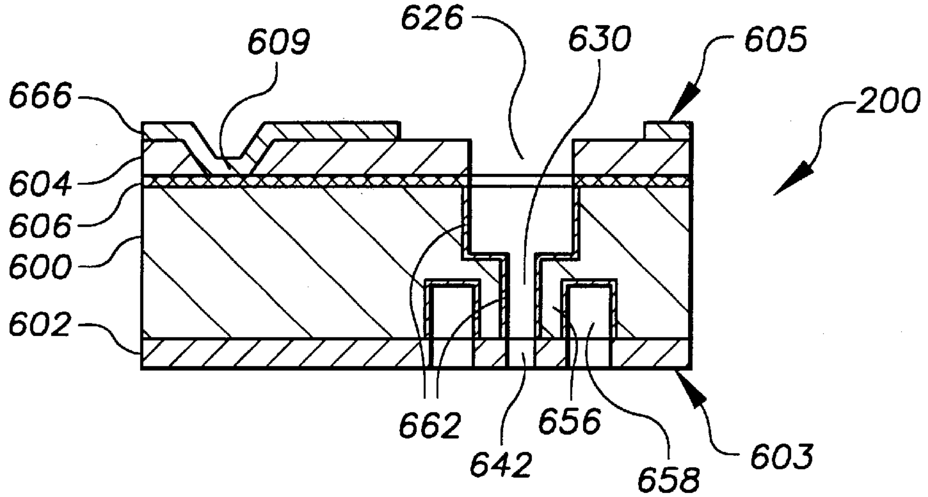
FIG. 50B shows a cross-sectional view of a completed ESI device.
Figure 51A:
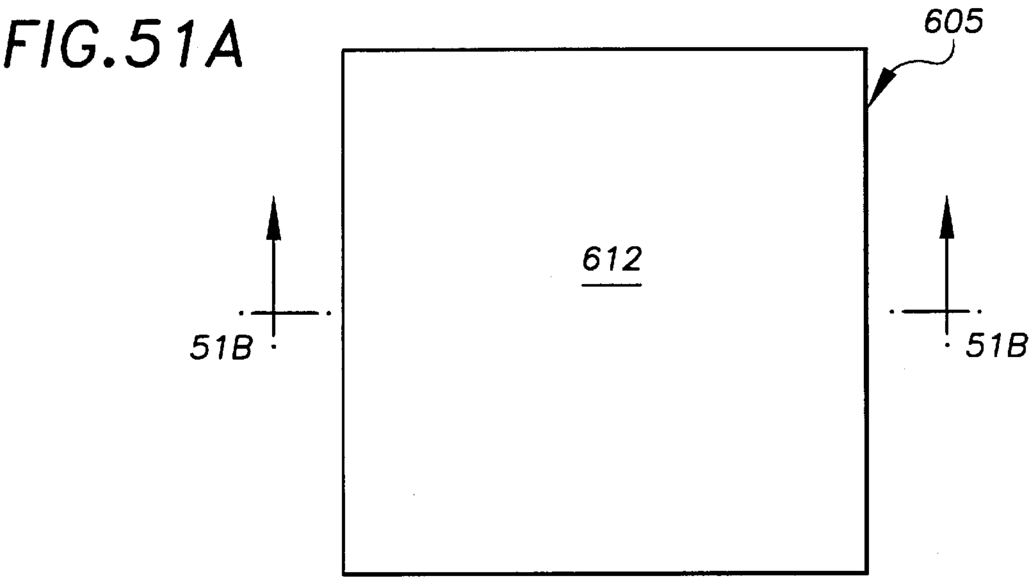
FIG. 51A shows a plan view of the initial process steps relating to the delayed LOCOS aspect of the invention, as part of a fabrication sequence for an ESI device.
Figure 51B:
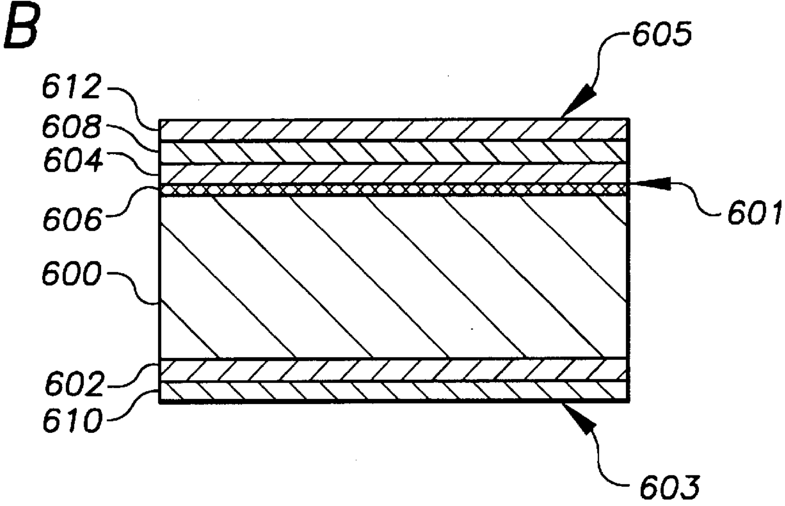
FIG. 51B shows a cross-sectional view of the initial process steps relating to the delayed LOCOS aspect of the invention, as part of a fabrication sequence for an ESI device.

FIGS. 51A and 51B illustrate the initial processing steps for the ejection side of the first substrate in fabricating an ESI device 200 (FIGS. 50A–50B). A double-side-polished silicon wafer substrate 600 is subjected to an elevated temperature in an oxidizing ambient to grow a layer or film of silicon oxide 602 on an ejection side 603 and a layer or film of silicon oxide 604 on an injection side 605 of the substrate 600. Each of the resulting silicon oxide layers 602, 604 has a thickness of approximately 10–20 nm. The silicon oxide layer 604 provides some protection to the surface of the silicon substrate 600 at a silicon/silicon oxide interface 601.

A high-dose implantation is made through the silicon oxide layer 604 to form an implanted region 606 to ensure a low-resistance electrical connection between an electrode that will be formed at a later stage of the process and the substrate 600. If the starting substrate 600 is acceptor-doped (i.e., p-type) the high-dose implantation is done with a p-type species such as boron, resulting in a p+ implanted region 606. If the starting substrate 600 is donor-doped (i.e., n-type) the high-dose implantation is done with an n-type species such as arsenic or phosphorus, resulting in an n+ implanted region 606.

A layer or film of silicon nitride 608 is deposited on the silicon oxide layer 604 on the injection side 605 of the substrate 600. Deposition of the silicon nitride layer 608 is done in the preferred embodiment by low-pressure chemical vapor deposition (LPCVD), which also deposits a layer of silicon nitride 610 on the ejection side 603 of the substrate 600. Each of the resulting silicon nitride layers 608, 610 has a thickness of approximately 150–200 nm. Deposition of the silicon nitride layer 608 may alternatively be done by plasma-enhanced chemical vapor deposition (PECVD).

Figure 51C:
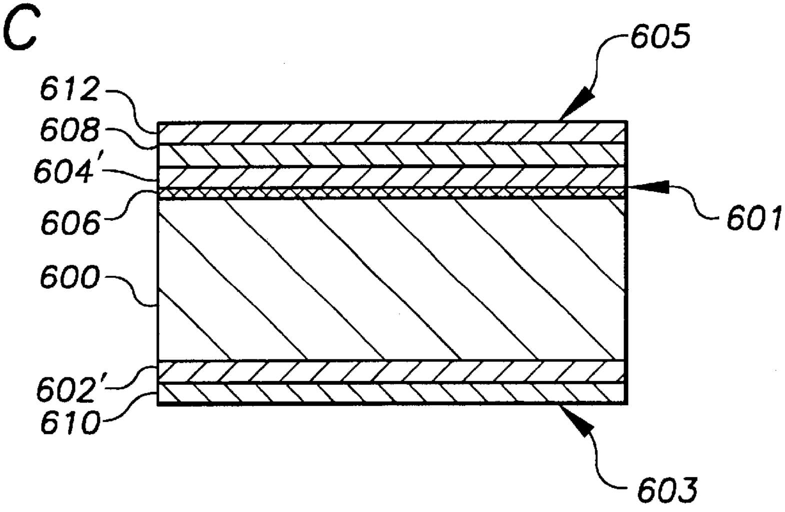
FIG. 51C shows a cross-sectional view of the initial process steps relating to the delayed LOCOS aspect of the invention, as part of a fabrication sequence for an ESI device.
Figure 52A:
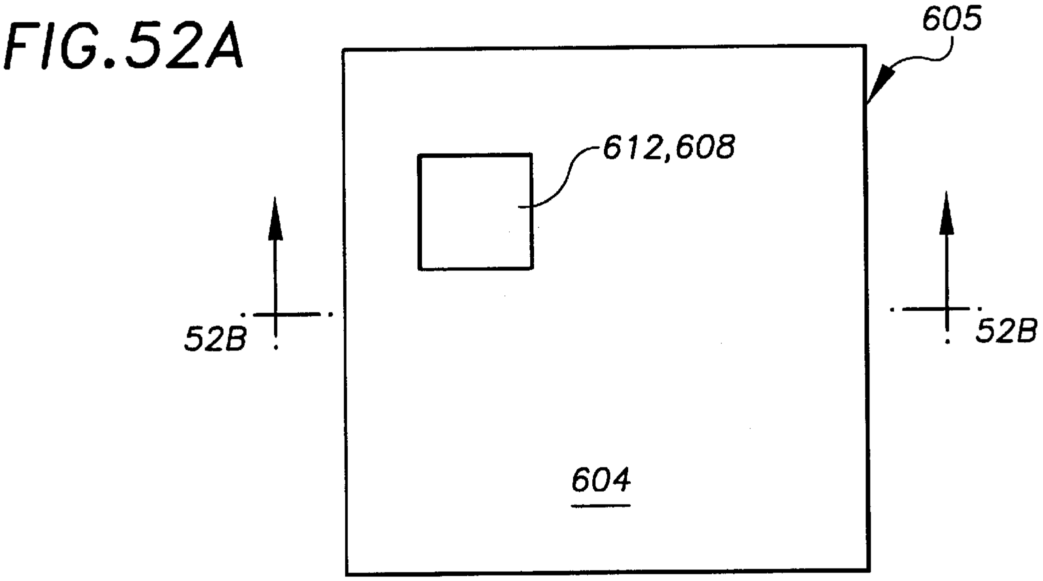
FIG. 52A shows a plan view of the initial process steps relating to the delayed LOCOS aspect of the invention, as part of a fabrication sequence for an ESI device.
Figure 52B:
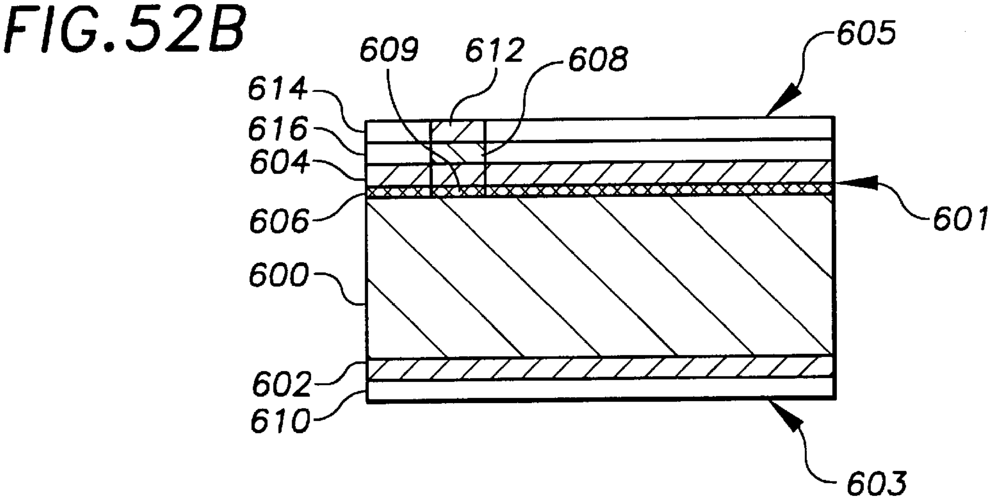
FIG. 52B shows a cross-sectional view of the initial process steps relating to the delayed LOCOS aspect of the invention, as part of a fabrication sequence for an ESI device.

In an alternative embodiment shown in the cross-sectional view of FIG. 51C, the silicon oxide layer 604 is removed after the high-dose implantation, the silicon oxide layer 604 having presumptively been damaged by the implantation. Removal is preferably accomplished by immersion in hydrofluoric acid (HF) or a buffered solution of HF. Silicon oxide layer 602 is simultaneously removed. After removal, new silicon oxide layers 602', 604' are then re-grown to a thickness of 10–20 nm by subjecting the substrate 600 to an elevated temperature in an oxidizing ambient.

Referring back to FIGS. 51A and 51B, a film of positive-working photoresist 612 is deposited on the silicon nitride layer 608 on the injection side 605 of the substrate 600. All areas of the photoresist 612, exclusive of a contact area that will be protected by silicon nitride until ultimately being opened to form a contact to the substrate 600, are selectively exposed through a mask by an optical lithographic exposure tool. As shown in the plan and cross-sectional views, respectively, of FIGS. 52A and 52B, after development of the photoresist 612 an exposed area 614 of the photoresist is removed and open to the underlying silicon nitride layer 608 while the unexposed areas remain protected by photoresist 612. An exposed area 616 of the silicon nitride layer 608 is then etched by a fluorine-based plasma with a high degree of anisotropy and selectivity to the protective photoresist 612 until the silicon oxide layer 604 is reached. Next, the entire layer of silicon nitride 610 on the ejection side 603 of the substrate 600 is etched by a fluorine-based plasma until the silicon oxide layer 602 is reached. Any remaining photoresist 612 on the injection side 605 of the substrate 600 is then removed in an oxygen plasma or in an actively oxidizing chemical bath such as sulfuric acid ($H_2SO_4$) activated with hydrogen peroxide ($H_2O_2$).

This completes the first set of process steps for the delayed LOCOS aspect of the present invention. The area of the silicon substrate 600 directly below the patterned silicon nitride layer 608 will ultimately become the contact area 609 to the substrate 600 when the nitride layer 608 is removed prior to metallization.

Oxidation for Masked Silicon Etching

Figure 53:
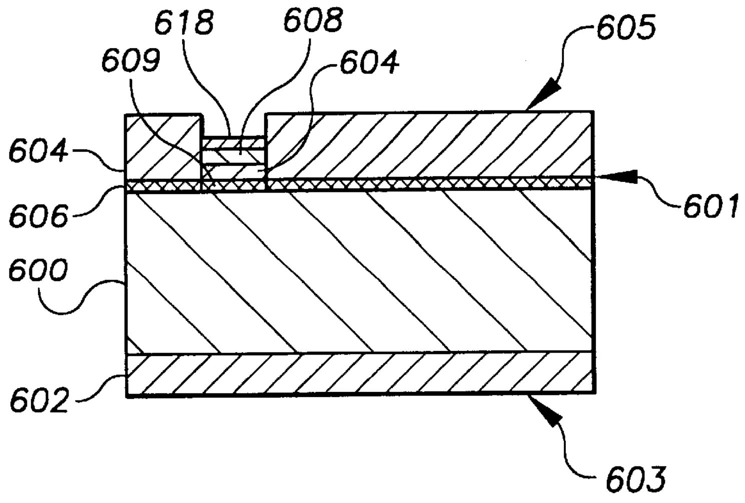
FIG. 53 shows a cross-sectional view of further process steps in the fabrication of an ESI device.

Referring to FIG. 53, the silicon oxide layer 604 is made thicker on the injection side 605 of the substrate 600 by subjecting the silicon substrate 600 to elevated temperature in an oxidizing ambient. The silicon oxide layer 602 is also made thicker on the ejection side 603 of the substrate 600 at the same time by the same means. For example, the oxidizing ambient may be an ultra-pure steam produced by oxidation of hydrogen for a silicon oxide thickness greater than approximately several hundred to several thousand nanometers, or pure oxygen for a silicon oxide thickness of approximately several hundred nanometers or less. In the preferred embodiment, the silicon oxide layers 602, 604 are increased in thickness to 150–200 nm. The layers of silicon oxide 602, 604 provide electrical isolation and also serve as masks for subsequent selective etching of certain areas of the silicon substrate 600. As a result of the oxidation of a small amount of the silicon nitride layer 608 on the injection side 605 of the substrate 600, a thin silicon oxide layer 618 is formed on the silicon nitride layer 608.

Injection Surface Processing: Injection Orifice Definition

Figure 54:
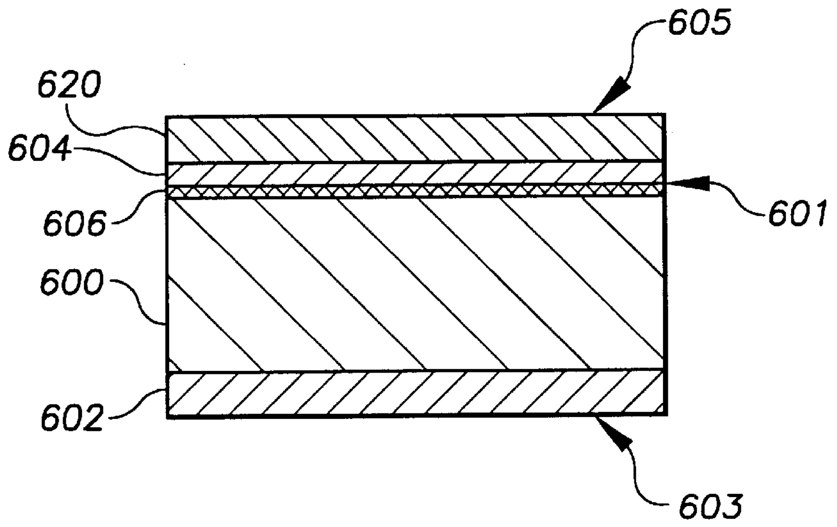
FIG. 54 shows a cross-sectional view of further process steps in the fabrication of an ESI device.

As shown in the cross-sectional view of FIG. 54, a film of positive-working photoresist 620 is deposited on the silicon oxide layer 604 on the injection side 605 of the substrate 600. After alignment, a certain area of the photoresist film 620 corresponding to an injection orifice that will be subsequently etched is selectively exposed through a lithographic mask by an optical lithographic exposure tool.

Figure 55A:
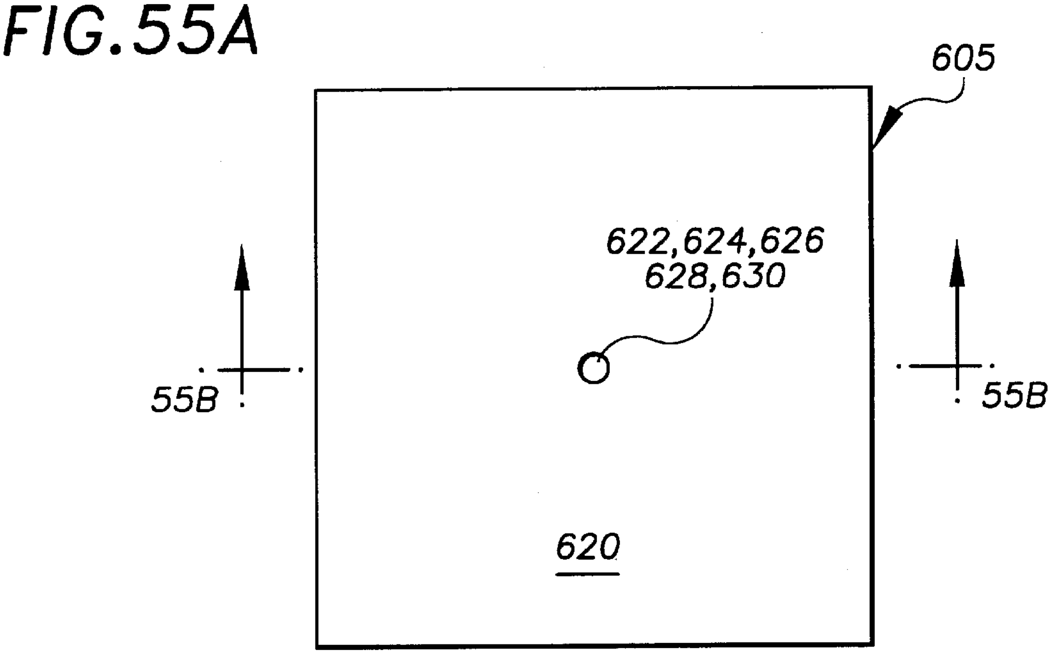
FIG. 55A shows a plan view of further process steps in the fabrication of an ESI device.
Figure 55B:
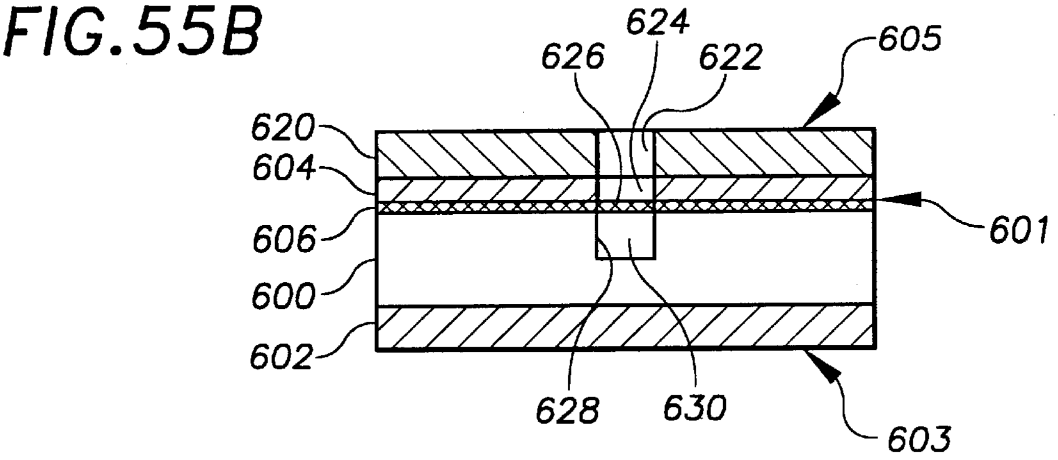
FIG. 55B shows a cross-sectional view of further process steps in the fabrication of an ESI device.

Referring to the plan and cross-sectional views, respectively, of FIGS. 55A and 55B, after development of the photoresist 620 the exposed area 622 of the photoresist corresponding to the injection orifice is removed and open to the underlying silicon oxide layer 604 while the unexposed areas remain protected by photoresist 620. The exposed area 624 of the silicon oxide layer 604 corresponding to the injection orifice is then etched by a fluorine-based plasma with a high degree of anisotropy and selectivity to the protective photoresist 620 until the silicon substrate 600 is reached.

The remaining photoresist 620 and unexposed areas of the silicon oxide layer 604 provide masking during a subsequent fluorine-based silicon etch to vertically etch certain patterns into the injection side 605 of the silicon substrate 600. The fluorine-based silicon etch creates an injection orifice 626 and an injection-side portion 628 of a nozzle channel 630 in the silicon substrate 600. The remaining photoresist 620 is then removed in an oxygen plasma or in an actively oxidizing chemical bath such as sulfuric acid ($H_2SO_4$) activated with hydrogen peroxide ($H_2O_2$).

Ejection Surface Processing: Nozzle, Nozzle Channel, Recessed Region

Figure 56:
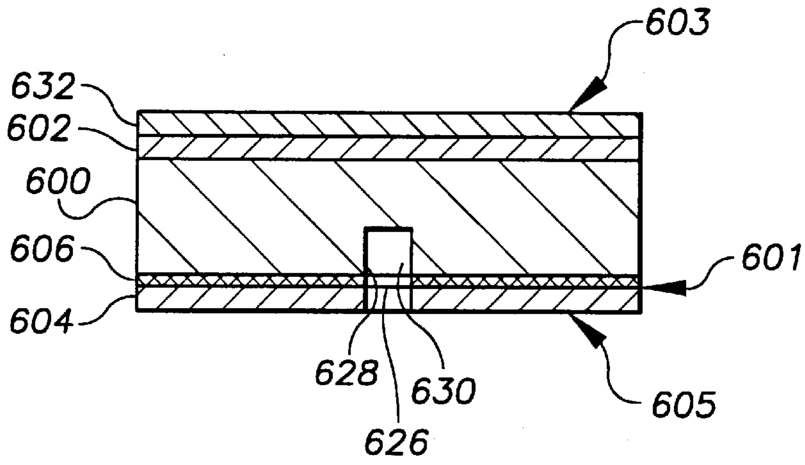
FIG. 56 shows a cross-sectional view of process steps relating to nozzle and through-substrate channel formation using the SMILE aspect of the invention, as part of a continuing fabrication sequence for an ESI device.

FIG. 56 (shown inverted from FIGS. 55A–55B) shows a cross-sectional view of the ESI device 200 prior to nozzle formation using the SMILE aspect of the present invention. A film of positive-working photoresist 632 is deposited on the silicon oxide layer 602 on the ejection side 603 of the substrate 600. Patterns on the ejection side 603 are aligned to those previously formed on the injection side 605 of the substrate 600. Because silicon and its oxide are inherently relatively transparent to light in the infrared wavelength range of the electromagnetic spectrum, i.e., approximately 700–1000 nm, the extant pattern on the injection side 605 can be distinguished with sufficient clarity by illuminating the substrate 600 from the patterned injection side 605 with infrared light. Thus, the photolithographic mask for the ejection side 603 can be aligned within required tolerances. After alignment, a certain area of the photoresist film 632 corresponding to a nozzle orifice that will be subsequently etched is selectively exposed through a photolithographic mask by an optical lithographic exposure tool.

Figure 57A:
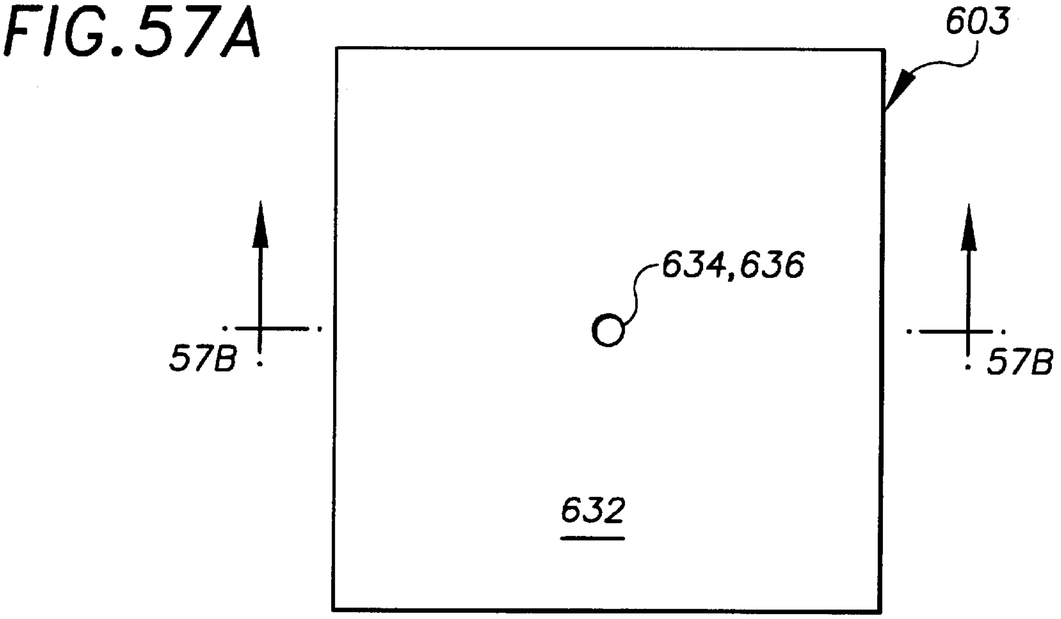
FIG. 57A shows a plan view of process steps relating to nozzle and through-substrate channel formation using the SMILE aspect of the invention, as part of a continuing fabrication sequence for an ESI device.
Figure 57B:
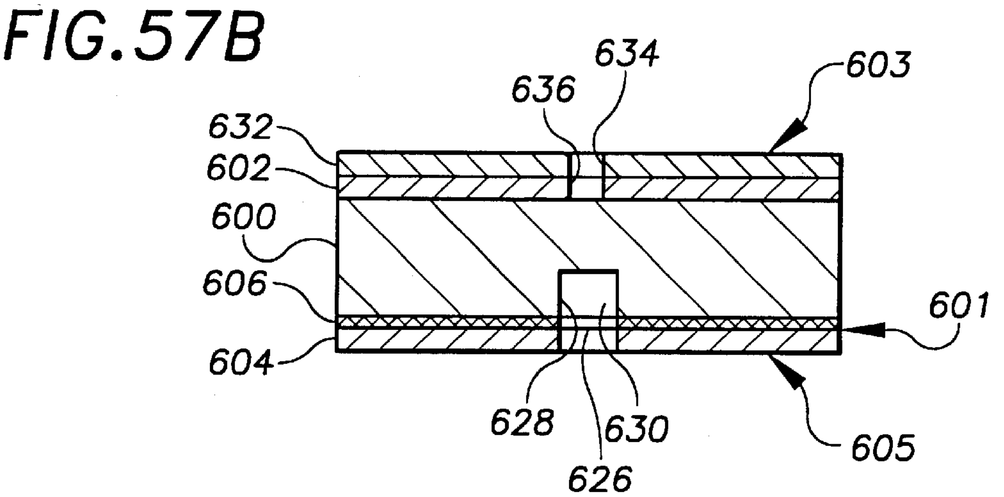
FIG. 57B shows a cross-sectional view of process steps relating to nozzle and through-substrate channel formation using the SMILE aspect of the invention, as part of a continuing fabrication sequence for an ESI device.

As shown in the plan and cross-sectional view, respectively, of FIGS. 57A and 57B, the photoresist 632 is developed to remove the exposed areas of the photoresist such that the nozzle orifice area 634 is open to the underlying silicon oxide layer 602 while the unexposed areas remain protected by photoresist 632. The exposed nozzle orifice area 636 of the silicon oxide layer 602 are then etched by a fluorine-based plasma with a high degree of anisotropy and selectivity to the protective photoresist 632 until the silicon substrate 600 is reached. The remaining photoresist 632 is then removed in an oxygen plasma or in an actively oxidizing chemical bath such as sulfuric acid ($H_2SO_4$) activated with hydrogen peroxide ($H_2O_2$).

Figure 58:
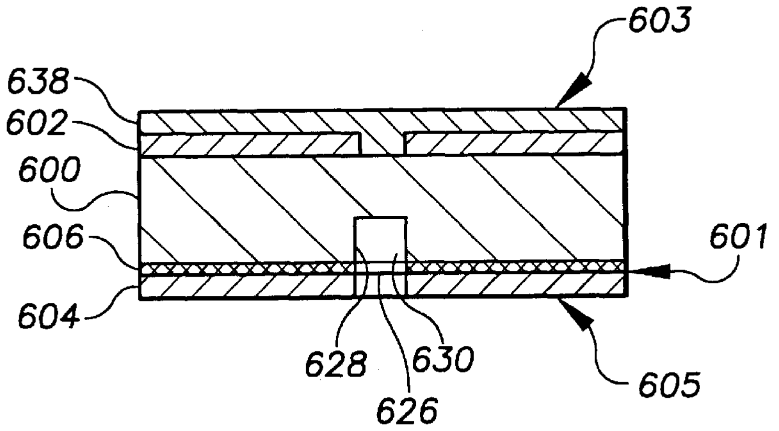
FIG. 58 shows a cross-sectional view of process steps relating to nozzle and through-substrate channel formation using the SMILE aspect of the invention, as part of a continuing fabrication sequence for an ESI device.

Referring now to FIG. 58, a new film of positive-working photoresist 638 is deposited over the ejection side 603 of the substrate 600. After alignment, certain areas of the photoresist film 638 corresponding to a nozzle orifice, a nozzle channel, a nozzle, and a recessed region surrounding and defining the nozzle that will be subsequently etched are selectively exposed through a photolithographic mask by an optical lithographic exposure tool.

Figure 59A:
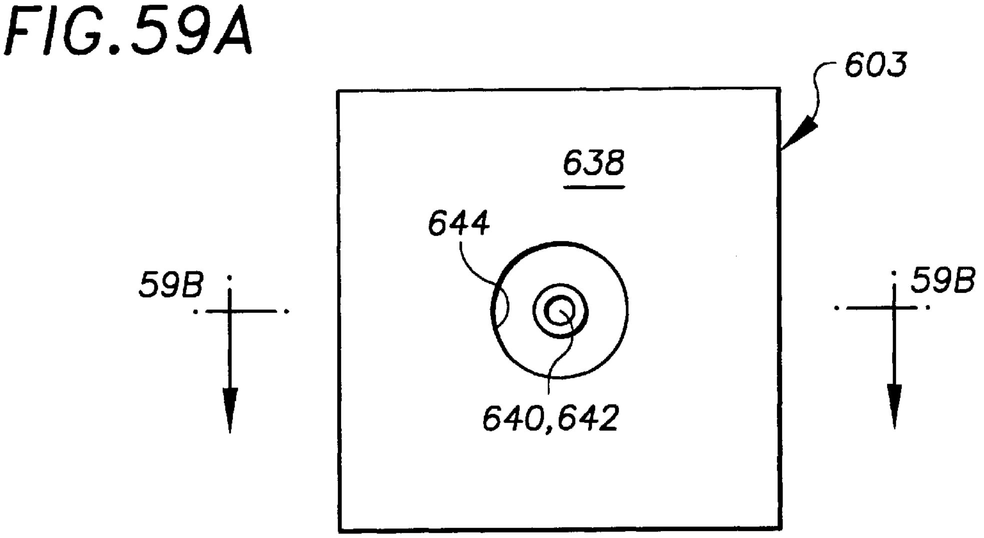
FIG. 59A shows a plan view of process steps relating to nozzle and through-substrate channel formation using the SMILE aspect of the invention, as part of a continuing fabrication sequence for an ESI device.
Figure 59B:
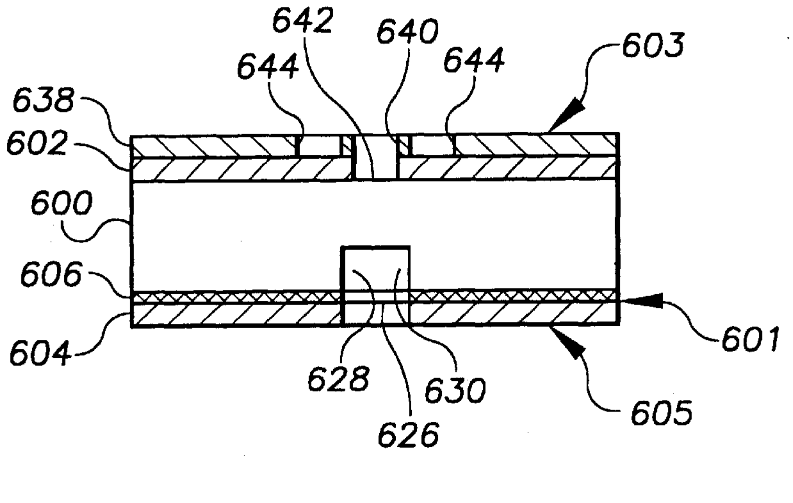
FIG. 59B shows a cross-sectional view of process steps relating to nozzle and through-substrate channel formation using the SMILE aspect of the invention, as part of a continuing fabrication sequence for an ESI device.
Figure 60:
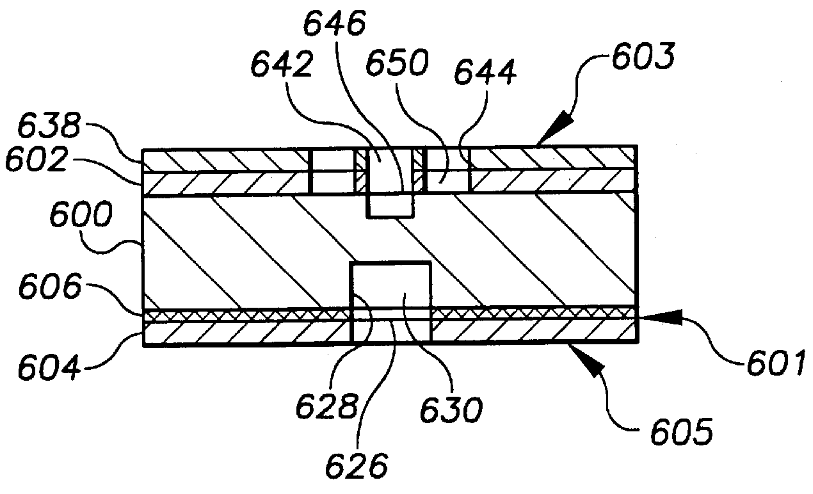
FIG. 60 shows a cross-sectional view of process steps relating to nozzle and through-substrate channel formation using the SMILE aspect of the invention, as part of a continuing fabrication sequence for an ESI device.

As shown in the plan and cross-sectional views, respectively, of FIGS. 59A and 59B, the photoresist 638 is developed to remove the exposed areas of the photoresist such that the exposed area 640 of the photoresist 638 corresponding to a nozzle orifice 642 are open to the silicon substrate 600. An exposed area 644 of the photoresist 638 corresponding to a recessed region is open to the underlying silicon oxide layer 602, while the unexposed areas remain protected by photoresist 638. Referring to the cross-sectional view of FIG. 60, an exposed area 646 of the silicon substrate 600 corresponding to the nozzle orifice 642 is vertically etched into the silicon by a fluorine-based plasma with a high degree of anisotropy and selectivity to the protective photoresist 638 until a desired depth is reached. The remaining photoresist mask 638 is then used to protect unexposed areas while a fluorine-based oxide etch of the exposed silicon oxide area 650 is performed with a high degree of anisotropy and selectivity to the protective photoresist 638 until the silicon substrate 600 is reached.

Figure 61:
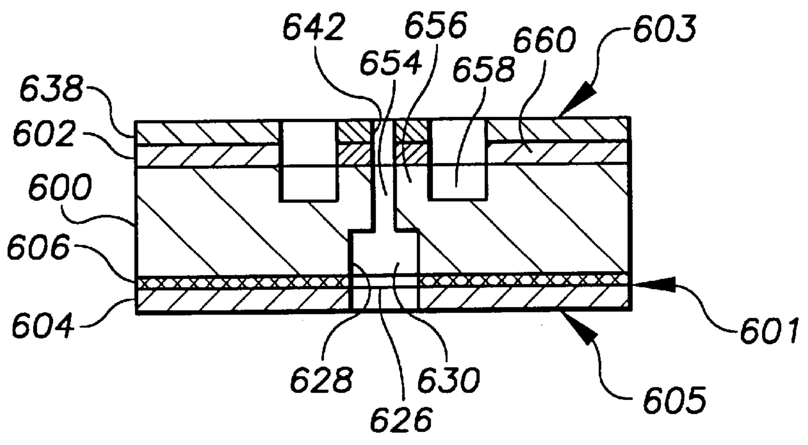
FIG. 61 shows a cross-sectional view of process steps relating to nozzle and through-substrate channel formation using the SMILE aspect of the invention, as part of a continuing fabrication sequence for an ESI device.

As shown in the cross-sectional view of FIG. 61, the remaining photoresist 638 and oxide layer 602 provide masking during a subsequent fluorine-based silicon etch to vertically etch certain patterns into the ejection side 603 of the silicon substrate 600. The fluorine-based silicon etch completes a nozzle channel 630 through the silicon substrate 600 by forming an ejection-side portion 654 of the nozzle channel 630 aligned with and reaching to an injection-side portion 628 of the nozzle channel 630 previously formed. The silicon etch also creates an ejection nozzle 656, a recessed region 658 exterior to the nozzle 656, and a grid-plane region 660 exterior to the nozzle 656 and the recessed region 658 on the ejection side 603 of the substrate 600. The grid-plane region 660 is preferably co-planar with the tip of the nozzle 656 so as to physically protect the nozzle 656 from casual abrasion, stress fracture in handling and/or accidental breakage. The remaining photoresist 638 is then removed in an oxygen plasma or in an actively oxidizing chemical bath such as sulfuric acid ($H_2SO_4$) activated with hydrogen peroxide ($H_2O_2$).

This completes the part of the fabrication sequence corresponding to the SMILE aspect of the present invention. The use of the SMILE process ensures that the nozzle 656 is etched to the desired height while still ensuring that the nozzle channel 630 is completed.

Oxidation for Electrical Isolation and Biocompatibility

Figure 62:
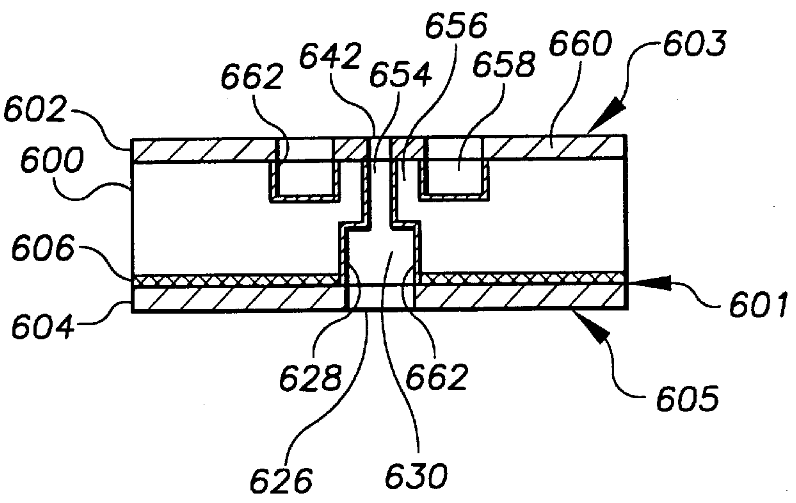
FIG. 62 shows a cross-sectional view of an ESI device after passivation oxidation.
Figure 63:
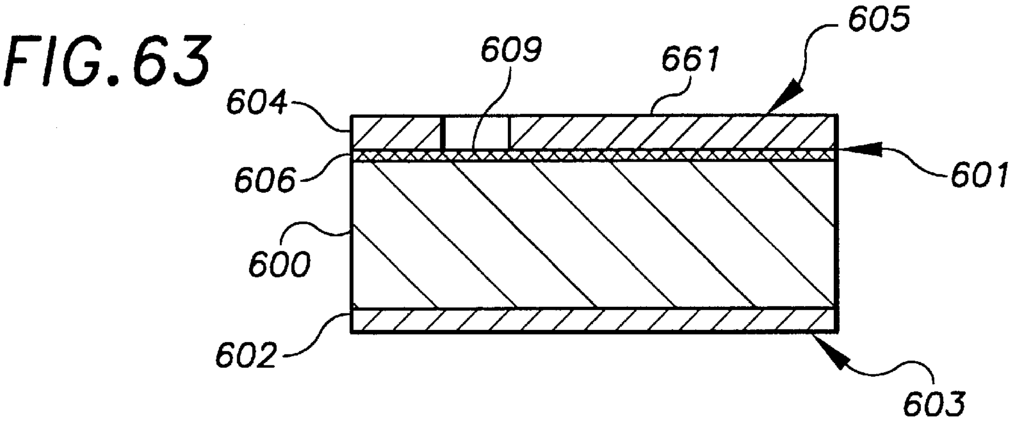
FIG. 63 shows a cross-sectional view of the formation of electrical contact to the substrate in the fabrication of an ESI device.

As shown in the cross-sectional view of FIG. 62, a layer of silicon oxide 662 is grown on all silicon surfaces of the substrate 600 by subjecting the substrate 600 to elevated temperature in an oxidizing ambient. For example, the oxidizing ambient may be an ultra-pure steam produced by oxidation of hydrogen for a silicon oxide thickness greater than approximately several hundred nanometers or pure oxygen for a silicon oxide thickness of approximately several hundred nanometers or less. The layer of silicon oxide 662 over all silicon surfaces of the substrate electrically isolates a fluid in the nozzle channel 630 from the silicon substrate 600 and permits the application and sustenance of different electrical potentials to the fluid in the channel. In addition to electrical isolation, oxidation renders a surface relatively inactive compared to a bare silicon surface, resulting in surface passivation and enhanced biocompatibility.

Injection Surface Processing: Contacts and Metallization

FIGS. 63–67B (shown inverted from FIG. 62) illustrate the formation of electrical contact to the substrate 600 by completion of the delayed LOCOS aspect of the present invention and metallization. As shown in the cross-sectional view of FIG. 63, and referring back to FIG. 53, an unmasked fluorine-based etch is first done to remove surface oxide 618 that has grown on the nitride contact pattern 608 as a result of the several oxidations that formed masking oxides 602, 604 and the isolation oxide 662. Next, a blanket (unmasked) fluorine-based etch is done until the silicon substrate 600 is reached in the contact area 609, etching through the silicon nitride layer 608 and the underlying silicon oxide layer 604. Since oxide is uniformly removed from the injection side 605, care must be taken to halt the etch once the silicon substrate 600 is reached. The contact area 609 preferentially clears while leaving grid-plane regions 661 exterior to the contact area 609 still protected by silicon oxide 604 because the nitride 608 strongly inhibited oxide growth in the contact area 609 during the aforementioned oxidations.

In alternative embodiments, as discussed above in the context of the third aspect of the present invention (delayed LOCOS), the contact areas may also be cleared by hot phosphoric acid etching of the nitride or by shadow-masked etching.

Figure 64:
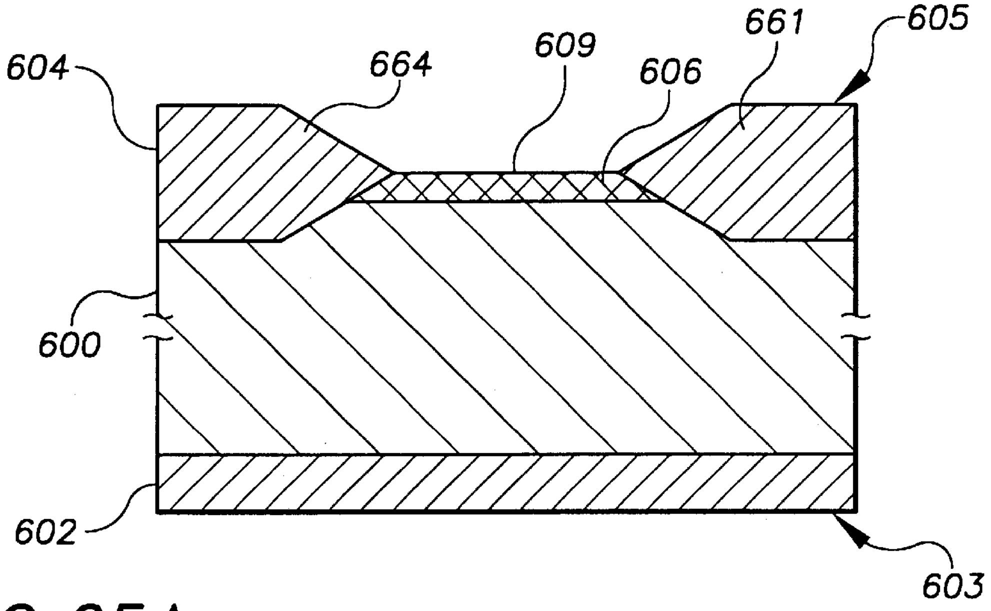
FIG. 64 shows a cross-sectional view of the formation of electrical contact to the substrate in the fabrication of an ESI device.

FIG. 64 shows a detailed cross-sectional view of the contact area 609 and adjacent areas in order to illustrate another advantage of the use of the delayed LOCOS aspect of the present invention. As a result of the lateral diffusion of oxidizing species under the edge of the nitride layer 608 adjacent the grid-plane region 661 during oxidation, a transitional region of silicon oxide 664 is grown, so that there is not an abrupt step from the silicon substrate 600 at the bottom of the contact area 609 to the height of the surrounding oxide layer 604. This transitional region is referred to in the art as a "bird's beak". The non-abrupt topography of the bird's beak provides a significant advantage in the remaining process block (metallization).

Figure 65A:
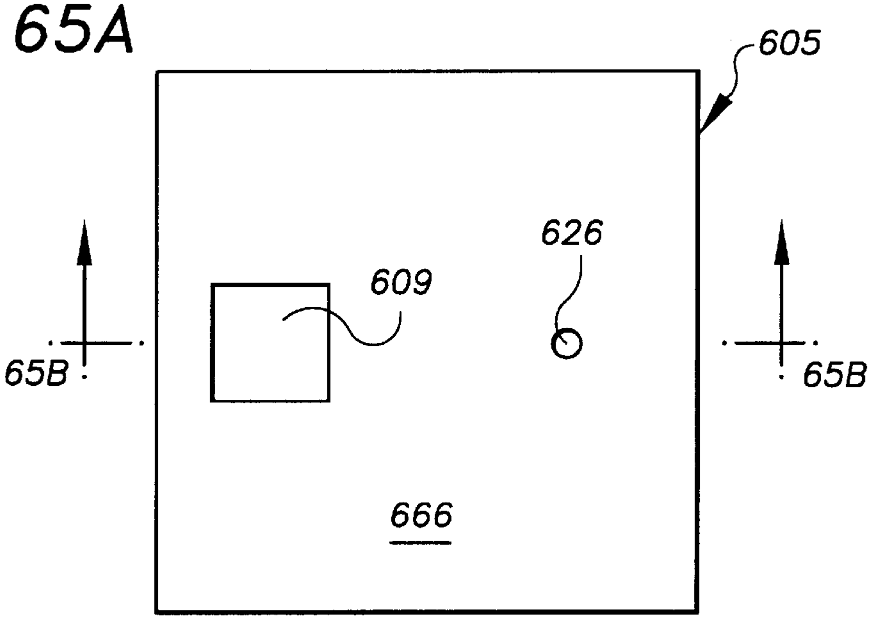
FIG. 65A shows a plan view of the formation of electrical contact to the substrate in the fabrication of an ESI device.
Figure 65B:
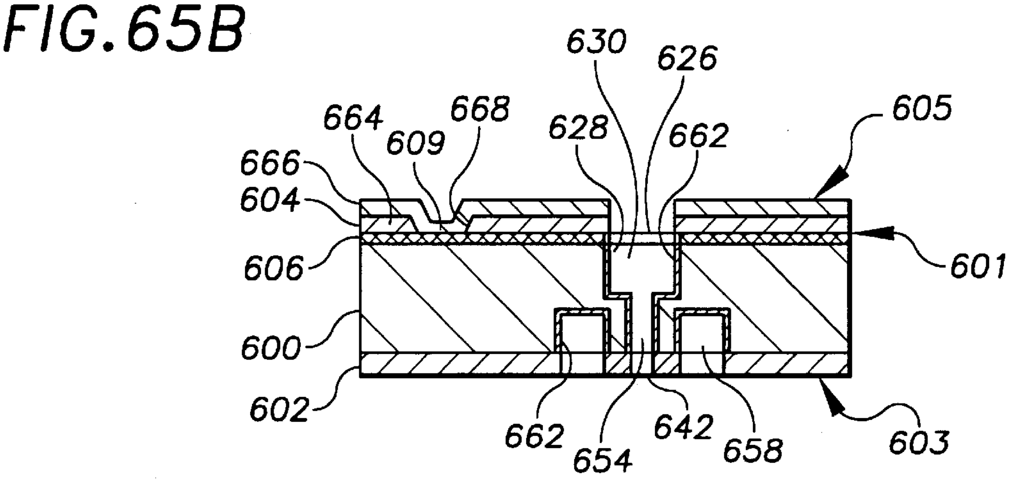
FIG. 65B shows a cross-sectional view of the formation of electrical contact to the substrate in the fabrication of an ESI device.

Referring to the plan and cross-sectional views of FIGS. 65A and 65B, a conductive film 666 such as aluminum may be uniformly deposited on the injection side 605 of the substrate 600, including on contact sidewalls 668 and onto the contact area 609. The bird's beak topography, as characterized by the silicon oxide transitional region 664, ensures continuous contact sidewall 668 coverage into the contact area 609. The slope is exaggerated in FIG. 65B to effectively show the required contact sidewall 668 coverage. The conductive film 666 may be deposited by any standard deposition technique, including evaporation and sputtering, that produces a continuous film of the conductive material on the contact sidewalls 668.

Figure 66:
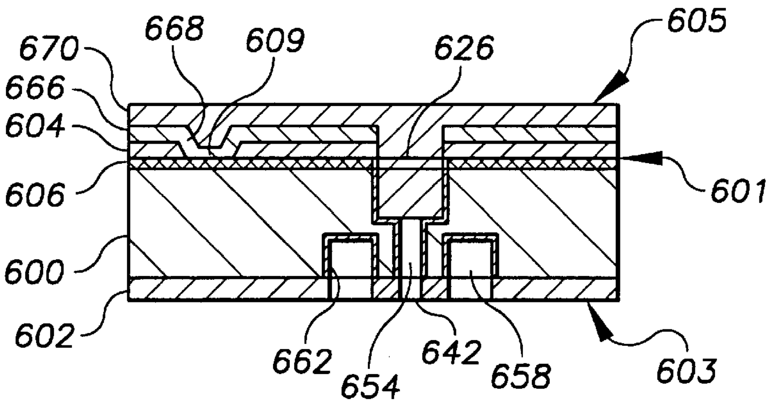
FIG. 66 shows a cross-sectional view of the formation of electrical contact to the substrate in the fabrication of an ESI device.

As shown in the cross-sectional view of FIG. 66, a film of positive-working photoresist 670 is deposited over the injection side 605 of the substrate 600. After alignment, certain areas of the photoresist film 670 corresponding to an injection interface area that will be subsequently etched are selectively exposed through a photolithographic mask by an optical lithographic exposure tool.

Figure 67A:
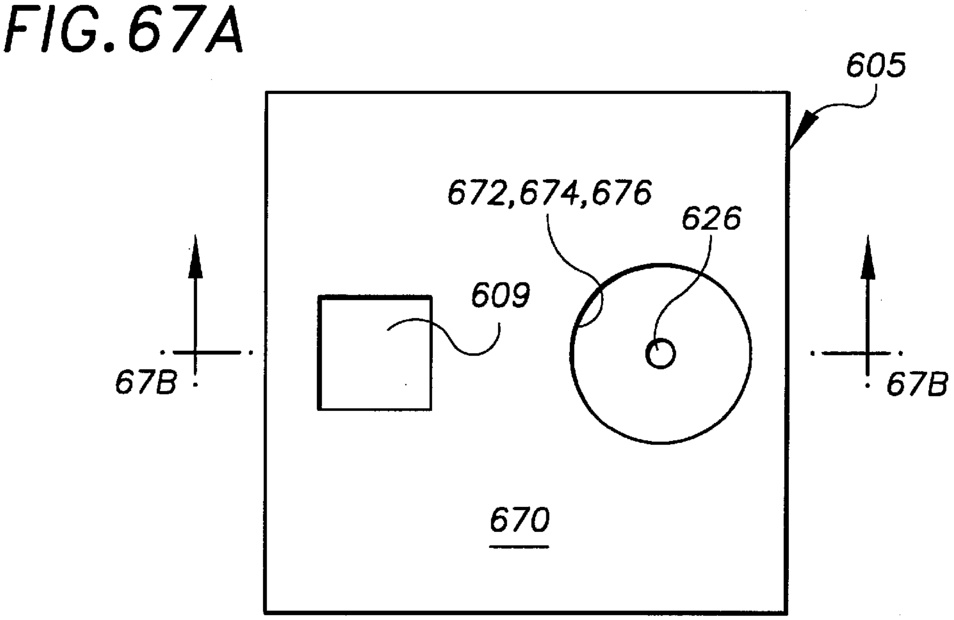
FIG. 67A shows a plan view of the formation of electrical contact to the substrate in the fabrication of an ESI device.
Figure 67B:
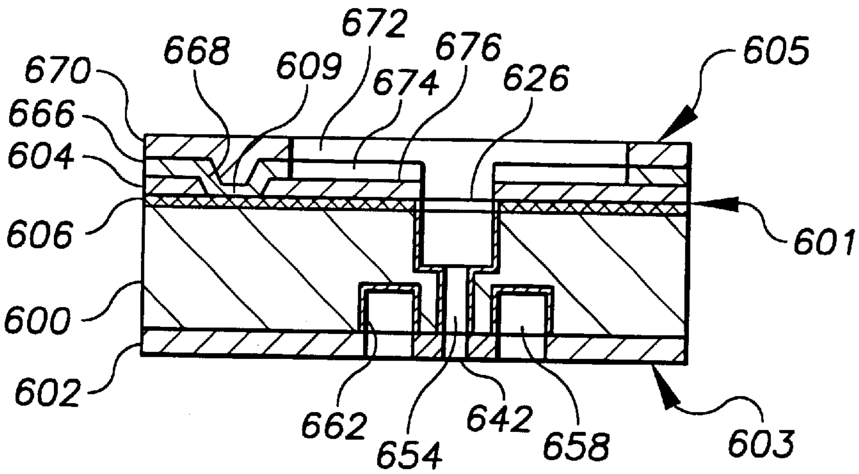
FIG. 67B shows a cross-sectional view of the formation of electrical contact to the substrate in the fabrication of an ESI device.

Referring to the plan and cross-sectional views, respectively, of FIGS. 67A and 67B, the photoresist 670 is developed to remove the exposed areas of the photoresist 670 such that an exposed area 672 corresponding to an injection interface is open to the underlying conductive layer 666 while the unexposed areas remain protected by photoresist 670. An exposed area 674 of the conductive layer 666 corresponding to an injection interface is then etched by any standard thin-film etching technique, including wet-chemical-based as well as plasma-based reactive-ion etching. In the preferred embodiment, the conductive layer is aluminum. In this embodiment, wet etching of the aluminum film may be done in a solution of phosphoric, nitric, and acetic acids. Reactive-ion etching of the aluminum film may be done with chlorine-based plasma chemistry. The etch, whether wet or dry, must be selective to the underlying silicon oxide layer 604, or is terminated upon reaching the silicon oxide layer 604 as determined by the etch rate and time. The etch creates an injection interface area 676 on the injection side 605 of the substrate 600. The purpose of the injection interface area 676 is to provide a portion of the injection side 605 for establishing an interface between a fluid delivery system and the ESI device 200.

Figure 68:
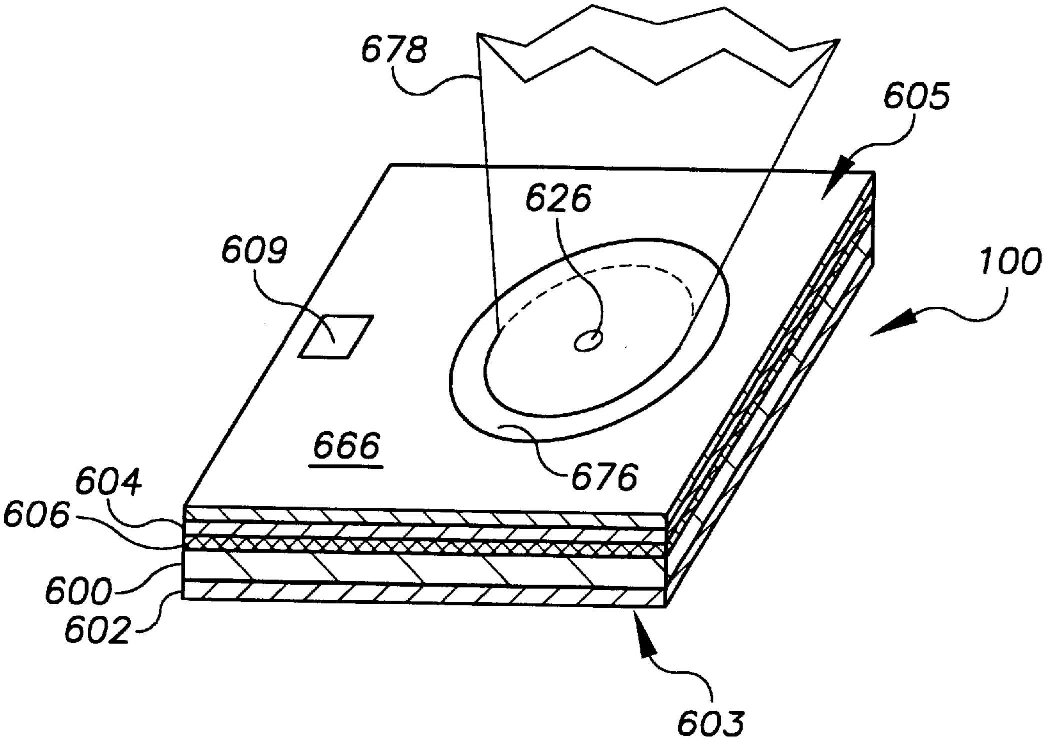
FIG. 68 shows a perspective view of a fluid delivery system and an ESI device.

FIG. 68 shows a perspective view of a fluid delivery system 678 and an ESI device 200. The fluid delivery system 678 shown in FIG. 68 may be, for example, a capillary or a micropipette tip. The conductive layer 666 must be removed from the injection interface area 676 according to the foregoing procedure so as to prevent electrical contact between a fluid delivered by the fluid delivery system 678 to the injection orifice 626 and the conductive layer 666, which is electrically connected to the substrate 600 in the contact area 609. The remaining photoresist 670 is removed in a plasma or in a solvent bath such as acetone.

Figure 69A:
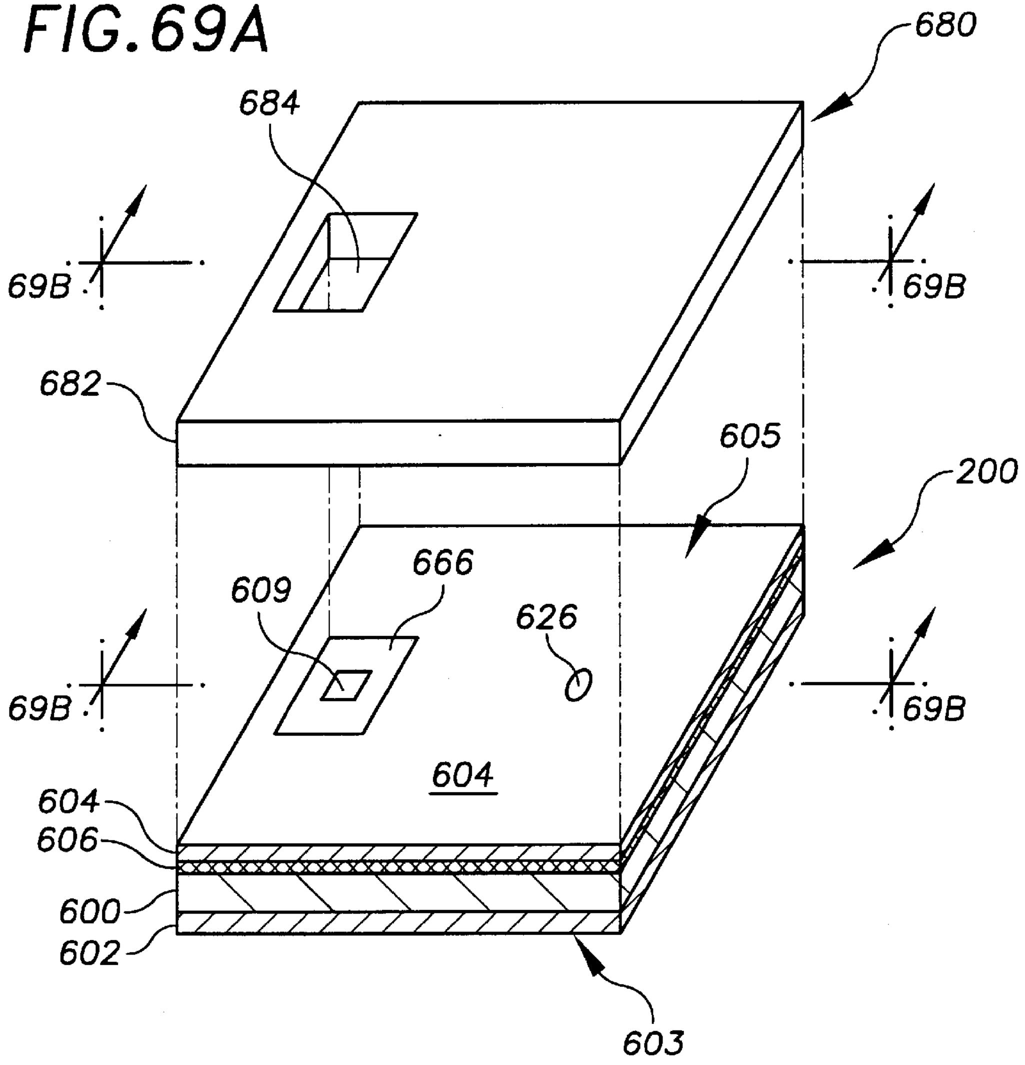
FIG. 69A shows an exploded perspective of an alternative method of metallization involving the use of a shadow mask in the fabrication of an ESI device.
Figure 69B:
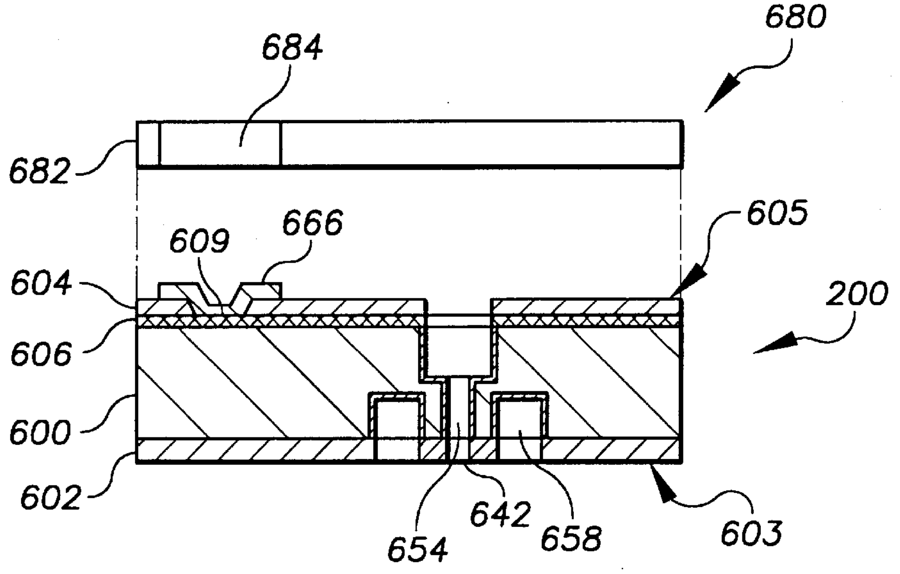
FIG. 69B shows an exploded cross-sectional view of an alternative method of metallization involving the use of a shadow mask in the fabrication of an ESI device.

In an alternative method, shown in exploded perspective and cross-sectional views in FIGS. 69A and 69B, respectively, a shadow mask 680 is used to ensure that the conductive film 666 is not deposited adjacent the injection orifice 626. The shadow mask 680 is a solid, rigid substrate 682 in which a through-hole 684 has been created by any of a number of suitable means, including etching and stamping. In this alternative method, the shadow mask 680 is held in alignment during the deposition of the conductive film 666, then removed. Any standard deposition technique may be used, including evaporation and sputtering. Inasmuch as the conductive layer 666 is deposited as a pattern in this alternative embodiment, the lithographic patterning and etching steps as shown in FIGS. 66–67B are not required.

The foregoing process is provided for two purposes: first, to provide a significantly improved process for the fabrication of ESI devices; and second, to illustrate the application of the two fundamental aspects disclosed hereinabove. A practitioner skilled in the art will recognize that (a) any or all of the aspects may be incorporated without altering the essential functionality of the device, and that (b) any or all of the aspects may be applied to other devices having similar or dissimilar functionality. The two fundamental aspects are mutually compatible and act individually and in concert to significantly enhance the manufacturability of the ESI device. In an alternative embodiment of this aspect of the present invention, the contacts are formed on the ejection surface rather than the injection surface. In further alternative embodiments, only one of the two aspects is incorporated in the integrated process for fabricating an ESI device. The essential outcome from incorporation of the fundamental aspects is a significant improvement in manufacturing yield, and in the case of the SMILE aspect, significant extension of permissible design geometries.

Improved Liquid Chromatography (LC) Device Fabrication Procedure

The sixth aspect of the present invention, the fabrication of an LC device, is explained with reference to FIGS. 70–89B. A process to fabricate an LC device is shown in block form in FIG. 70. It will be apparent to a skilled practitioner of the art that subtle changes may be made in the detailed process without materially affecting the function and form of the resulting device. As one example, the insertion or deletion of a wafer cleaning step may have a measurable impact on manufacturing yield, but will have no influence on the form, appearance, or function of a successfully yielding device. The block process shown incorporates two of the fundamental aspects of the present invention, latent masking and delayed LOCOS, to significantly improve fabrication reliability and manufacturing yield. The outcome of this particular process sequence is an LC device 300 (FIGS. 71A–71C) in which a silicon substrate 800 defines an introduction channel 834 between an entrance orifice 830 and a reservoir 864, a separation channel 868 between the reservoir 864 and a separation channel terminus 870, and an exit channel 840 between the separation channel terminus 870 and an exit orifice 836; the LC device 300 further including a second substrate 900 attached to the separation surface 805 of the first substrate 800 so as to enclose the reservoir 864 and separation channel 868. The separation channel 868 is populated with separation posts 872 extending from a side wall of the separation channel 868 perpendicular to the fluid flow through the separation channel 868. Preferably, the separation posts 872 do not extend beyond and are preferably co-planar with the separation surface 805 of the substrate 800. All surfaces of the LC device 300 preferably have a layer of silicon oxide 874 to electrically isolate a fluid sample from the substrate 800 and to provide for biocompatibility.

Figure 70:
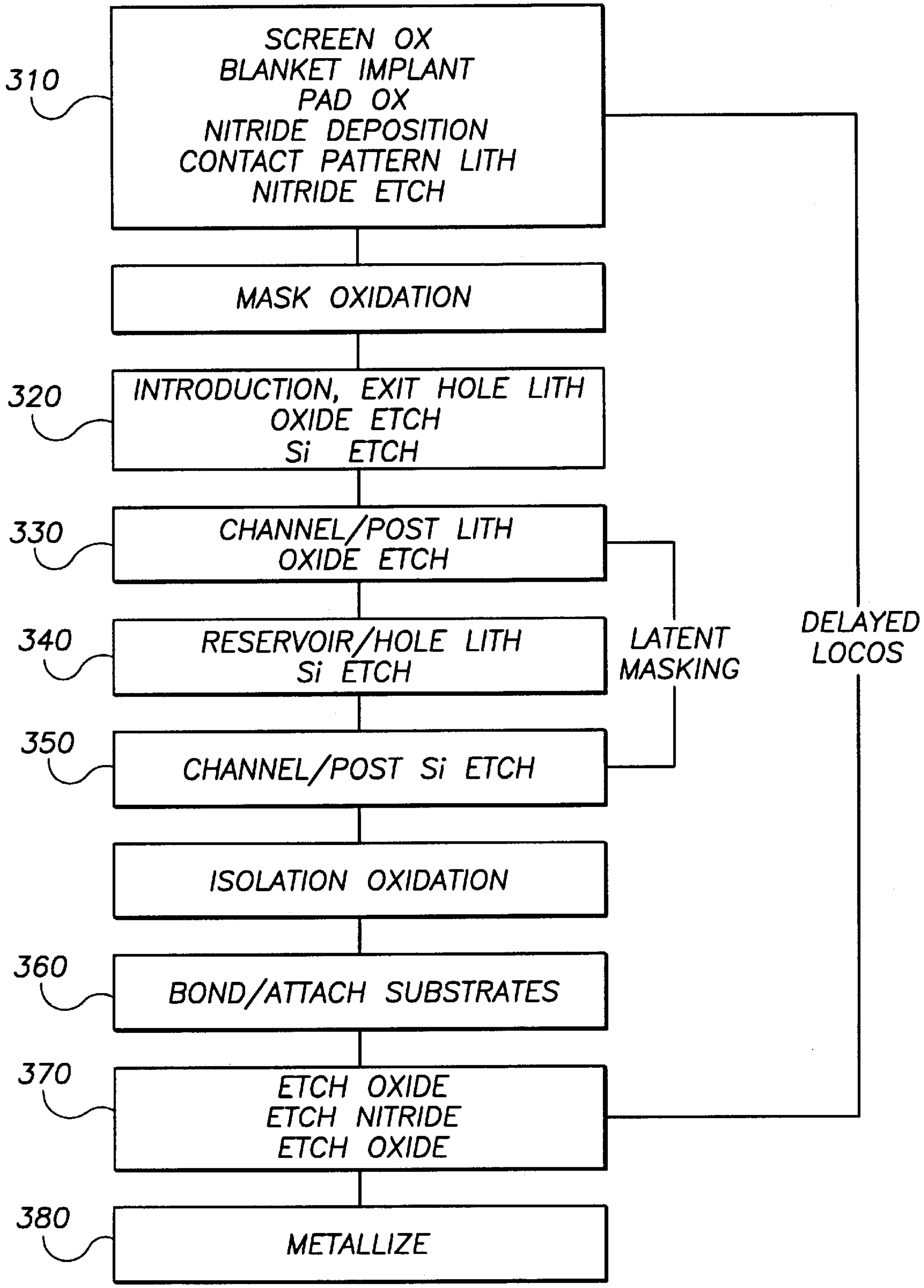
FIG. 70 shows a block process sequence for fabricating an LC device.

Two fundamental aspects of the present invention, latent masking and delayed LOCOS, are incorporated in the integrated fabrication sequence in the manner shown in FIG. 70. After any preparatory processing, the nitride deposition and patterning steps for the delayed LOCOS process are performed on the introduction surface as shown at 310. Next, the introduction and exit channels are defined and etched on the introduction side of the substrate as shown at 320. The separation channel and separation posts are then patterned on the separation surface according to the latent masking process as shown at 330. After patterning and etching of a fluid reservoir and portions of the introduction and exit channels on the separation side of the substrate, as shown at 340, the delayed channel/post etch is performed using the latent mask as shown at 350. The substrate is then attached or bonded to the second substrate as shown at 360. Finally, the delayed LOCOS process is completed by opening the required contact hole, as shown at 370, followed by metallization as shown at 380.

Introduction Surface Processing: Contact Pattern Definition (Delayed LOCOS)

Figure 71A:
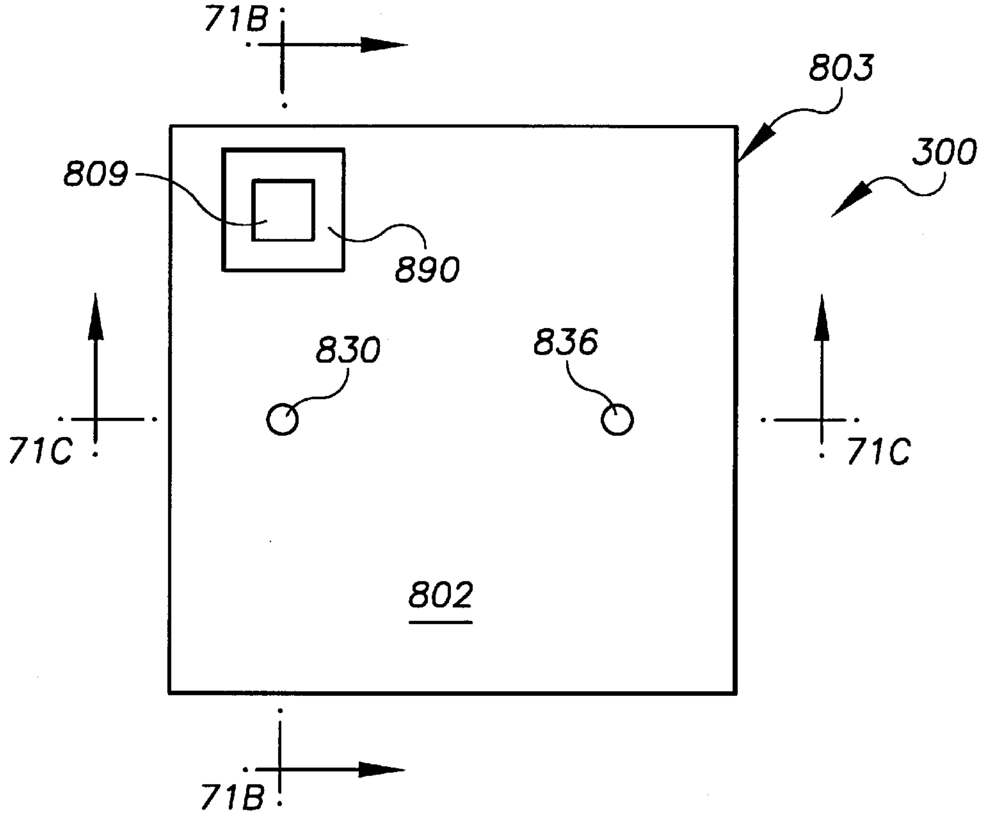
Figure 71B:
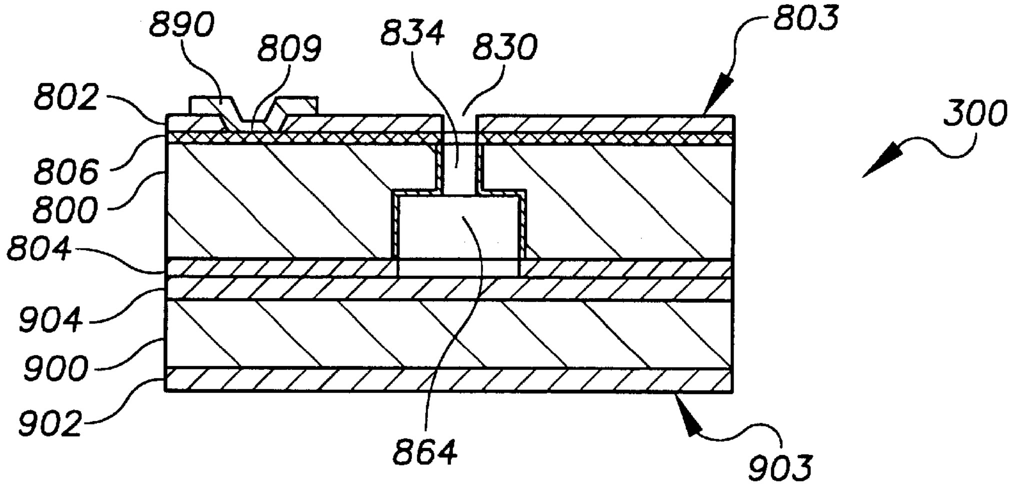
Figure 71C:
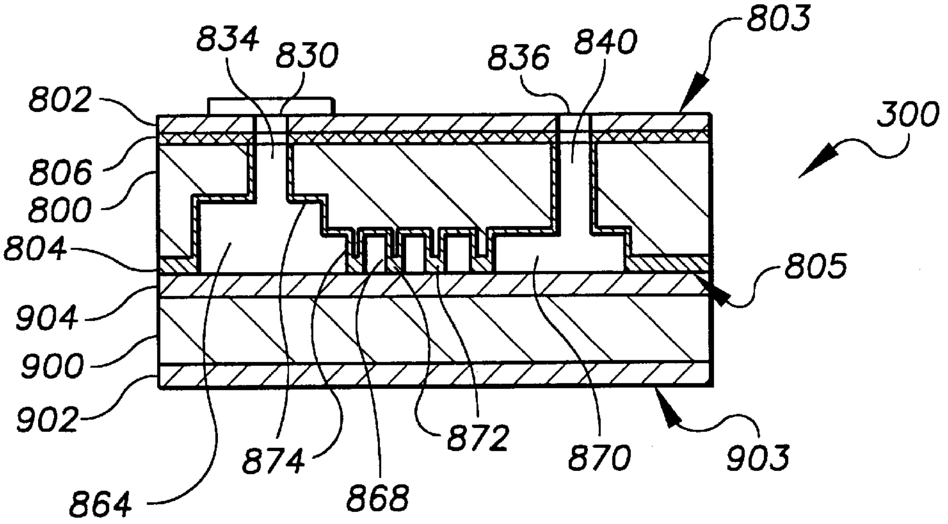
Figure 72A:
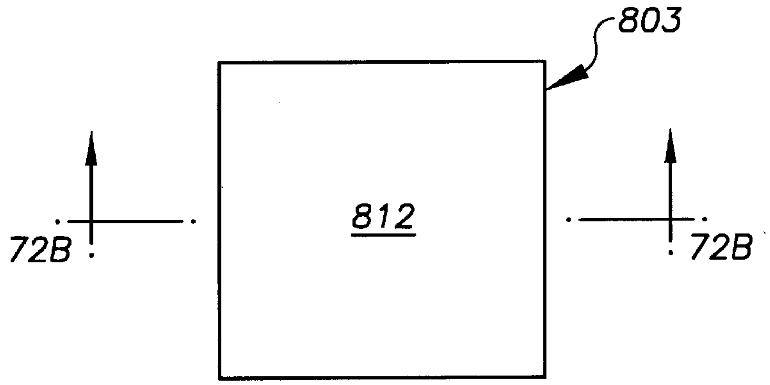
Figure 72B:
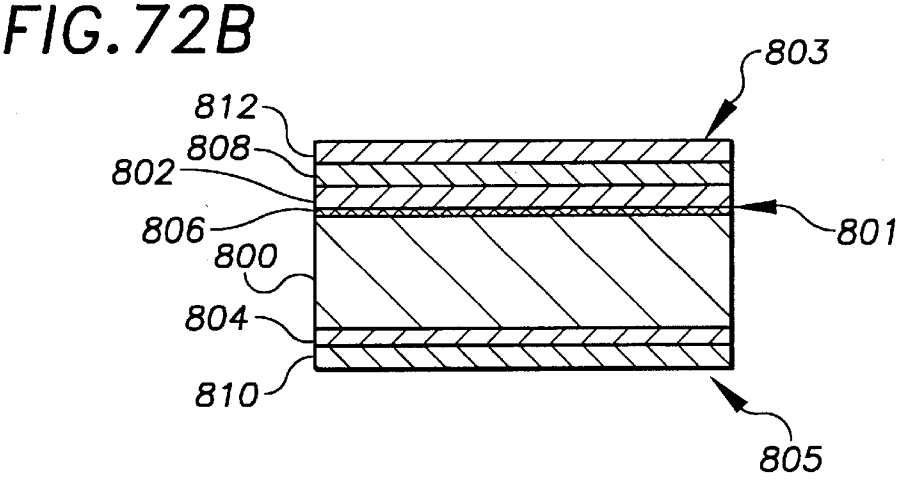

FIGS. 72A and 72B illustrate the initial processing steps for the introduction side of the first substrate in fabricating an LC device 300 (FIGS. 71A–71C). A double-side-polished silicon wafer substrate 800 is subjected to an elevated temperature in an oxidizing ambient to grow a layer or film of silicon oxide 802 on an introduction side 803 and a layer or film of silicon oxide 804 on a separation side 805 of the substrate 800. Each of the resulting silicon oxide layers 802, 804 has a thickness of approximately 10–20 nm. The silicon oxide layer 802 provides some protection to the surface of the silicon substrate 800 at a silicon/silicon oxide interface 801.

A high-dose implantation is made through the silicon oxide layer 802 to form an implanted region 806 to ensure a low-resistance electrical connection between an electrode that will be formed at a later stage of the process and the substrate 800. If the starting substrate 800 is acceptor-doped (i.e., p-type) the high-dose implantation is done with a p-type species such as boron, resulting in a p+ implanted region 806. If the starting substrate 800 is donor-doped (i.e., n-type) the high-dose implantation is done with an n-type species such as arsenic or phosphorus, resulting in an n+ implanted region 806.

A layer or film of silicon nitride 808 is deposited on the silicon oxide layer 802 on the introduction side 803 of the substrate 800. Deposition of the silicon nitride layer 808 is done in the preferred embodiment by low-pressure chemical vapor deposition (LPCVD), which also deposits a layer of silicon nitride 810 on the separation side 805 of the substrate 800. Each of the resulting silicon nitride layers 808, 810 has a thickness of approximately 150–200 nm. Deposition of the silicon nitride layer 808 may alternatively be done by plasma-enhanced chemical vapor deposition (PECVD).

Figure 72C:
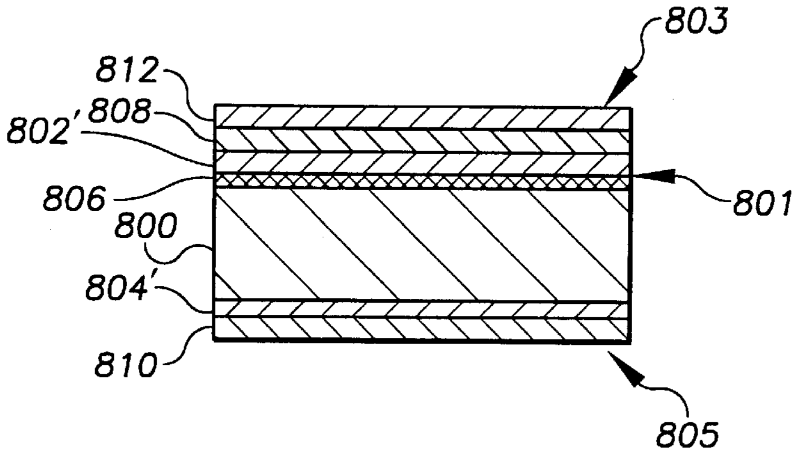
Figure 73A:
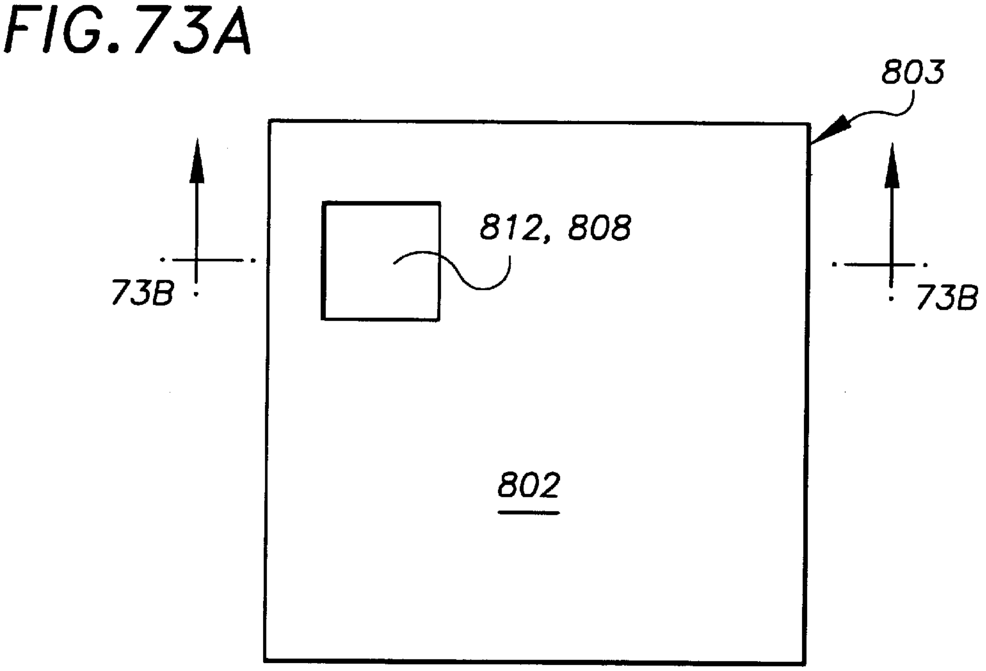
Figure 73B:
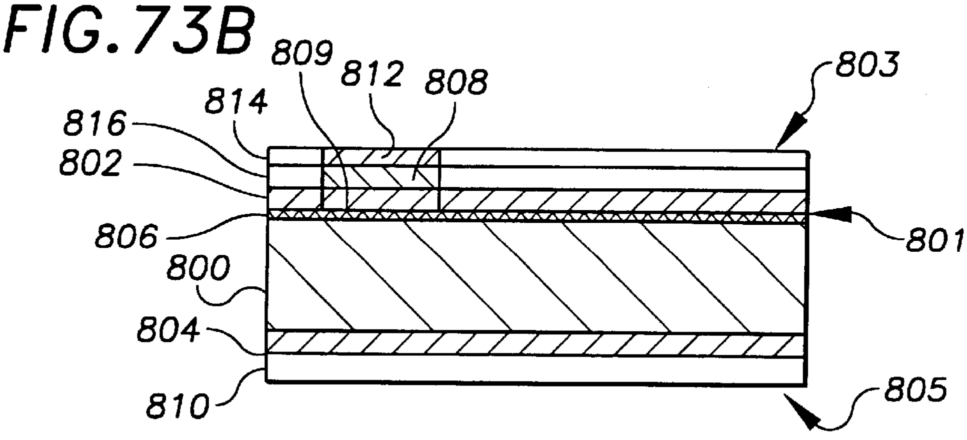

In an alternative method shown in the cross-sectional view of FIG. 72C, the silicon oxide layer 802 is removed after the high-dose implantation, the silicon oxide layer 802 having presumptively been damaged by the implantation. Removal is preferably accomplished by immersion in hydrofluoric acid (HF) or a buffered solution of HF. Silicon oxide layer 804 would be simultaneously removed. After removal, silicon oxide layers 802', 804' are then re-grown to a thickness of 10–20 nm by subjecting the substrate 800 to an elevated temperature in an oxidizing ambient.

Referring back to FIGS. 72A and 72B, a film of positive-working photoresist 812 is deposited on the silicon nitride layer 808 on the introduction side 803 of the substrate 800. All areas of the photoresist 812, exclusive of a contact area that will be protected by silicon nitride until ultimately being opened to form a contact to the substrate 800, are selectively exposed through a mask by an optical lithographic exposure tool. As shown in the plan and cross-sectional views, respectively, of FIGS. 73A and 73B, after development of the photoresist 812 the exposed area 814 of the photoresist is removed and open to the underlying silicon nitride layer 808, while the unexposed areas remain protected by photoresist 812. An exposed area 816 of the silicon nitride layer 808 is then etched by a fluorine-based plasma with a high degree of anisotropy and selectivity to the protective photoresist 812 until the silicon oxide layer 802 is reached. Next, the entire layer of silicon nitride 810 on the separation side 805 of the substrate 800 is etched by a fluorine-based plasma until the silicon oxide layer 804 is reached. Any remaining photoresist 812 on the introduction side 803 of the substrate 800 is then removed in an oxygen plasma or in an actively oxidizing chemical bath such as sulfuric acid ($H_2SO_4$) activated with hydrogen peroxide ($H_2O_2$).

This completes the first set of process steps for the delayed LOCOS aspect of the present invention. The area of the silicon substrate 800 directly below the patterned silicon nitride layer 808 will ultimately become the contact area 809 to the substrate 800 when the nitride layer 808 is removed prior to metallization.

Oxidation for Masked Silicon Etching

Figure 74:
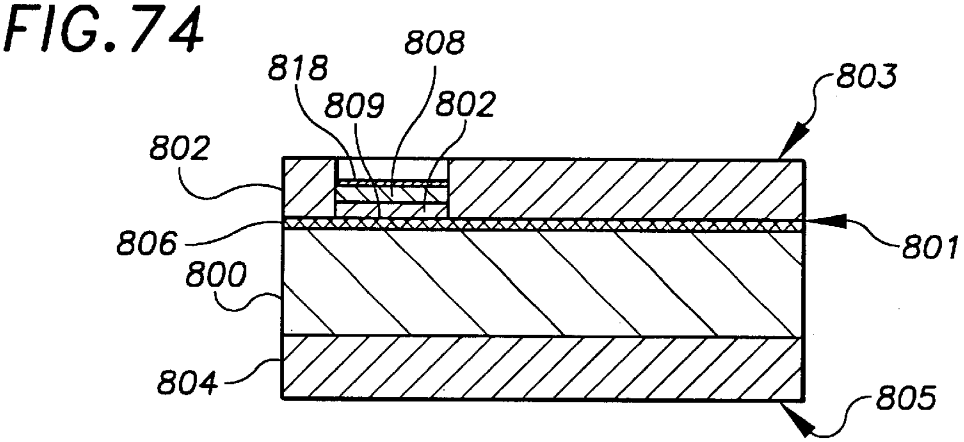

Referring to FIG. 74, the silicon oxide layer 802 is made thicker on the introduction side 803 of the substrate 800 by subjecting the silicon substrate 800 to elevated temperature in an oxidizing ambient. The silicon oxide layer 804 is also made thicker on the separation side 805 of the substrate 800 at the same time by the same means. For example, the oxidizing ambient may be an ultra-pure steam produced by oxidation of hydrogen for a silicon oxide thickness greater than approximately several hundred to several thousand nanometers, or pure oxygen for a silicon oxide thickness of approximately several hundred nanometers or less. In the preferred embodiment, the silicon oxide layers 802, 804 are increased in thickness to 150–200 nm. The layers of silicon oxide 802, 804 provide electrical isolation and also serve as masks for subsequent selective etching of certain areas of the silicon substrate 800. As a result of the oxidation of a small amount of the silicon nitride layer 808 on the introduction side 803 of the substrate 800, a thin silicon oxide layer 818 is formed on the silicon nitride layer 808.

Figure 75:
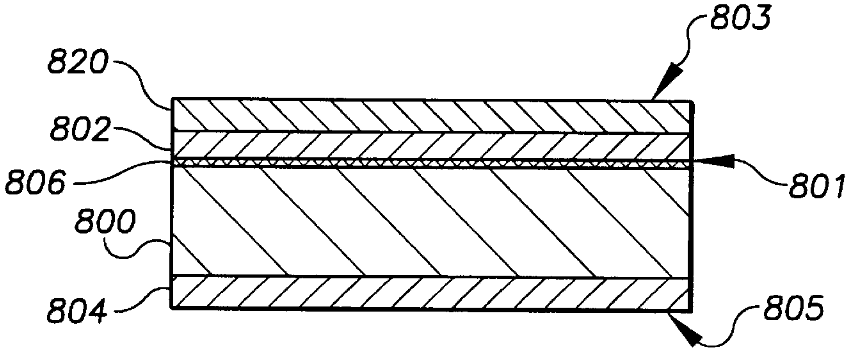

As shown in the cross-sectional view of FIG. 75, a film of positive-working photoresist 820 is deposited on the silicon oxide layer 802 on the introduction side 803 of the substrate 800. After alignment, certain areas of the photoresist film 820 corresponding to an introduction orifice and an exit orifice that will be subsequently etched are selectively exposed through a lithographic mask by an optical lithographic exposure tool.

Figure 76A:
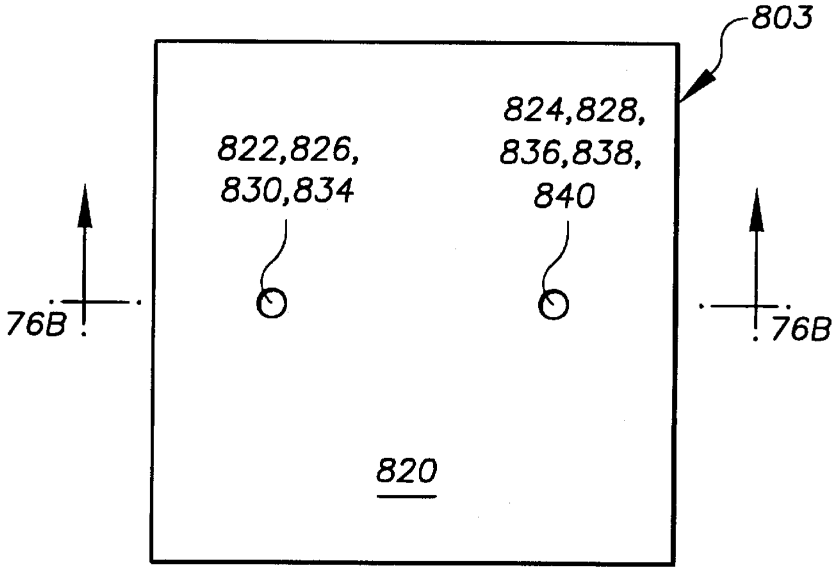
Figure 76B:
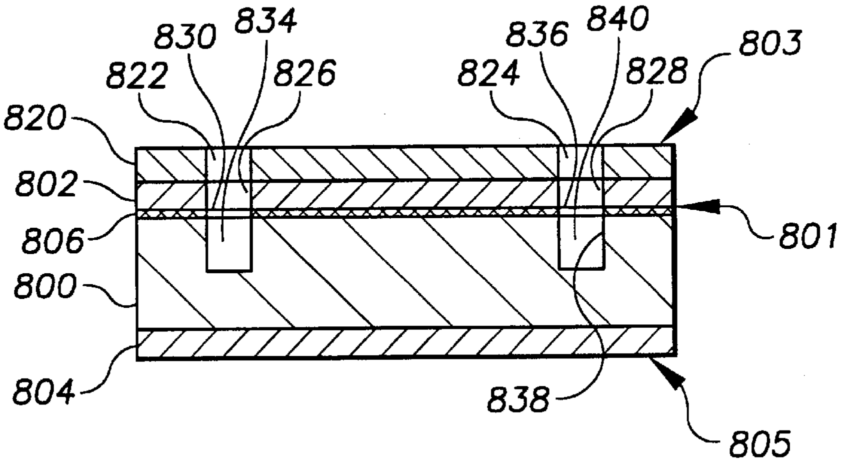

Referring to the plan and cross-sectional views, respectively, of FIGS. 76A and 76B, after development of the photoresist 820, an exposed area 822 of the photoresist corresponding to the introduction orifice and an exposed area 824 of the photoresist corresponding to the exit orifice are removed and open to the underlying silicon oxide layer 802, while the unexposed areas remain protected by photoresist 820. The exposed areas 826, 828 of the silicon oxide layer 802 corresponding to the introduction orifice and the exit orifice, respectively, are then etched by a fluorine-based plasma with a high degree of anisotropy and selectivity to the protective photoresist 820 until the silicon substrate 800 is reached.

The remaining photoresist 820 and unexposed areas of the silicon oxide layer 802 provide masking during a subsequent fluorine-based silicon etch to vertically etch certain patterns into the introduction side 803 of the silicon substrate 800. The fluorine-based silicon etch creates an introduction orifice 830, an introduction channel 834, an exit orifice 836, and an introduction-side portion 838 of an exit channel 840 in the silicon substrate 800. The remaining photoresist 820 is then removed in an oxygen plasma or in an actively oxidizing chemical bath such as sulfuric acid ($H_2SO_4$) activated with hydrogen peroxide ($H_2O_2$).

Separation Surface Processing: Latent Mask Definition

A latent mask for eventual use in fabricating separation posts and channels is now defined. As shown in the cross-sectional view in FIG. 77, a film of positive-working photoresist 842 is deposited on the silicon oxide layer 804 on the separation side 805 of the substrate 800. Patterns on the separation side 805 are aligned to those previously formed on the introduction side 803 of the substrate 800. Because silicon and its oxide are inherently relatively transparent to light in the infrared wavelength range of the electromagnetic spectrum, i.e., approximately 700–1000 nm, the extant pattern on the introduction side 803 can be distinguished with sufficient clarity by illuminating the substrate 800 from the patterned introduction side 803 with infrared light. Thus, the photolithographic mask for the separation side 805 can be aligned within required tolerances. After alignment, certain areas of the photoresist film 842 corresponding to a reservoir, separation channel separation posts, and separation channel terminus that will be subsequently etched are selectively exposed through a lithographic mask by an optical lithographic exposure tool.

Referring to the plan and cross-sectional views, respectively, of FIGS. 78A and 78B, after development of the photoresist 842 the exposed areas 844, 846, 848 of the photoresist corresponding to the reservoir, separation channel, and separation channel terminus, respectively, are removed and open to the underlying silicon oxide layer 804 while the unexposed areas remain protected by photoresist 842. The protected areas 850 of the silicon oxide layer 804 correspond to the pattern of separation posts. The exposed areas 852, 854, 856 of the silicon oxide layer 804 corresponding to the reservoir, separation channel and separation channel terminus, respectively, are then etched by a fluorine-based plasma with a high degree of anisotropy and selectivity to the protective photoresist 842 until the silicon substrate 800 is reached. The remaining photoresist 842 is then removed in an oxygen plasma or in an actively oxidizing chemical bath such as sulfuric acid ($H_2SO_4$) activated with hydrogen peroxide ($H_2O_2$). This concludes the definition of the latent channel/post mask.

Separation Surface Processing: Reservoir and Exit Channel

As shown in the cross-sectional view of FIG. 79, a film of positive-working photoresist 858 is deposited on the separation side 805 of the substrate 800. The photoresist film 858 uniformly and continuously covers areas that are open through the silicon oxide layer 804 to the silicon substrate 800 as well as remaining areas of the silicon oxide layer 804. Areas of the photoresist film 858 corresponding to a fluid reservoir and an exit channel that will subsequently be etched are selectively exposed through a photolithographic mask by an optical lithographic exposure tool.

Referring to the plan and cross-sectional views, respectively, of FIGS. 80A and 80B, the photoresist 858 is developed to remove the exposed areas of the photoresist 858 such that a reservoir area 860 and an exit channel area 862 are open to the underlying silicon substrate 800 while the unexposed areas remain protected by photoresist 858. The areas 860, 862 are open to the silicon substrate 800 rather than to the silicon oxide layer 804 in this preferred embodiment because equal or larger areas were opened through the silicon oxide layer 804 when the patterning for the reservoir and separation channel terminus was defined in photoresist 842.

As shown in the cross-sectional view of FIG. 81, the remaining photoresist 858 provides masking during a subsequent fluorine-based silicon etch to vertically etch certain patterns into the separation side 805 of the silicon substrate 800. The fluorine-based silicon etch creates a reservoir 864 and a separation-side portion 866 of an exit channel 840 in the silicon substrate 800. The remaining photoresist 858 is then removed in an oxygen plasma or in an actively oxidizing chemical bath such as sulfuric acid ($H_2SO_4$) activated with hydrogen peroxide ($H_2O_2$).

Separation Surface Processing: Separation Channel and Post Formation

Referring to the plan and cross-sectional views, respectively, of FIGS. 82A and 82B, certain patterns on the separation side 805 of the substrate 800 that are open to the silicon substrate 800 are now etched by a fluorine-based plasma with a high degree of anisotropy and selectivity to the latent mask previously formed in the silicon oxide layer 804. The silicon etch creates a separation channel 868 and a separation channel terminus 870 on the separation side 805 of the silicon substrate 800. Further, where masked by the separation post pattern 850 in the silicon oxide layer 804, separation posts 872 are formed by the silicon etch. The etch continues until the desired separation channel depth is reached, preferably between approximately 5–20 μm and more preferably approximately 10 μm. The reservoir 864 and separation-side portion 866 of the exit channel 840 are simultaneously etched into the silicon substrate 800 by an additional amount equivalent to the channel/post silicon etch.

This completes the fabrication steps corresponding to the first aspect of the present invention, latent masking. The potentially damaging effects of intervening process steps on fragile, high-aspect-ratio silicon structures such as separation posts 872 are avoided by postponing the use of the latent mask 804 until the present stage. Subsequent steps will not subject the separation posts 872 to mechanical stress.

Oxidation for Electrical Isolation and Biocompatibility

As shown in the cross-sectional view of FIG. 83, a layer of silicon oxide 874 is grown on all silicon surfaces of the substrate 800 by subjecting the substrate 800 to elevated temperature in an oxidizing ambient. For example, the oxidizing ambient may be an ultra-pure steam produced by oxidation of hydrogen for a silicon oxide thickness greater than approximately several hundred nanometers or pure oxygen for a silicon oxide thickness of approximately several hundred nanometers or less. The layer of silicon oxide 874 over all silicon surfaces of the substrate electrically isolates a fluid in the introduction channel 834, reservoir 864, separation channel 868, and separation channel terminus 870 from the silicon substrate 800 and permits applying and maintaining different electrical potentials to the fluid in those channels. In addition to electrical isolation, oxidation renders a surface relatively inactive compared to a bare silicon surface, resulting in surface passivation and enhanced biocompatibility.

Cover Substrate Processing and Bonding

The exploded perspective and cross-sectional views of FIGS. 84A and 84B, respectively, show an LC device 300 that generally includes a first silicon substrate 800 and a cover substrate 900, preferably silicon. The substrate 800 defines an introduction channel 834 through the substrate 800 extending between an introduction orifice 830 on the introduction side 803 and a fluid reservoir 864 on the separation side 805 of the substrate 800; a separation channel 868 extending between the reservoir 864 and a channel terminus 870, and a plurality of posts 872 along the separation channel 868 on the separation side 805; an exit orifice 836 on the introduction side 803; and an exit channel 840 extending between the exit orifice 836 on the introduction side 803 and the separation channel terminus 870 on the separation side 805 of substrate 800. All aforementioned features defined on substrate 800 are formed according to the process sequence described above. The purpose of the cover substrate 900 is to provide an enclosure side 905 for the reservoir 864, the separation channel 868, and the separation channel terminus 870 on the separation side 805 of the substrate.

All surfaces of the cover substrate 900 are subjected to thermal oxidation in a manner that is the same as or similar to the process described above in processing of substrate 800. A film or layer of silicon oxide 902 is created on a support side 903 of the substrate 900. A film or layer of silicon oxide 904 is created on the enclosure side 905 of the substrate 900. The cover substrate 900 is then preferably hermetically attached or bonded by any suitable method to the separation side 805 of substrate 800 for containment and isolation of fluids in the LC device 300. Any of several methods of bonding known in the art are suitable, including anodic bonding, sodium silicate bonding, eutectic bonding, and fusion bonding.

Introduction Surface Processing: Contacts and Metallization

FIGS. 85–89B illustrate the formation of electrical contact to the substrate 800 by completion of the delayed LOCOS aspect of the present invention. As shown in the cross-sectional view of FIG. 85, and referring back to FIG. 74, an unmasked fluorine-based etch is first done to remove surface oxide 818 that has grown on the nitride contact pattern 808 as a result of the several oxidations that formed masking oxides 802, 804 and the isolation oxide 874 (FIG. 83). Next, a blanket (unmasked) fluorine-based etch is done until the silicon substrate 800 is reached in the contact area 809, etching through the silicon nitride layer 808 and the underlying silicon oxide layer 802. Since oxide is also uniformly removed from the introduction side 803, care must be taken to halt the etch once the silicon substrate 800 is reached. The contact area 809 preferentially clears while leaving field regions 876 exterior to the contact area 809 still protected by silicon oxide 802 because the nitride 808 strongly inhibited oxide growth in the contact area 809 during the aforementioned oxidations.

In alternative embodiments, as discussed above in the context of the third aspect (delayed LOCOS) of the present invention, the contact areas may also be cleared by hot phosphoric acid etching of the nitride or by shadow-masked etching.

FIG. 86 shows a detailed cross-sectional view of the contact area 809 and adjacent field regions 876 in order to illustrate another advantage of the use of the delayed LOCOS aspect of the present invention. As a result of the lateral diffusion of oxidizing species under the edge of the nitride layer 808 adjacent the field region 876 during oxidation, a transitional region of silicon oxide 878 is grown, so that there is not an abrupt step from the silicon substrate 800 at the bottom of the contact area 809 to the height of the surrounding oxide layer 802. This transitional region is referred to in the art as a "bird's beak". The non-abrupt topography of the bird's beak provides a significant advantage in the remaining process block (metallization).

Referring to the plan and cross-sectional views of FIGS. 87A and 87B, respectively, a conductive film 880 such as aluminum is uniformly deposited on the introduction side 803 of the substrate 800, including on contact sidewalls 882 and onto the 30 contact area 809. The bird's beak topography, as characterized by the silicon oxide transitional region 878, ensures continuous contact sidewall 882 coverage into the contact area 809. The slope is exaggerated in FIG. 87B to effectively show the required contact sidewall 882 coverage. The conductive film 880 may be deposited by any standard deposition technique, including evaporation and sputtering, that produces a continuous film of the conductive material on the contact sidewalls 882.

Referring to the plan and cross-sectional views, respectively, of FIGS. 88A and 88B, a film of positive-working photoresist 884 is deposited on the conductive layer 880 on the introduction side 803 of the substrate 800. After alignment, certain areas of the photoresist film 884 that will be subsequently etched are selectively exposed through a photolithographic mask by an optical lithographic exposure tool. The photoresist 884 is then developed to remove the exposed areas 886 of the photoresist 884 such that the unexposed area of the developed photoresist 884 corresponding to a contact pad area protects the underlying conductive layer 880 while the exposed areas are removed. The exposed areas 888 of the conductive layer 880 are then etched by any standard thin-film etching technique, including wet-chemical-based as well as plasma-based reactive-ion etching. In the preferred embodiment, the conductive layer 880 is aluminum.

Wet etching of the aluminum film may be done in a solution of phosphoric, nitric, and acetic acids. Reactive-ion etching of the aluminum film may be done with chlorine-based plasma chemistry. The etch, whether wet or dry, must be selective to the underlying silicon oxide layer 802, or be terminated upon reaching the silicon oxide layer 802 as determined by the etch rate and time. The area of the conductive layer 880 that is protected by photoresist 884 during the wet or dry etch becomes a contact pad 890 on the introduction side 803 of the substrate 800. The purpose of the contact pad 890 is to provide a means of applying an electrical potential to the substrate 800 of the LC device 300 through the contact area 809. The remaining photoresist 884 is removed in a plasma or in a solvent bath such as acetone.

In an alternative embodiment, shown in exploded perspective and cross-sectional views in FIGS. 89A and 89B, respectively, a shadow mask 892 may be used to ensure that a conductive film is deposited directly in the form of the desired contact pad 890. The shadow mask 892 includes a solid, rigid substrate 894 in which a through-hole 896 has been created by any of a number of suitable means, including etching and stamping. In this alternative embodiment, the shadow mask 892 is held in alignment during the deposition of the conductive film, and then removed. Any standard deposition technique may be used, including evaporation and sputtering. Inasmuch as the conductive layer is deposited as a pattern in this alternative embodiment, the lithographic patterning and etching steps as shown in FIGS. 88A and 88B are not required.

The foregoing process is provided for two purposes: first, to provide a significantly improved process for the fabrication of LC devices; and second, to illustrate the application of the two fundamental aspects disclosed hereinabove. A practitioner skilled in the art will recognize that (a) any or all of the aspects may be incorporated without altering the essential functionality of the device, and that (b) any or all of the aspects may be applied to other devices having similar or dissimilar functionality. The two fundamental aspects are mutually compatible and act individually and in concert to significantly enhance the manufacturability of the LC device. In an alternative embodiment of this aspect of the present invention, the exit channel is defined by the second substrate, the exit channel extending between the surface of the second substrate that is attached to the first substrate and the opposite, or introduction, surface of the second substrate. In further alternative embodiments, only one of the two aspects is incorporated in the integrated process for fabricating an LC device. The essential outcome from incorporation of the fundamental aspects is a significant improvement in manufacturing yield.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. A method for fabricating an integrated liquid chromatography/electrospray ionization microelectromechanical device, comprising the steps of:

a) providing a silicon substrate having an ejection surface and an opposing separation surface;

b) forming first and second silicon oxide layers on said ejection and separation surfaces of said substrate, respectively;

c) doping said ejection surface with a dopant of a same conductivity type as a conductivity type of said substrate;

d) forming a silicon nitride film on said first silicon oxide layer;

e) patterning and etching said silicon nitride film to form at least one silicon nitride contact area on said first silicon oxide layer;

f) oxidizing said substrate, after step (e), to increase said first and second silicon oxide layers;

g) coating a first photoresist layer on said second silicon oxide layer;

h) defining a first pattern on said first photoresist layer, said first pattern including a separation channel, a separation channel terminus, and a plurality of separation posts;

i) transferring said first pattern onto said second silicon oxide layer;

j) removing said first photoresist layer;

k) coating, defining, and transferring a second pattern consisting of a fluid reservoir and a first portion of a nozzle channel onto said second silicon oxide layer when said first pattern does not include said fluid reservoir; otherwise, coating and defining said second pattern onto said separation surface when said fluid reservoir is also included in said first pattern;

l) etching said second pattern into said silicon substrate;

m) coating, defining, and transferring a third pattern onto said first silicon oxide layer, said third pattern consisting of an introduction channel and a second portion of said nozzle channel, said third pattern being aligned on said first silicon oxide layer such that said second portion and said first portion of said nozzle channel are substantially axially aligned, and such that said fluid reservoir and said introduction channel are substantially aligned;

n) removing all photoresist provided in coating, defining, and transferring said third pattern;

o) coating and defining a fourth pattern onto said first silicon oxide layer, said fourth pattern consisting of an introduction channel, a second portion of said nozzle channel, and a recessed area surrounding an unrecessed area, wherein a nozzle is defined by said nozzle channel within said unrecessed area;

p) etching, after the step of defining said fourth pattern, said third pattern into said silicon substrate for a first period of time;

q) transferring said fourth pattern onto said first silicon oxide layer;

r) etching simultaneously, after the step of transferring said fourth pattern, said third and fourth patterns for a second period of time;

s) removing at least all photoresist layers which occlude said first pattern;

t) etching said first pattern into said silicon substrate;

u) forming, after step (t), an isolation layer on all silicon surfaces of said silicon substrate;

v) attaching, after step (u), a cover substrate to said separation surface of said silicon substrate;

w) removing, after step (v), said silicon nitride from said at least one silicon nitride contact area and removing any of said pad oxide beneath said at least one silicon nitride contact area, thereby forming at least one contact area on said ejection surface; and x) depositing a metal on said at least one contact area.

2. A method according to claim 1, wherein said isolation layer is an electrical isolation layer.

3. A method according to claim 1, wherein said isolation layer is a biocompatibility isolation layer.

4. A method according to claim 1, wherein said etching in at least one of steps (e), (l), (p), (r), and (t) is performed by dry etching.

5. A method according to claim 1, wherein said step of removing said silicon nitride is performed by wet etching in hot phosphoric acid.

6. A method according to claim 1, wherein said step of removing said silicon nitride and said pad oxide is performed as an unmasked etch by reactive ion etching.

7. A method according to claim 1, further comprising shadow masking, before step (w), said at least one silicon nitride contact area and wherein said step of removing said silicon oxide and said oxide is performed by reactive ion etching.

8. A method according to claim 1, wherein step (c) is performed before step (d).

9. A method according to claim 1, wherein step (c) is performed after step (w) and before step (x).

* * * * *